US008019938B2

(12) United States Patent
Flynn et al.

(10) Patent No.: US 8,019,938 B2
(45) Date of Patent: Sep. 13, 2011

(54) APPARATUS, SYSTEM, AND METHOD FOR SOLID-STATE STORAGE AS CACHE FOR HIGH-CAPACITY, NON-VOLATILE STORAGE

(75) Inventors: David Flynn, Sandy, UT (US); John Strasser, Syracuse, UT (US); Jonathan Thatcher, Lehi, UT (US); Michael Zappe, Wheat Ridge, CO (US)

(73) Assignee: Fusion-I0, Inc., Salt Lake City, UT (US)

( * ) Notice: Subject to any disclaimer, the term of this patent is extended or adjusted under 35 U.S.C. 154(b) by 449 days.

(21) Appl. No.: 11/952,123

(22) Filed: Dec. 6, 2007

(65) Prior Publication Data
US 2009/0132760 A1 May 21, 2009

Related U.S. Application Data

(60) Provisional application No. 60/873,111, filed on Dec. 6, 2006, provisional application No. 60/974,470, filed on Sep. 22, 2007.

(51) Int. Cl.
*G06F 12/00* (2006.01)
(52) U.S. Cl. .................. 711/113; 711/E12.019
(58) Field of Classification Search ................. None
See application file for complete search history.

(56) References Cited

U.S. PATENT DOCUMENTS

| | | |
|---|---|---|
| 4,571,674 A | 2/1986 | Hartung |
| 5,261,068 A | 11/1993 | Gaskins et al. |
| 5,291,496 A | 3/1994 | Andaleon et al. |
| 5,307,497 A | 4/1994 | Feigenbaum et al. |
| 5,313,475 A | 5/1994 | Cromer et al. |
| 5,325,509 A | 6/1994 | Lautzenheiser |
| 5,392,427 A | 2/1995 | Barrett et al. |
| 5,404,485 A | 4/1995 | Ban |
| 5,438,671 A | 8/1995 | Miles |
| 5,469,555 A | 11/1995 | Ghosh et al. |

(Continued)

FOREIGN PATENT DOCUMENTS

EP 1100001 5/2001

(Continued)

OTHER PUBLICATIONS

Windows PC Accelerators, XP-002476842, Microsoft Corporation, Nov. 30, 2006, pp. 1-16.

(Continued)

*Primary Examiner* — Shane M Thomas
*Assistant Examiner* — John P Fishburn
(74) *Attorney, Agent, or Firm* — Kunzler Needham Massey & Thorpe

(57) ABSTRACT

An apparatus, system, and method are disclosed for solid-state storage as cache for high-capacity, non-volatile storage. The apparatus, system, and method are provided with a plurality of modules including a cache front-end module and a cache back-end module. The cache front-end module manages data transfers associated with a storage request. The data transfers between a requesting device and solid-state storage function as cache for one or more HCNV storage devices, and the data transfers may include one or more of data, metadata, and metadata indexes. The solid-state storage may include an array of non-volatile, solid-state data storage elements. The cache back-end module manages data transfers between the solid-state storage and the one or more HCNV storage devices.

30 Claims, 22 Drawing Sheets

U.S. PATENT DOCUMENTS

| | | |
|---|---|---|
| 5,499,354 A | 3/1996 | Aschoff et al. |
| 5,504,882 A | 4/1996 | Chai et al. |
| 5,551,003 A | 8/1996 | Mattson et al. |
| 5,559,988 A | 9/1996 | Durante et al. |
| 5,586,291 A | 12/1996 | Lasker et al. |
| 5,594,883 A | 1/1997 | Pricer |
| 5,596,736 A | 1/1997 | Kerns |
| 5,603,001 A | 2/1997 | Sukegawa et al. |
| 5,680,579 A | 10/1997 | Young et al. |
| 5,701,434 A | 12/1997 | Nakagawa |
| 5,734,861 A | 3/1998 | Cohn et al. |
| 5,745,792 A | 4/1998 | Jost |
| 5,754,563 A | 5/1998 | White |
| 5,787,486 A | 7/1998 | Chin et al. |
| 5,809,527 A | 9/1998 | Cooper et al. |
| 5,809,543 A | 9/1998 | Byers et al. |
| 5,845,313 A | 12/1998 | Estakhri et al. |
| 5,845,329 A | 12/1998 | Onishi et al. |
| 5,860,083 A * | 1/1999 | Sukegawa ............... 711/103 |
| 5,907,856 A | 5/1999 | Estakhri et al. |
| 5,924,113 A | 7/1999 | Estakhri et al. |
| 5,930,815 A * | 7/1999 | Estakhri et al. ......... 711/103 |
| 5,960,462 A | 9/1999 | Solomon et al. |
| 5,961,660 A | 10/1999 | Capps, Jr. et al. |
| 6,000,019 A | 12/1999 | Dykstal et al. |
| 6,073,232 A | 6/2000 | Kroeker et al. |
| 6,101,601 A | 8/2000 | Matthews et al. |
| 6,128,695 A | 10/2000 | Estakhri et al. |
| 6,141,249 A | 10/2000 | Estakhri et al. |
| 6,145,051 A | 11/2000 | Estakhri et al. |
| 6,170,039 B1 | 1/2001 | Kishida |
| 6,170,047 B1 | 1/2001 | Dye |
| 6,172,906 B1 | 1/2001 | Estakhri et al. |
| 6,173,381 B1 | 1/2001 | Dye |
| 6,185,654 B1 | 2/2001 | Van Doren |
| 6,209,088 B1 | 3/2001 | Reneris |
| 6,223,308 B1 | 4/2001 | Estakhri et al. |
| 6,230,234 B1 | 5/2001 | Estakhri et al. |
| 6,240,040 B1 | 5/2001 | Akaogi et al. |
| 6,279,069 B1 | 8/2001 | Robinson et al. |
| 6,289,413 B1 | 9/2001 | Rogers et al. |
| 6,330,688 B1 | 12/2001 | Brown |
| 6,356,986 B1 | 3/2002 | Solomon et al. |
| 6,370,631 B1 | 4/2002 | Dye |
| 6,385,710 B1 | 5/2002 | Goldman et al. |
| 6,393,513 B2 | 5/2002 | Estakhri et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,516,380 B2 | 2/2003 | Kenchammana-Hoskote |
| 6,523,102 B1 | 2/2003 | Dye et al. |
| 6,587,915 B1 | 7/2003 | Kim |
| 6,601,211 B1 | 7/2003 | Norman |
| 6,625,685 B1 | 9/2003 | Choi et al. |
| 6,671,757 B1 | 12/2003 | Multer et al. |
| 6,675,349 B1 | 1/2004 | Chen |
| 6,715,046 B1 | 3/2004 | Shoham et al. |
| 6,728,851 B1 | 4/2004 | Estakhri et al. |
| 6,751,155 B2 | 6/2004 | Gorobets |
| 6,754,774 B2 | 6/2004 | Gruner et al. |
| 6,757,800 B1 | 6/2004 | Estakhri et al. |
| 6,775,185 B2 | 8/2004 | Fujisawa et al. |
| 6,779,088 B1 | 8/2004 | Benveniste et al. |
| 6,779,094 B2 | 8/2004 | Selkirk et al. |
| 6,785,776 B2 | 8/2004 | Arimilli et al. |
| 6,785,785 B2 | 8/2004 | Piccirillo et al. |
| 6,801,979 B1 | 10/2004 | Estakhri |
| 6,804,755 B2 | 10/2004 | Selkirk et al. |
| 6,877,076 B1 | 4/2005 | Cho et al. |
| 6,880,049 B2 | 4/2005 | Gruner et al. |
| 6,883,069 B2 | 4/2005 | Yoshida |
| 6,883,079 B1 | 4/2005 | Priborsky |
| 6,910,170 B2 | 6/2005 | Choi et al. |
| 6,912,537 B2 | 6/2005 | Selkirk et al. |
| 6,912,618 B2 | 6/2005 | Estakhri et al. |
| 6,938,133 B2 | 8/2005 | Johnson et al. |
| 6,977,599 B2 | 12/2005 | Widmer |
| 6,978,342 B1 | 12/2005 | Estakhri et al. |
| 6,981,070 B1 | 12/2005 | Luk et al. |
| 6,996,676 B2 | 2/2006 | Megiddo |
| 7,010,652 B2 | 3/2006 | Piccirillo et al. |
| 7,010,662 B2 | 3/2006 | Aasheim et al. |
| 7,013,376 B2 | 3/2006 | Hooper, III |
| 7,013,379 B1 | 3/2006 | Testardi |
| 7,043,599 B1 | 5/2006 | Ware et al. |
| 7,047,366 B1 | 5/2006 | Ezra |
| 7,050,337 B2 | 5/2006 | Iwase et al. |
| 7,058,769 B1 | 6/2006 | Danilak |
| 7,076,723 B2 | 7/2006 | Saliba |
| 7,082,495 B2 | 7/2006 | DeWhitt et al. |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,111,140 B2 | 9/2006 | Estakhri et al. |
| 7,130,956 B2 | 10/2006 | Rao |
| 7,130,957 B2 | 10/2006 | Rao |
| 7,143,228 B2 | 11/2006 | Iida et al. |
| 7,149,947 B1 | 12/2006 | MacLellan et al. |
| 7,167,953 B2 | 1/2007 | Megiddo |
| 7,178,081 B2 | 2/2007 | Lee et al. |
| 7,181,572 B2 | 2/2007 | Walmsley |
| 7,194,577 B2 | 3/2007 | Johnson et al. |
| 7,197,657 B1 | 3/2007 | Tobias |
| 7,203,815 B2 | 4/2007 | Haswell |
| 7,215,580 B2 | 5/2007 | Gorobets |
| 7,219,238 B2 | 5/2007 | Saito et al. |
| 7,234,082 B2 | 6/2007 | Lai et al. |
| 7,243,203 B2 | 7/2007 | Scheuerlein |
| 7,246,179 B2 | 7/2007 | Camara |
| 7,280,536 B2 | 10/2007 | Testardi |
| 7,305,520 B2 | 12/2007 | Voigt |
| 7,337,201 B1 | 2/2008 | Yellin et al. |
| 7,340,566 B2 | 3/2008 | Voth |
| 7,356,651 B2 | 4/2008 | Liu et al. |
| 7,360,015 B2 | 4/2008 | Matthews et al. |
| 7,360,037 B2 | 4/2008 | Higaki et al. |
| 7,366,808 B2 | 4/2008 | Kano et al. |
| 7,392,365 B2 | 6/2008 | Selkirk et al. |
| 7,424,593 B2 | 9/2008 | Estakhri et al. |
| 7,437,510 B2 | 10/2008 | Rosenbluth et al. |
| 7,441,090 B2 | 10/2008 | Estakhri et al. |
| 7,447,847 B2 | 11/2008 | Louie et al. |
| 7,450,420 B2 | 11/2008 | Sinclair |
| 7,487,235 B2 | 2/2009 | Andrews et al. |
| 7,487,320 B2 | 2/2009 | Bansal |
| 7,500,000 B2 | 3/2009 | Groves et al. |
| 7,529,905 B2 | 5/2009 | Sinclair |
| 7,536,491 B2 | 5/2009 | Kano et al. |
| 7,552,271 B2 | 6/2009 | Sinclair |
| 7,580,287 B2 | 8/2009 | Aritome |
| 7,640,390 B2 | 12/2009 | Iwamura et al. |
| 7,644,239 B2 | 1/2010 | Ergan |
| 7,660,911 B2 | 2/2010 | McDaniel |
| 7,725,628 B1 | 5/2010 | Phan |
| 2002/0069317 A1 | 6/2002 | Chow et al. |
| 2002/0069318 A1 | 6/2002 | Chow et al. |
| 2002/0194451 A1 | 12/2002 | Mukaida et al. |
| 2003/0061296 A1 | 3/2003 | Craddock et al. |
| 2003/0093741 A1 | 5/2003 | Argon et al. |
| 2003/0198084 A1 | 10/2003 | Fujisawa et al. |
| 2004/0093463 A1 | 5/2004 | Shang |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0055497 A1 | 3/2005 | Estakhri et al. |
| 2005/0076107 A1 | 4/2005 | Goud et al. |
| 2005/0132259 A1 | 6/2005 | Emmot et al. |
| 2005/0144361 A1 | 6/2005 | Gonzalez et al. |
| 2005/0149618 A1 | 7/2005 | Cheng |
| 2005/0149819 A1 | 7/2005 | Hwang |
| 2005/0177672 A1 | 8/2005 | Rao |
| 2005/0177687 A1* | 8/2005 | Rao ............... 711/118 |
| 2005/0193166 A1 | 9/2005 | Johnson et al. |

| | | | |
|---|---|---|---|
| 2005/0229090 | A1 | 10/2005 | Shen et al. |
| 2005/0240713 | A1 | 10/2005 | Wu |
| 2005/0246510 | A1 | 11/2005 | Retnamma et al. |
| 2005/0257213 | A1 | 11/2005 | Chu et al. |
| 2005/0276092 | A1 | 12/2005 | Hansen et al. |
| 2006/0004955 | A1 | 1/2006 | Ware et al. |
| 2006/0026339 | A1 | 2/2006 | Rostampour |
| 2006/0059326 | A1 | 3/2006 | Aasheim |
| 2006/0075057 | A1 | 4/2006 | Gildea et al. |
| 2006/0090048 | A1 | 4/2006 | Okumoto et al. |
| 2006/0106968 | A1 | 5/2006 | Wooi Teoh |
| 2006/0143396 | A1 | 6/2006 | Cabot |
| 2006/0152981 | A1 | 7/2006 | Ryu |
| 2006/0224849 | A1 | 10/2006 | Rezaul Islam et al. |
| 2006/0248387 | A1 | 11/2006 | Nicholson |
| 2007/0016699 | A1 | 1/2007 | Minami |
| 2007/0050571 | A1 | 3/2007 | Nakamura |
| 2007/0086260 | A1 | 4/2007 | Sinclair |
| 2007/0118676 | A1 | 5/2007 | Kano et al. |
| 2007/0124474 | A1 | 5/2007 | Margulis |
| 2007/0124540 | A1 | 5/2007 | van Riel |
| 2007/0150689 | A1 | 6/2007 | Pandit et al. |
| 2007/0233455 | A1 | 10/2007 | Zimmer et al. |
| 2007/0233937 | A1 | 10/2007 | Coulson |
| 2007/0250660 | A1 | 10/2007 | Gill et al. |
| 2007/0271468 | A1 | 11/2007 | McKenney et al. |
| 2007/0276897 | A1 | 11/2007 | Tameshige et al. |
| 2007/0300008 | A1 | 12/2007 | Rogers |
| 2008/0005748 | A1 | 1/2008 | Mathew et al. |
| 2008/0010395 | A1 | 1/2008 | Mylly et al. |
| 2008/0043769 | A1 | 2/2008 | Hirai |
| 2008/0059752 | A1 | 3/2008 | Serizawa |
| 2008/0091876 | A1 | 4/2008 | Fujibayashi et al. |
| 2008/0098159 | A1 | 4/2008 | Song |
| 2008/0120469 | A1 | 5/2008 | Kornegay et al. |
| 2008/0126700 | A1 | 5/2008 | El-Batal et al. |
| 2008/0126852 | A1 | 5/2008 | Brandyberry et al. |
| 2008/0133963 | A1 | 6/2008 | Katano et al. |
| 2008/0137658 | A1 | 6/2008 | Wang |
| 2008/0140819 | A1 | 6/2008 | Bailey et al. |
| 2008/0205286 | A1 | 8/2008 | Li et al. |
| 2008/0294847 | A1 | 11/2008 | Maruyama et al. |

FOREIGN PATENT DOCUMENTS

| | | |
|---|---|---|
| EP | 1418502 | 5/2004 |
| EP | 1814039 A2 | 8/2007 |
| GB | WO9518407 | 7/1995 |
| GB | 123416 | 9/2001 |
| JP | 42424848 | 8/1992 |
| JP | 8153014 | 6/1996 |
| JP | 2000259525 A | 9/2000 |
| WO | 9419746 | 9/1994 |
| WO | 9518407 | 7/1995 |
| WO | 9612225 | 4/1996 |
| WO | WO0131512 | 5/2001 |
| WO | WO 02/01365 A2 | 1/2002 |

OTHER PUBLICATIONS

PCT/US2007/025049, International Search Report and Written Opinion, May 14, 2008.
PCT/US2007/025049, International Preliminary Report on Patentability, Mar. 11, 2009.
"White Paper: S2A9550 Overview", DataDirect Networks, www.datadirect.com, 2007, 17 pages.
"BiTMICRO Introduces E-Disk PMC Flash Disk Module at Military & Aerospace Electronics East 2004", BiTMICRO, http://www.bitmicro.com/press_news_releases_20040518_prt.php, May 18, 2004.
Information Technology—SCSI Object-Based Storage Device Commands (OSD), Jul. 30, 2004.
Bulletproof Memory for RAID Servers, Parts 1-3, http://agigatech.com/blog/bulletproof-memory-for-raid-servers-part-1/, Nov. 2009.
Method for fault tolerance in nonvolatile storage, IP.com, IPCOM000042269D, Feb. 3, 2005.
Wacha, Rosie; A Reliability Enhancing Mechanism for a Large Flash Embedded Satellite Storage System Improving RAID-Based Storage Systems with Flash Memory, Oct. 20-21, 2009.
Ari, Gottwals, Henze, Performance boosting and worload isolationin storage area networks with sancache, Proceedings of 23rd IEEE, MSST 2006, May 2006, pp. 263-273.
"Pivot3 RAIGE Cluster: Technology Overview", White Paper, www.pivot3.com, Jun. 2007, pp. 1-17.
Plank, James S, "A Tutorial on Reed-Solomon coding for Fault Tolerance in RAID-like Systems", Dept. of computer Science, Univ. of Tennessee, Sep. 1997, pp. 995-1012.
Morgenstern, David, "Is there a Flash Memory RAID in your Future?", Nov. 2006.
"File System Primer", http://wiki.novell.com/index.php/File_System_Primer, Jul. 2006.
Dan, Singer, Implementing MLC NAND Flash for Cost-Effective, High-Capacity Memory, M-systems White paper, Sep. 2003.
Introduction to Samsungs Linux Flash File System—RFS, Samsung Electronics, Nov. 2006.
Mesnier, Ganger, Riedel, "Object-Based Storage", IEEE Comm Magazine, Aug. 2003.
Hensbergen, "Dynamic Policy Disk Caching for Storage Networking", Nov. 2006.
ASPMC_660, Asine Group, http://www.asinegroup.com/products/aspmc660.html, copyright 2002, downloaded on Nov. 18, 2009.
NAND Flash 101: An Introduction to NAND Flash and How to Design It In to Your Next Product, Micron, pp. 1-28, Micron Technology Nov. 2006.
Kawaguchi, A Flash-Memory Based File System, Advanced Research Laboratory, Hitachi, Ltd., 1995.
Rosenbllum, The Design and Implementation of a Log-structured File System, 1992.
WU, eNVy: A Non-Volatile, Main Memory Storage System, San Jose, California, 1994.
Casey, Disk I/O Performance Scaling: the File Caching Solution, Solid Data Systems, Inc., Paper #528, Mar. 2001, pp. 1-8.
Casey, San Cache: SSD in The San, Computer Technology Review's Storage Inc., Mar. 2000.
Maximizing Performance through Solid State File-Caching, Solid Data, Best Practices Guide, May 2000.
Damian Yerrick, Block Device, http://www.pineight.com/ds/block/, "visited" Mar. 1, 2010.
Michael K. Johnson, An Introduction to Block Drivers, http://www.linuxjournal.com/article/2890, Jan. 1, 1995, "visited" May 1, 2010.
How NTFS Works, http://technet.microsoft.com/en-us/library/cc781134(WS.10).aspx, updated Mar. 28, 2003, "visited" Apr. 9, 2010.
Technical Note: Hamming Codes for NAND Flash Memory Devices (TN-29-08), http://www.micron.com/document_download/?documentId=137, "visited" May 10, 2010.
Technical Note: Design and Use Considerations for NAND Flash Memory (TN-29-17), http://download.micron.com/pdf/technotes/nand/tn2917.pdf, "visited" May 10, 2010.
David Woodhouse, Red Hat, Inc., JFFS: The Journaling Flash File System, http://sourceware.org/jffs2/jffs2.pdf, "visited" Jun. 11, 2010.
Christian Bandulet, Object-Based Storage Devices, Jul. 2007, http://developers.sun.com/solaris/articles/osd.html.
The Advantages of Object-Based Storage—Secure, Scalable, Dynamic Storage Devices, Seagate Research Technology Paper, Apr. 2005, TP-536.
Wang, OBFS: A File System for Object-based Storage Devices, 12th NASA Goddard Conference on Mass Storage Systems and Technologies, Apr. 2004.
Casey, Solid State File-Caching for Performance and Scalability, SolidData, Mar. 2001, http://www.storagesearch.com/3dramhtml.
Am29DL332D/323D/324D, Spansion, Oct. 7, 2004, www.amd.com.
Hynix 64GB—Flash MCP—Slashdot: the Nuts and Volts of News for Nerds, Sep. 6, 2007, http://hardware.slashdot.org/article.pl?sid=07/09/06/146218&from=rss.
Gill, Wow: Wise Ordering for Writes, Dec. 2005.
Office Action in Chinese Nationalization of U.S. Appl. No. 11/952,123, Received Feb. 18, 2011.

\* cited by examiner

APPARATUS, SYSTEM, AND METHOD FOR SOLID-STATE STORAGE AS CACHE FOR HIGH-CAPACITY, NON-VOLATILE STORAGE

CROSS-REFERENCES TO RELATED APPLICATIONS

This application is a continuation in part of and claims priority to U.S. Provisional Patent Application No. 60/873,111 entitled "Elemental Blade System" and filed on Dec. 6, 2006 for David Flynn, et al., and U.S. Provisional Patent Application No. 60/974,470 entitled "Apparatus, System, and Method for Object-Oriented Solid-State Storage" and filed on Sep. 22, 2007 for David Flynn, et al., which are incorporated herein by reference.

BACKGROUND OF THE INVENTION

1. Field of the Invention

This invention relates to managing data and more particularly relates to using solid-state storage as cache for high-capacity, non-volatile storage devices.

2. Description of the Related Art

In general, cache is advantageous because data that is accessed often or that is loaded as part of an application or operating system may be stored in cache with subsequent access much quicker than when the data must be accessed through a high-capacity, non-volatile ("HCNV") storage device, such as a hard disk drive ("HDD"), an optical drive, tape storage, etc. Cache is typically included in a computer.

SUMMARY OF THE INVENTION

Some storage devices and systems include cache in HCNV storage devices. Some HCNV storage devices contain non-volatile solid state cache; these provide benefit in reducing access times, but can only deliver performance consistent with the usually limited capability of the HCNV storage device interface. Some non-volatile solid-state cache storage devices exist that are typically placed on a motherboard; these devices cannot be used in multi-client environments as no cache coherence is provided. Some controllers of HCNV devices also include cache. Where redundant HCNV cache controllers are shared between multiple clients, sophisticated cache coherency algorithms are required to ensure that data is not corrupted.

Typically, caches are implemented in DRAM, making cache capacity a premium, and requiring relatively high power per performance. If power supporting the volatile cache is lost, data stored in the cache is lost. Typically, some battery backup is used to avoid data loss in case of power failure, with sufficient capability to flush the cache to non-volatile memory prior to failure of the batter backup. In addition, battery backup systems consume power, require redundancy, negatively impact reliability and consume space. Batteries must also be serviced on a regular basis and battery backup can be relatively expensive.

From the foregoing discussion, it should be apparent that a need exists for an apparatus, system, and method that manage data using solid-state storage as cache. Beneficially, such an apparatus, system, and method would provide a non-volatile cache that consumes little power, provides significantly larger capacity and does not require a battery backup to maintain data stored in the cache.

The present invention has been developed in response to the present state of the art, and in particular, in response to the problems and needs in the art that have not yet been fully solved by currently available systems for managing data storage. Accordingly, the present invention has been developed to provide an apparatus, system, and method for managing the storage of data on one or more high capacity, non-volatile ("HCNV") storage devices that overcome many or all of the above-discussed shortcomings in the art.

The apparatus is provided, in one embodiment, with a plurality of modules including a cache front-end module and a cache back-end module. The cache front-end module manages data transfers associated with a storage request. The data transfers are between a requesting device and solid-state storage function as cache for one or more HCNV storage devices, and the data transfers may include one or more of data, metadata, and metadata indexes. The solid-state storage may include an array of non-volatile, solid-state data storage elements. The cache back-end module manages data transfers between the solid-state storage and the one or more HCNV storage devices.

In one embodiment of the apparatus, the cache front-end module and the cache back-end module are co-located with a solid-state storage controller that manages the solid-state storage. In a further embodiment, the cache front-end module, the cache back-end module, and the solid-state storage controller may operate autonomously from the requesting device.

In one embodiment, the apparatus includes an HCNV RAID module that stores data cached in the solid-state storage in two or more HCNV storage devices in redundant array of independent drives ("RAID") consistent with a RAID level. The data may appear to a requesting device as a whole. In another embodiment, the solid-state storage and the one or more HCNV storage devices may include a hybrid storage device within a hybrid storage device set that is configured as a RAID group. A data segment cached in the solid-state storage and later stored on an HCNV device may include one of N data segments of a stripe or a parity data segment of the stripe. The hybrid storage device typically receives storage requests from one or more clients independent of data segments of a RAID stripe. In a further embodiment, the hybrid storage device may be a storage device of a shared, front-end distributed RAID group that receives two or more simultaneous storage requests from two or more clients.

In an additional embodiment of the apparatus, the HCNV storage device may be a hard disk drive ("HDD"), an optical drive, or a tape storage. In another embodiment, the solid-state storage and the one or more HCNV storage devices may be a hybrid storage device. In one embodiment, the apparatus may also include a standard device emulation module that provides access to the hybrid storage device by emulating a standard device attached to one or more requesting devices prior to loading the one or more requesting devices with code specific to the operation of the hybrid storage device. The standard device typically may be supported by an industry standard BIOS.

In another embodiment, the solid-state storage device may be partitioned into two or more regions, wherein one or more partitions may be used as solid-state storage independent of the solid-state storage functioning as cache for the HCNV storage devices. In yet another embodiment, one or more clients send cache control messages to the cache front-end module and the cache back-end module to manage a state of one or more of files or objects stored within the solid-state storage device and the one or more HCNV storage devices.

In one embodiment of the apparatus, the cache control messages may include one or more control messages. Various embodiments of the control messages may include a control message that causes the cache back-end module to pin a portion of an object or file in the solid-state storage or a control message that causes the cache back-end module to unpin a portion of an object or file in the solid-state storage. Other embodiments of the control messages may include a control message that causes the cache back-end module to flush a portion of an object or file from the solid-state storage to the one or more HCVN storage devices or a control message causes the cache back-end module to preload a portion of an object or file to the solid-state storage from the one or more HCVN storage devices. Yet another embodiment of a control message may be a control message that causes the cache back-end module to offload one or more portions of one or more objects or files from the solid-state storage to the one or more HCVN storage devices in order to free up a determined amount of storage space in the solid-state storage. In one embodiment, the cache control messages are communicated through metadata ("cache control metadata") for the object or file. In a further embodiment, the cache control metadata may be persistent. In another embodiment, the cache control metadata may be established through attributes set at a time of creation of the file or object. In yet another embodiment, the cache control metadata may be obtained from a file or object management system.

In one embodiment of the apparatus, the apparatus may include a volatile cache storage element wherein the cache front-end module and the cache back-end module store data in the volatile cache storage element and manage data stored in the solid-state storage and volatile cache storage element. The back-end storage module may further manage data transfers between the volatile cache storage element, the solid state storage, and the HCVN storage devices. In a further embodiment, metadata and/or index metadata for objects and files stored in the HCVN storage devices may be maintained within the solid-state storage device and the volatile cache storage element.

In an additional embodiment of the apparatus, metadata and/or index metadata for objects and files stored in the HCVN storage devices may be maintained within the solid-state storage device. In another embodiment, the solid-state storage and the one or more HCNV storage devices may include a storage device such that the HCNV storage devices are hidden from view of a client connected to the storage device.

A system of the present invention is also presented. The system substantially includes the modules and embodiments described above with regard to the apparatus. In one embodiment, the system includes a solid-state storage that includes an array of non-volatile, solid-state data storage elements. The system also includes one or more HCNV storage devices and a storage controller. The storage controller, in one embodiment, may include a solid-state storage controller and an HCNV storage device controller. The storage controller may also include a cache front-end module and a cache back-end module. The cache front-end module manages data transfers associated with a storage request. The data transfers are typically between a requesting device and the solid-state storage functioning as cache for the one or more HCNV storage devices. The data transfers may include one or more of data, metadata, and metadata indexes. The cache back-end module manages data transfers between the solid-state storage and the one or more HCNV storage devices.

In one embodiment, the system includes a network interface connected to the storage controller, wherein the network interface facilitates data transfers between the requesting device and the solid-state storage controller through a computer network. In another embodiment, the system includes a server that includes the solid-state storage, the one or more HCNV storage devices, and the storage controller. In yet another embodiment, the one or more HCNV storage devices are connected to the storage controller through a storage area network ("SAN").

A method of the present invention is also presented for sharing a device between multiple hosts. The method in the disclosed embodiments substantially includes the steps necessary to carry out the functions presented above with respect to the operation of the described apparatus and system. In one embodiment, the method includes managing data transfers associated with a storage request, wherein the data transfers are between a requesting device and solid-state storage functioning as cache for one or more HCNV storage devices. The data transfers may include one or more of data, metadata, and metadata indexes. The solid-state storage may include an array of non-volatile, solid-state data storage elements. The method may also include managing data transfers between the solid-state storage and the one or more HCNV storage devices.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1A:
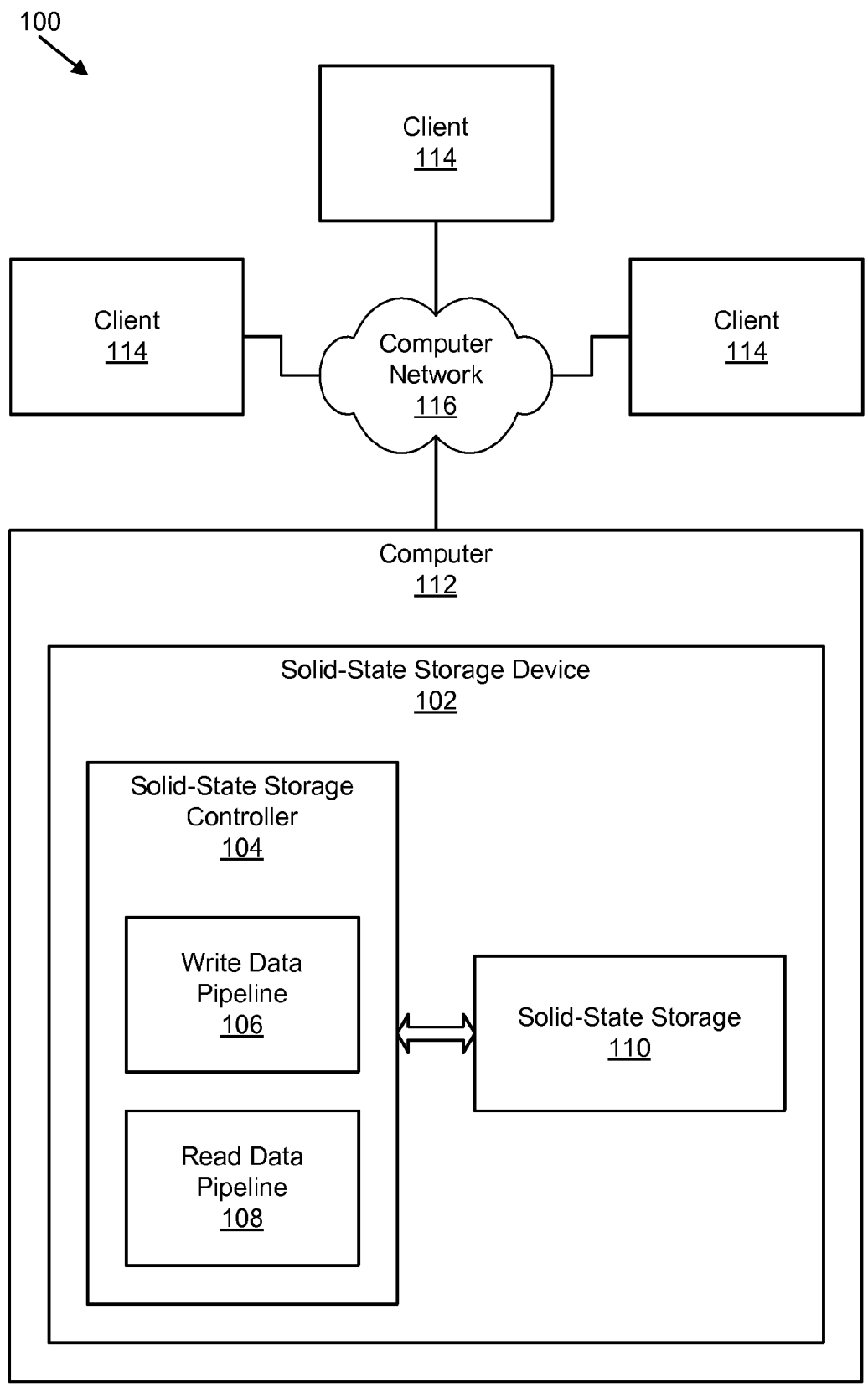
FIG. 1A is a schematic block diagram illustrating one embodiment of a system for data management in a solid-state storage device in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a signal bearing medium may take any form capable of generating a signal, causing a signal to be generated, or causing execution of a program of machine-readable instructions on a digital processing apparatus. A signal bearing medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System

FIG. 1A is a schematic block diagram illustrating one embodiment of a system 100 for data management in a solid-state storage device in accordance with the present invention. The system 100 includes a solid-state storage device 102, a solid-state storage controller 104, a write data pipeline 106, a read data pipeline 108, a solid-state storage 110, a computer 112, a client 114, and a computer network 116, which are described below.

The system 100 includes at least one solid-state storage device 102. In another embodiment, the system 100 includes two or more solid-state storage devices 102.

Each solid-state storage device 102 may include non-volatile, solid-state storage 110, such as flash memory, nano random access memory ("nano RAM or NRAM"), magneto-resistive RAM ("MRAM"), dynamic RAM ("DRAM"), phase change RAM ("PRAM"), etc. The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 118 to a client 116 without a computer 112.

Storage Controller-Managed Objects

Figure 1B:
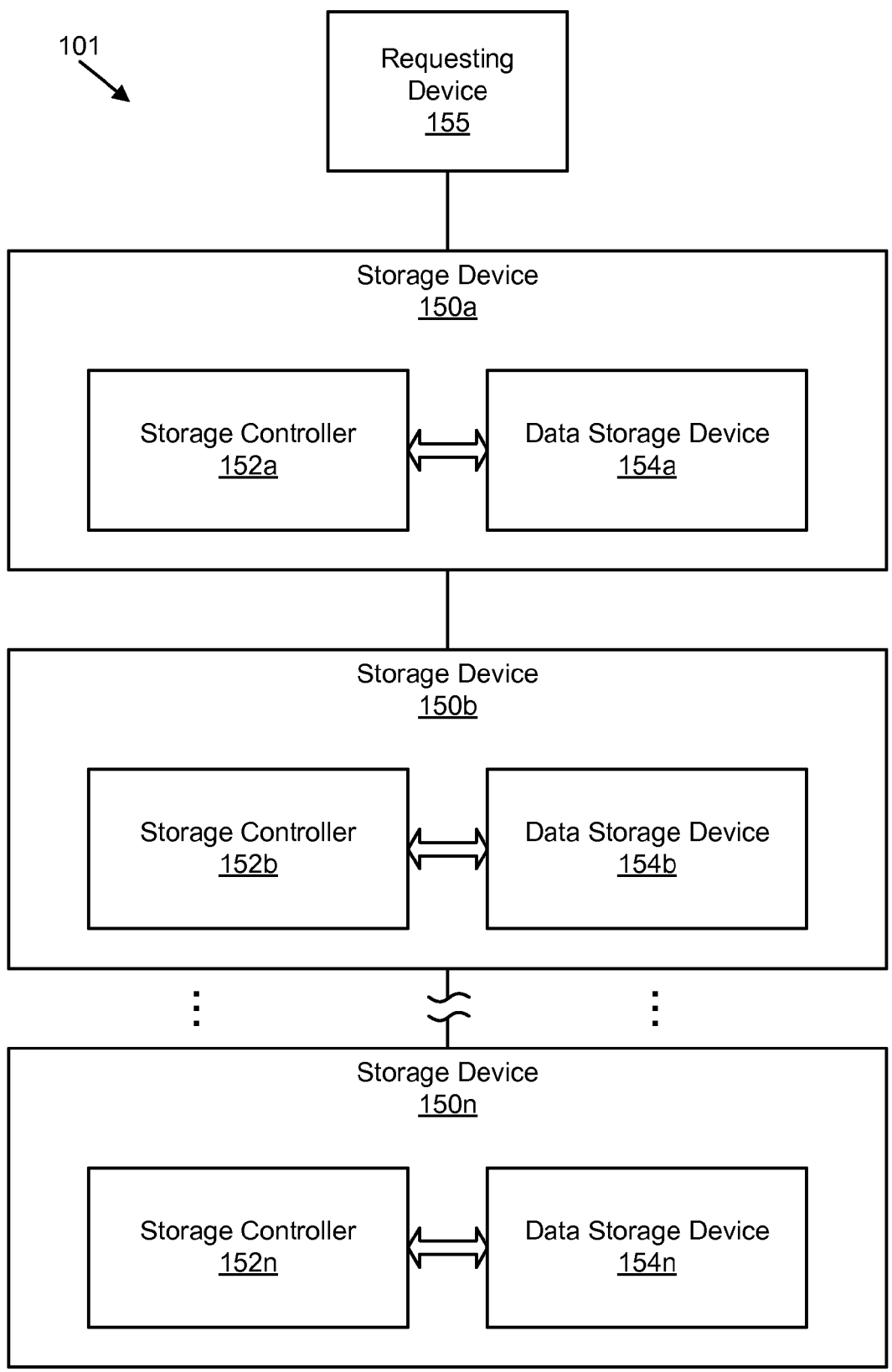
FIG. 1B is a schematic block diagram illustrating one embodiment of a system for object management in a storage device in accordance with the present invention.

FIG. 1B is a schematic block diagram illustrating one embodiment of a system 101 for object management in a storage device in accordance with the present invention. The system 101 includes one or more storage device 150, each with a storage controller 152 and one or more data storage devices 154, and one or more requesting devices 155. The storage devices 152 are networked together and coupled to one or more requesting devices 155. The requesting device 155 sends object requests to a storage device 150a. An object request may be a request to create an object, a request to write data to an object, a request to read data from an object, a request to delete an object, a request to checkpoint an object, a request to copy an object, and the like. One of skill in the art will recognize other object requests.

In one embodiment, the storage controller 152 and data storage device 154 are separate devices. In another embodiment, the storage controller 152 and data storage device 154 are integrated into one storage device 150. In another embodiment, a data storage device 154 is a solid-state storage 110 and the storage controller is a solid-state storage device controller 202. In other embodiments, a data storage device 154 may be a hard disk drive, an optical drive, tape storage, or the like. In another embodiment, a storage device 150 may include two or more data storage devices 154 of different types.

In one embodiment, the data storage device 154 is a solid-state storage 110 and is arranged as an array of solid-state storage elements 216, 218, 220. In another embodiment, the solid-state storage 110 is arranged in two or more banks 214a-n. Solid-state storage 110 is described in more detail below with respect to FIG. 2B.

The storage devices 150a-n may be networked together and act as a distributed storage device. The storage device 150a coupled to the requesting device 155 controls object requests to the distributed storage device. In one embodiment, the storage devices 150 and associated storage controllers 152 manage objects and appear to the requesting device(s) 155 as a distributed object file system. In this context, a parallel object file system is an example of a type of distributed object file system. In another embodiment, the storage devices 150 and associated storage controllers 152 manage objects and appear to the requesting device(s) 155 as distributed object file servers. In this context, a parallel object file server is an example of a type of distributed object file server. In these and other embodiments the requesting device 155 may exclusively manage objects or participate in managing objects in conjunction with storage devices 150; this typically does not limit the ability of storage devices 150 to fully manage objects for other clients 114. In the degenerate case, each distributed storage device, distributed object file system and distributed object file server can operate independently as a single device. The networked storage devices 150a-n may operate as distributed storage devices, distributed object file systems, distributed object file servers, and any combination thereof having images of one or more of these capabilities configured for one or more requesting devices 155. Fore example, the storage devices 150 may be configured to operate as distributed storage devices for a first requesting device 155a, while operating as distributed storage devices and distributed object file systems for requesting devices 155b. Where the system 101 includes one storage device 150a, the storage controller 152a of the storage device 150a manages objects may appear to the requesting device(s) 155 as an object file system or an object file server.

In one embodiment where the storage devices 150 are networked together as a distributed storage device, the storage devices 150 serve as a redundant array of independent drives ("RAID") managed by one or more distributed storage controllers 152. For example, a request to write a data segment of an object results in the data segment being stripped across the data storage devices 154a-n with a parity stripe, depending upon the RAID level. One benefit of such an arrangement is that such an object management system may continue to be available when a single storage device 150 has a failure, whether of the storage controller 152, the data storage device 154, or other components of storage device 150.

When redundant networks are used to interconnect the storage devices 150 and requesting devices 155, the object management system may continue to be available in the presence of network failures as long as one of the networks remains operational. A system 101 with a single storage device 150a may also include multiple data storage devices 154a and the storage controller 152a of the storage device 150a may act as a RAID controller and stripe the data segment across the data storage devices 154a of the storage device 150a and may include a parity stripe, depending upon the RAID level.

In one embodiment, where the one or more storage devices 150a-n are solid-state storage devices 102 with a solid-state storage device controller 202 and solid-state storage 110, the solid-state storage device(s) 102 may be configured in a DIMM configuration, daughter card, micro-module, etc. and reside in a computer 112. The computer 112 may be a server or similar device with the solid-state storage devices 102 networked together and acting as distributed RAID controllers. Beneficially, the storage devices 102 may be connected using PCI-e, PCIe-AS, Infiniband or other high-performance bus, switched bus, networked bus, or network and may provide a very compact, high performance RAID storage system with single or distributed solid-state storage controllers 202 autonomously striping a data segment across solid-state storage 110a-n.

In one embodiment, the same network used by the requesting device 155 to communicate with storage devices 150 may be used by the peer storage device 150a to communicate with peer storage devices 150b-n to accomplish RAID functionality. In another embodiment, a separate network may be used between the storage devices 150 for the purpose of RAIDing. In another embodiment, the requesting devices 155 may participate in the RAIDing process by sending redundant requests to the storage devices 150. For example, requesting device 155 may send a first object write request to a first storage device 150a and a second object write request with the same data segment to a second storage device 150b to achieve simple mirroring.

With the ability for object handling within the storage device(s) 102, the storage controller(s) 152 uniquely have the ability to store one data segment or object using one RAID level while another data segment or object is stored using a different RAID level or without RAID striping. These multiple RAID groupings may be associated with multiple partitions within the storage devices 150. RAID 0, RAID 1, RAID5, RAID6 and composite RAID types 10, 50, 60, can be supported simultaneously across a variety of RAID groups comprising data storage devices 154a-n. One skilled in the art will recognize other RAID types and configurations that may also be simultaneously supported.

Also, because the storage controller(s) 152 operate autonomously as RAID controllers, the RAID controllers can perform progressive RAIDing and can transform objects or portions of objects striped across data storage devices 154 with one RAID level to another RAID level without the requesting device 155 being affected, participating or even detecting the change in RAID levels. In the preferred embodiment, progressing the RAID configuration from one level to another level may be accomplished autonomously on an object or even a packet bases and is initiated by a distributed RAID control module operating in one of the storage devices 150 or the storage controllers 152. Typically, RAID progression will be from a higher performance and lower efficiency storage configuration such as RAID1 to a lower performance and higher storage efficiency configuration such as RAID5 where the transformation is dynamically initiated based on the frequency of access. But, one can see that progressing the configuration from RAID5 to RAID1 is also possible. Other processes for initiating RAID progression may be configured or requested from clients or external agents such a storage system management server request. One of skill in the art will recognize other features and benefits of a storage device 102 with a storage controller 152 that autonomously manages objects.

Solid-State Storage Device with In-Server SAN

Figure 1C:
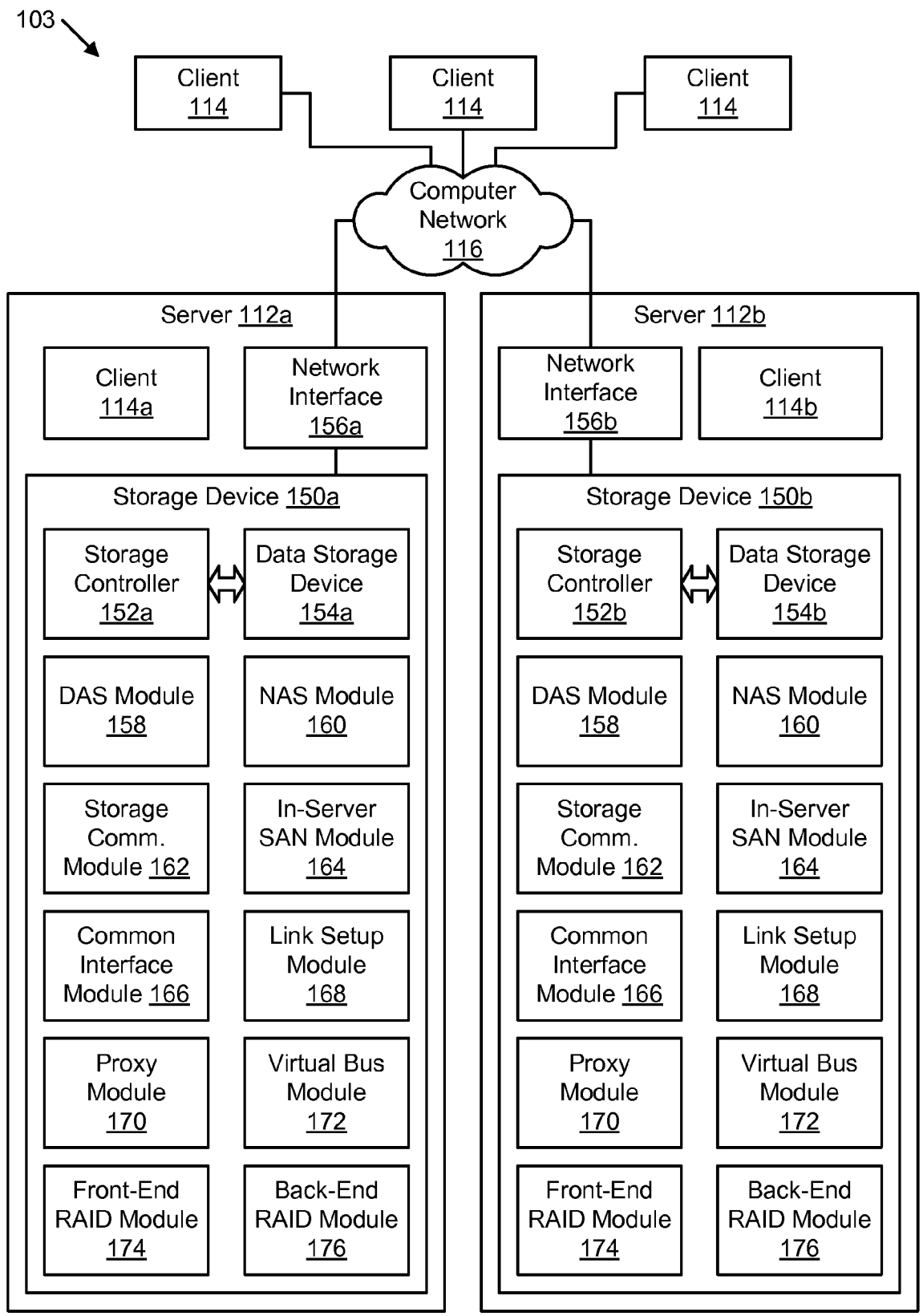
FIG. 1C is a schematic block diagram illustrating one embodiment of a system for an in-server storage area network in accordance with the present invention.

FIG. 1C is a schematic block diagram illustrating one embodiment of a system 103 for an in-server storage area network ("SAN") in accordance with the present invention. The system 103 includes a computer 112 typically configured as a server ("server 112"). Each server 112 includes one or more storage devices 150 where the server 112 and storage devices 150 are each connected to a shared network interface 156. Each storage device 150 includes a storage controller 152 and corresponding data storage device 154. The system 103 includes clients 114, 114a, 114b that are either internal or external to the servers 112. The clients 114, 114a, 114b may communicate with each server 112 and each storage device 150 through over one or more computer networks 116, which are substantially similar to those described above.

The storage device 150 includes a DAS module 158, a NAS module 160, a storage communication module 162, an in-server SAN module 164, a common interface module 166, a proxy module 170, a virtual bus module 172, a front-end RAID module 174, and back-end RAID module 176, which are described below. While the modules 158-176 are shown in a storage device 150, all or a portion of each module 158-176 may be in the storage device 150, server 112, storage controller 152, or other location.

A server 112, as used in conjunction with in-server SAN, is a computer functioning as a server. The server 112 includes at least one server function, such as a file server function, but may also include other server functions as well. The servers 112 may be part of a server farm and may service other clients 114. In other embodiments, the server 112 may also be a personal computer, a workstation, or other computer that houses storage devices 150. A server 112 may access one or more storage devices 150 in the server 112 as direct attached storage ("DAS"), SAN attached storage or network attached storage ("NAS"). Storage controllers 150 participating in an in-server SAN or NAS may be internal or external to the server 112.

In one embodiment, the in-server SAN apparatus includes a DAS module 158 that configures at least a portion of the at least one data storage device 154 controlled by a storage controller 152 in a server 112 as a DAS device attached to the server 112 for servicing storage requests from at least one client 114 to the server 112. In one embodiment, a first data storage device 154a is configured as a DAS to the first server 112a while also being configured as an in-server SAN storage device to the first server 112a. In another embodiment, the first data storage device 154a is partitioned so one partition is a DAS and the other is an in-server SAN. In another embodiment, at least a portion of storage space within the first data storage device 154a is configured as a DAS to the first server 112a and the same portion of storage space on the first data storage device 154a is configured as an in-server SAN to the first server 112a.

In another embodiment, the in-server SAN apparatus includes a NAS module 160 that configures a storage controller 152 as a NAS device for at least one client 114 and services file requests from the client 114. The storage controller 152 may be also configured as an in-server SAN device for the first server 112a. The storage devices 150 may directly connect to the computer network 116 through the shared network interface 156 independent from the server 112 in which the storage device 150 resides.

In one elemental form, an apparatus for in-server SAN includes a first storage controller 152a within a first server 112a where the first storage controller 152a controls at least one storage device 154a. The first server 112a includes a network interface 156 shared by the first server 112a and the first storage controller 152a. The in-server SAN apparatus includes a storage communication module 162 that facilitates communication between the first storage controller 152a and at least one device external to the first server 112a such that the communication between the first storage controller 152a and the external device is independent from the first server 112a. The storage communication module 162 may allow the first storage controller 152a to independently access the network interface 156a for external communication. In one embodiment, the storage communication module 162 accesses a switch in the network interface 156a to direct network traffic between the first storage controller 152a and external devices.

The in-server SAN apparatus also includes an in-server SAN module 164 that services a storage request using one or both of a network protocol and a bus protocol. The in-server SAN module 164 services the storage request independent from the first server 112a and the service request is received from an internal or external client 114, 114a.

In one embodiment, the device external to the first server 112a is a second storage controller 152b. The second storage controller 152b controls at least one data storage device 154b. The in-server SAN module 164 services the storage request using communication through the network interface 156a and between the first and second storage controllers 152a, 152b independent of the first server 112a. The second storage controller 152b may be within a second server 112b or within some other device.

In another embodiment, the device external to the first server 112a is a client 114 and the storage request originates with the external client 114 where the first storage controller is configured as at least part of a SAN and the in-server SAN module 164 services the storage request through the network interface 156a independent of the first server 112a. The external client 114 may be in the second server 112b or may be external to the second server 112b. In one embodiment, the in-server SAN module 164 can service storage requests from the external client 114 even when the first server 112a is unavailable.

In another embodiment, the client 114a originating the storage request is internal to the first server 112a where the first storage controller 152a is configured as at least part of a SAN and the in-server SAN module 164 services the storage request through one or more of the network interface 156a and system bus.

Traditional SAN configurations allow a storage device remote from a server 112 to be accessed as if the storage device resides within the server 112 as direct attached storage ("DAS") so that the storage device appears as a block storage device. Typically, a storage device connected as a SAN requires a SAN protocol, such as fiber channel, Internet small computer system interface ("iSCSI"), HyperSCSI, Fiber Connectivity ("FICON"), Advanced Technology Attachment ("ATA") over Ethernet, etc. In-server SAN includes a storage controller 152 inside a server 112 while still allowing network connection between the storage controller 152a and a remote storage controller 152b or an external client 114 using a network protocol and/or a bus protocol.

Typically, SAN protocols are a form of network protocol and more network protocols are emerging, such as Infiniband that would allow a storage controller 150a, and associated data storage devices 154a, to be configured as a SAN and communicate with an external client 114 or second storage controller 152b. In another example, a first storage controller 152a may communicate with an external client 114 or second storage controller 152b using Ethernet.

A storage controller 152 may communicate over a bus with internal storage controllers 152 or clients 114a. For example, a storage controller 152 may communicate over a bus using PCI-e that may support PCI Express Input/Output Virtualization ("PCIe-IOV"). Other emerging bus protocols allow a system bus to extend outside a computer or server 112 and would allow a storage controller 152a to be configured as a SAN. One such bus protocol is PCIe-AS. The present invention is not limited to simply SAN protocols, but may also take advantage of the emerging network and bus protocols to service storage requests. An external device, either in the form of a client 114 or external storage controller 152b, may communicate over an extended system bus or a computer network 116. A storage request, as used herein, includes requests to write data, read data, erase data, query data, etc. and may include object data, metadata, and management requests as well as block data requests.

A traditional server 112 typically has a root complex that controls access to devices within the server 112. Typically, this root complex of the server 112 owns the network interface 156 such so any communication through the network interface 156 is controlled by the server 112. However, in the preferred embodiment of the in-server SAN apparatus, the storage controller 152 is able to access the network interface 156 independently so that clients 114 may communicate directly with one or more of the storage controllers 152a in the first server 112a forming a SAN or so that one or more first storage controllers 152a may be networked together with a second storage controller 152b or other remote storage controllers 152 to form a SAN. In the preferred embodiment, devices remote from the first server 112a may access the first server 112a or the first storage controller 152a through a single, shared network address. In one embodiment, the in-server SAN apparatus includes a common interface module 166 that configures the network interface 156, the storage controller 152, and the server 112 such that the server 112 and the storage controller 152 are accessible using a shared network address.

In other embodiments, the server 112 includes two or more network interfaces 156. For example, the server 112 may communicate over one network interface 156 while the storage device 150 may communicate over another interface. In another example, the server 112 includes multiple storage devices 150, each with a network interface 156. One of skill in the art will recognize other configurations of a server 112 with one or more storage devices 150 and one or more network interfaces 156 where one or more of the storage devices 150 access a network interface 156 independent of the server 112. One of skill in the art will also recognize how these various configurations may be extended to support network redundancy and improve availability.

Advantageously, the in-server SAN apparatus eliminates much of the complexity and expense of a traditional SAN. For example, a typical SAN requires servers 112 with external storage controllers 152 and associated data storage devices 154. This takes up additional space in a rack and requires cabling, switches, etc. The cabling, switching, another other overhead required to configure a traditional SAN take space, degrade bandwidth, and are expensive. The in-server SAN apparatus allows the storage controllers 152 and associated storage 154 to fit in a server 112 form factor, thus reducing required space and costing less. In-server SAN also allows connection using relatively fast communication over internal and external high-speed data buses.

In one embodiment, the storage device 150 is a solid-state storage device 102, the storage controller 152 is a solid-state storage controller 104, and the data storage device 154 is a solid-state storage 110. This embodiment is advantageous because of the speed of solid-state storage device 102 as described herein. In addition, the solid-state storage device 102 may be configured in a DIMM which may conveniently fit in a server 112 and require a small amount of space.

The one or more internal clients 114a in the server 112 may also connect to the computer network 116 through the server's network interface 156 and the client's connection is typically controlled by the server 112. This has several advantages. Clients 114a may locally and remotely access the storage devices 150 directly and may initiate a local or remote direct memory access ("DMA," "RDMA") data transfer between the memory of a client 114a and a storage device 150.

In another embodiment, clients 114, 114a within or external to a server 112 may act as file servers to clients 114 through one or more networks 116 while utilizing locally attached storage devices 150 as DAS devices, network attached storage devices 150, network attached solid-state storages 102 devices participating as part of in-server SANs, external SANs, and hybrid SANs. A storage device 150 may participate in a DAS, in-server-SAN, SAN, NAS, etc, simultaneously and in any combination. Additionally, each storage device 150 may be partitioned in such a way that a first partition makes the storage device 150 available as a DAS, a second partition makes the storage device 150 available as an element in an in-server-SAN, a third partition makes the storage device 150 available as a NAS, a fourth partition makes the storage device 150 available as an element in a SAN, etc. Similarly, the storage device 150 may be partitioned consistent with security and access control requirements. One of skill in the art will recognize that any number of combinations and permutations of storage devices, virtual storage devices, storage networks, virtual storage networks, private storage, shared storage, parallel file systems, parallel object file systems, block storage devices, object storage devices, storage appliances, network appliances, and the like may be constructed and supported.

In addition, by directly connecting to the computer network 116, the storage devices 150 can communicate with each other and can act as an in-server SAN. Clients 114a in the servers 112 and clients 114 connected through the computer network 116 may access the storage devices 150 as a SAN. By moving the storage devices 150 into the servers 112 and having the ability to configure the storage devices 150 as a SAN, the server 112/storage device 150 combination eliminates the need in conventional SANs for dedicated storage controllers, fiber channel networks, and other equipment. The in-server SAN system 103 has the advantage of enabling the storage device 150 to share common resources such as power, cooling, management, and physical space with the client 114 and computer 112. For example, storage devices 150 may fill empty slots of servers 112 and provide all the performance capabilities, reliability and availability of a SAN or NAS. One of skill in the art will recognize other features and benefits of an in-server SAN system 103.

In another configuration, multiple in-server-SAN storage devices 150a are collocated within a single server 112a infrastructure. In one embodiment, the server 112a is comprised of one or more internal bladed server clients 114a interconnected using PCI-express IOV without an external network interface 156, external client 114, 114b or external storages device 150b.

In addition, in-server SAN storage device 150 may communicate through one or more computer networks 116 with peer storage devices 150 that are located in a computer 112 (per FIG. 1A), or are connected directly to the computer network 116 without a computer 112 to form a hybrid SAN which has all the capabilities of both SAN and in-server SAN. This flexibility has the benefit of simplifying extensibility and migration between a variety of possible solid-state storage network implementations. One skilled in the art will recognize other combinations, configurations, implementations, and architectures for locating and interconnecting solid-state controllers 104.

Where the network interface 156a can be controlled by only one agent operating within the server 112a, a link setup module 168 operating within that agent can set up communication paths between internal clients 114a and storage devices 150a/first storage controllers 152a through network interface 156a to external storage devices 150b and clients 114, 114b. In a preferred embodiment, once the communication path is established, the individual internal storage devices 150a and internal clients 114a are able to establish and manage their own command queues and transfer both commands and data through network interface 156a to external storage devices 150b and clients 114, 114b in either direction, directly and through RDMA independent of the proxy or agent controlling the network interface 156a. In one embodiment, the link setup module 168 establishes the communication links during an initialization process, such as a startup or initialization of hardware.

In another embodiment, a proxy module 170 directs at least a portion of commands used in servicing a storage request through the first server 112a while at least data, and possibly other commands, associated with the storage request are communicated between the first storage controller and the external storage device independent of the first server. In another embodiment, the proxy module 170 forwards commands or data in behalf of the internal storage devices 150a and clients 114a.

In one embodiment, the first server 112a includes one or more servers within the first server 112a and includes a virtual bus module 172 that allows the one or more servers in the first server 112a to independently access one or more storage controllers 152a through separate virtual buses. The virtual buses may be established using an advanced bus protocol such as PCIe-IOV. Network interfaces 156a supporting IOV may allow the one or more servers and the one or more storage controllers to independently control the one or more network interfaces 156a.

In various embodiments, the in-server SAN apparatus allows two or more storage devices 150 to be configured in a RAID. In one embodiment, the in-server SAN apparatus includes a front-end RAID module 174 that configures two or more storage controllers 152 as a RAID. Where a storage request from a client 114, 114a includes a request to store data, the front-end RAID module 174 services the storage request by writing the data to the RAID consistent with the particular implemented RAID level. A second storage controller 152 may be located either in the first server 112a or external to the first server 112a. The front-end RAID module 174 allows RAIDing of storage controllers 152 such that the storage controllers 152 are visible to the client 114, 114a sending the storage request. This allows striping and parity information to be managed by a storage controller 152 designated as master or by the client 114, 114a.

In another embodiment, the in-server SAN apparatus includes a back-end RAID module 176 that configures two or more data storage devices 154 controlled by a storage controller as a RAID. Where the storage request from the client comprises a request to store data, the back-end RAID module 176 services the storage request by writing the data to the RAID consistent with an implemented RAID level such that the storage devices 154 configured as a RAID are accessed by the client 114, 114a as a single data storage device 154 controlled by the first storage controller 152. This RAID implementation allows RAIDing of the data storage devices 154 controlled by a storage controller 152 in a way that the RAIDing is transparent to any client 114, 114a accessing the data storage devices 154. In another embodiment, both front-end RAID and back-end RAID are implemented to have multi-level RAID. One of skill in the art will recognize other ways to RAID the storage devices 152 consistent with the solid-state storage controller 104 and associated solid-state storage 110 described herein.

Apparatus for Storage Controller-Managed Objects

Figure 2A:
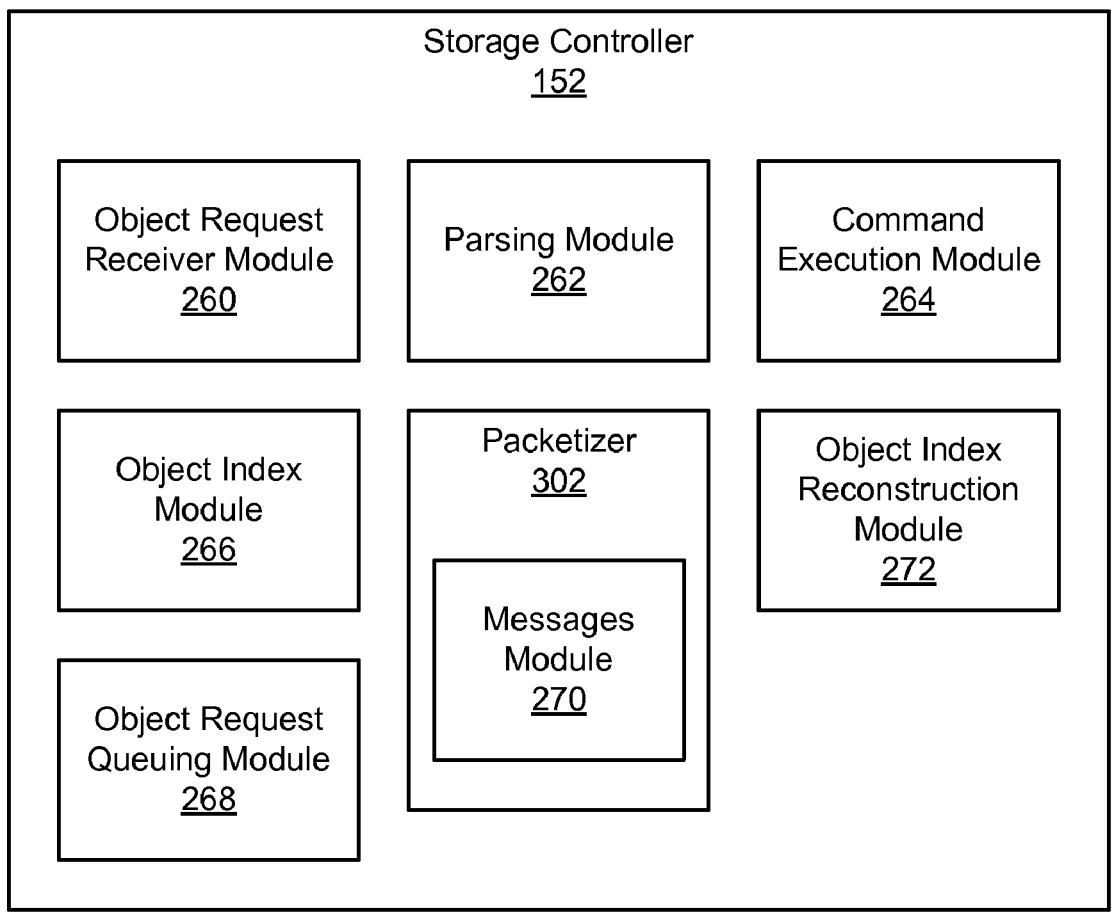
FIG. 2A is a schematic block diagram illustrating one embodiment of an apparatus for object management in a storage device in accordance with the present invention.

FIG. 2A is a schematic block diagram illustrating one embodiment of an apparatus 200 for object management in a storage device in accordance with the present invention. The apparatus 200 includes a storage controller 152 with an object request receiver module 260, a parsing module 262, a command execution module 264, an object index module 266, an object request queuing module 268, a packetizer 302 with a messages module 270, and an object index reconstruction module 272, which are described below.

The storage controller 152 is substantially similar to the storage controller 152 described in relation to the system 102 of FIG. 1B and may be a solid-state storage device controller 202 described in relation to FIG. 2. The apparatus 200 includes an object request receiver module 260 that receives an object request from one or more requesting devices 155. For example, for a store object data request, the storage controller 152 stores the data segment as a data packet in a data storage device 154 coupled to the storage controller 152. The object request is typically directed at a data segment stored or to be stored in one or more object data packets for an object managed by the storage controller. The object request may request that the storage controller 152 create an object to be later filled with data through later object request which may utilize a local or remote direct memory access ("DMA," "RDMA") transfer.

In one embodiment, the object request is a write request to write all or part of an object to a previously created object. In one example, the write request is for a data segment of an object. The other data segments of the object may be written to the storage device 150 or to other storage devices 152. In another example, the write request is for an entire object. In another example, the object request is to read data from a data segment managed by the storage controller 152. In yet another embodiment, the object request is a delete request to delete a data segment or object.

Advantageously, the storage controller 152 can accept write requests that do more than write a new object or append data to an existing object. For example, a write request received by the object request receiver module 260 may include a request to add data ahead of data stored by the storage controller 152, to insert data into the stored data, or to replace a segment of data. The object index maintained by the storage controller 152 provides the flexibility required for these complex write operations that is not available in other storage controllers, but is currently available only outside of storage controllers in file systems of servers and other computers.

The apparatus 200 includes a parsing module 262 that parses the object request into one or more commands. Typically, the parsing module 262 parses the object request into one or more buffers. For example, one or more commands in the object request may be parsed into a command buffer. Typically the parsing module 262 prepares an object request so that the information in the object request can be understood and executed by the storage controller 152. One of skill in the art will recognize other functions of a parsing module 262 that parses an object request into one or more commands.

The apparatus 200 includes a command execution module 264 that executes the command(s) parsed from the object request. In one embodiment, the command execution module 264 executes one command. In another embodiment, the command execution module 264 executes multiple commands. Typically, the command execution module 264 interprets a command parsed from the object request, such as a write command, and then creates, queues, and executes subcommands. For example, a write command parsed from an object request may direct the storage controller 152 to store multiple data segments. The object request may also include required attributes such as encryption, compression, etc. The command execution module 264 may direct the storage controller 152 to compress the data segments, encrypt the data segments, create one or more data packets and associated headers for each data packet, encrypt the data packets with a media encryption key, add error correcting code, and store the data packets a specific location. Storing the data packets at a specific location and other subcommands may also be broken down into other lower level subcommands. One of skill in the art will recognize other ways that the command execution module 264 can execute one or more commands parsed from an object request.

The apparatus 200 includes an object index module 266 that creates an object entry in an object index in response to the storage controller 152 creating an object or storing the data segment of the object. Typically, the storage controller 152 creates a data packet from the data segment and the location of where the data packet is stored is assigned at the time the data segment is stored. Object metadata received with a data segment or as part of an object request may be stored in a similar way.

The object index module 266 creates an object entry into an object index at the time the data packet is stored and the physical address of the data packet is assigned. The object entry includes a mapping between a logical identifier of the object and one or more physical addresses corresponding to where the storage controller 152 stored one or more data packets and any object metadata packets. In another embodiment, the entry in the object index is created before the data packets of the object are stored. For example, if the storage controller 152 determines a physical address of where the data packets are to be stored earlier, the object index module 266 may create the entry in the object index earlier.

Typically, when an object request or group of object requests results in an object or data segment being modified, possibly during a read-modify-write operation, the object index module 266 updates an entry in the object index corresponding the modified object. In one embodiment, the object index creates a new object and a new entry in the object index for the modified object. Typically, where only a portion of an object is modified, the object includes modified data packets and some data packets that remain unchanged. In this case, the new entry includes a mapping to the unchanged data packets as where they were originally written and to the modified objects written to a new location.

In another embodiment, where the object request receiver module 260 receives an object request that includes a command that erases a data block or other object elements, the storage controller 152 may store at least one packet such as an erase packet that includes information including a reference to the object, relationship to the object, and the size of the data block erased. Additionally, it may further indicate that the erased object elements are filled with zeros. Thus, the erase object request can be used to emulate actual memory or storage that is erased and actually has a portion of the appropriate memory/storage actually stored with zeros in the cells of the memory/storage.

Beneficially, creating an object index with entries indicating mapping between data segments and metadata of an object allows the storage controller 152 to autonomously handle and manage objects. This capability allows a great amount of flexibility for storing data in the storage device 150. Once the index entry for the object is created, subsequent object requests regarding the object can be serviced efficiently by the storage controller 152.

In one embodiment, the storage controller 152 includes an object request queuing module that queues one or more object requests received by the object request receiver module 260 prior to parsing by the parsing module 262. The object request queuing module 268 allows flexibility between when an object request is received and when it is executed.

In another embodiment, the storage controller 152 includes a packetizer 302 that creates one or more data packets from the one or more data segments where the data packets are sized for storage in the data storage device 154. The packetizer 302 is described below in more detail with respect to FIG. 3. The packetizer 302 includes, in one embodiment, a messages module 270 that creates a header for each packet. The header includes a packet identifier and a packet length. The packet identifier relates the packet to the object for which the packet was formed.

In one embodiment, each packet includes a packet identifier that is self-contained in that the packet identifier contains adequate information to identify the object and relationship within the object of the object elements contained within the packet. However, a more efficient preferred embodiment is to store packets in containers.

A container is a data construct that facilitates more efficient storage of packets and helps establish relationships between an object and data packets, metadata packets, and other packets related to the object that are stored within the container. Note that the storage controller 152 typically treats object metadata received as part of an object and data segments in a similar manner. Typically "packet" may refer to a data packet comprising data, a metadata packet comprising metadata, or another packet of another packet type. An object may be stored in one or more containers and a container typically includes packets for no more than one unique object. An object may be distributed between multiple containers. Typically a container is stored within a single logical erase block (storage division) and is typically never split between logical erase blocks.

A container, in one example, may be split between two or more logical/virtual pages. A container is identified by a container label that associates that container with an object. A container may contain zero to many packets and the packets within a container are typically from one object. A packet may be of many object element types, including object attribute elements, object data elements, object index elements, and the like. Hybrid packets may be created that include more than one object element type. Each packet may contain zero to many elements of the same element type. Each packet within a container typically contains a unique identifier that identifies the relationship to the object.

Each packet is associated with one container. In a preferred embodiment, containers are limited to an erase block so that at or near the beginning of each erase block a container packet can be found. This helps limit data loss to an erase block with a corrupted packet header. In this embodiment, if the object index is unavailable and a packet header within the erase block is corrupted, the contents from the corrupted packet header to the end of the erase block may be lost because there is possibly no reliable mechanism to determine the location of subsequent packets. In another embodiment, a more reliable approach is to have a container limited to a page boundary. This embodiment requires more header overhead. In another embodiment, containers can flow across page and erase block boundaries. This requires less header overhead but a larger portion of data may be lost if a packet header is corrupted. For these several embodiments it is expected that some type of RAID is used to further ensure data integrity.

In one embodiment, the apparatus 200 includes an object index reconstruction module 272 that that reconstructs the entries in the object index using information from packet headers stored in the data storage device 154. In one embodiment, the object index reconstruction module 272 reconstructs the entries of the object index by reading headers to determine the object to which each packet belongs and sequence information to determine where in the object the data or metadata belongs. The object index reconstruction module 272 uses physical address information for each packet and timestamp or sequence information to create a mapping between the physical locations of the packets and the object identifier and data segment sequence. Timestamp or sequence information is used by the object index reconstruction module 272 to replay the sequence of changes made to the index and thereby typically reestablish the most recent state.

In another embodiment, the object index reconstruction module 272 locates packets using packet header information along with container packet information to identify physical locations of the packets, object identifier, and sequence number of each packet to reconstruct entries in the object index. In one embodiment, erase blocks are time stamped or given a sequence number as packets are written and the timestamp or sequence information of an erase block is used along with information gathered from container headers and packet headers to reconstruct the object index. In another embodiment, timestamp or sequence information is written to an erase block when the erase block is recovered.

Where the object index is stored in volatile memory, an error, loss of power, or other problem causing the storage controller 152 to shut down without saving the object index could be a problem if the object index cannot be reconstructed. The object index reconstruction module 272 allows the object index to be stored in volatile memory allowing the advantages of volatile memory, such as fast access. The object index reconstruction module 272 allows quick reconstruction of the object index autonomously without dependence on a device external to the storage device 150.

In one embodiment, the object index in volatile memory is stored periodically in a data storage device 154. In a particular example, the object index, or "index metadata," is stored periodically in a solid-state storage 110. In another embodiment, the index metadata is stored in a solid-state storage 110n separate from solid-state storage 110a-110n-1 storing packets. The index metadata is managed independently from data and object metadata transmitted from a requesting device 155 and managed by the storage controller 152/solid-state storage device controller 202. Managing and storing index metadata separate from other data and metadata from an object allows efficient data flow without the storage controller 152/solid-state storage device controller 202 unnecessarily processing object metadata.

In one embodiment, where an object request received by the object request receiver module 260 includes a write request, the storage controller 152 receives one or more data segments of an object from memory of a requesting device 155 as a local or remote direct memory access ("DMA," "RDMA") operation. In a preferred example, the storage controller 152 pulls data from the memory of the requesting device 155 in one or more DMA or RDMA operations. In another example, the requesting device 155 pushes the data segment(s) to the storage controller 152 in one or more DMA or RDMA operations. In another embodiment, where the object request includes a read request, the storage controller 152 transmits one or more data segments of an object to the memory of the requesting device 155 in one or more DMA or RDMA operations. In a preferred example, the storage controller 152 pushes data to the memory of the requesting device 155 in one or more DMA or RDMA operations. In another example, the requesting device 155 pulls data from the storage controller 152 in one or more DMA or RDMA operations. In another example, the storage controller 152 pulls object command request sets from the memory of the requesting device 155 in one or more DMA or RDMA operations. In another example, the requesting device 155 pushes object command request sets to the storage controller 152 in one or more DMA or RDMA operations.

In one embodiment, the storage controller 152 emulates block storage and an object communicated between the requesting device 155 and the storage controller 152 comprises one or more data blocks. In one embodiment, the requesting device 155 includes a driver so that the storage device 150 appears as a block storage device. For example, the requesting device 152 may send a block of data of a certain size along with a physical address of where the requesting device 155 wants the data block stored. The storage controller 152 receives the data block and uses the physical block address transmitted with the data block or a transformation of the physical block address as an object identifier. The storage controller 156 then stores the data block as an object or data segment of an object by packetizing the data block and storing the data block at will. The object index module 266 then creates an entry in the object index using the physical block-based object identifier and the actual physical location where the storage controller 152 stored the data packets comprising the data from the data block.

In another embodiment, the storage controller 152 emulates block storage by accepting block objects. A block object may include one or more data blocks in a block structure. In one embodiment, the storage controller 152 treats the block object as any other object. In another embodiment, an object may represent an entire block device, partition of a block device, or some other logical or physical sub-element of a block device including a track, sector, channel, and the like. Of particular note is the ability to remap a block device RAID group to an object supporting a different RAID construction such as progressive RAID. One skilled in the art will recognize other mappings of traditional or future block devices to objects.

Solid-State Storage Device

Figure 2B:
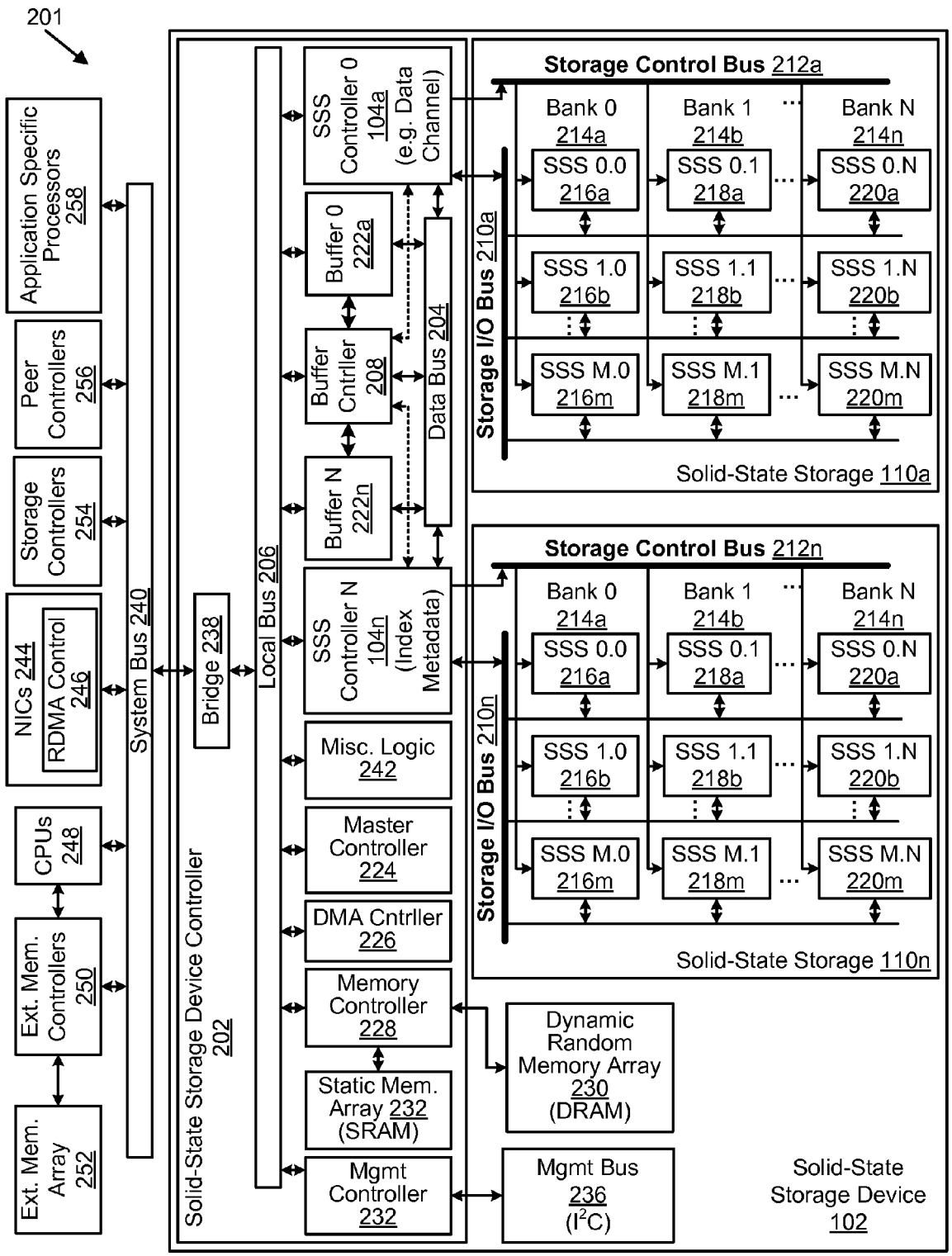
FIG. 2B is a schematic block diagram illustrating one embodiment of a solid-state storage device controller in a solid-state storage device in accordance with the present invention.

FIG. 2B is a schematic block diagram illustrating one embodiment 201 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage 110. In the depicted embodiment, two solid-state controllers are shown: solid-state controller 0 104a and solid-state storage controller N 104n, and each controls solid-state storage 110a-n. In the depicted embodiment, solid-state storage controller 0 104a controls a data channel so that the attached solid-state storage 110a stores data. Solid-state storage controller N 104n controls an index metadata channel associated with the stored data and the associated solid-state storage 110n stores index metadata. In an alternate embodiment, the solid-state storage device controller 202 includes a single solid-state controller 104a with a single solid-state storage 110a. In another embodiment, there are a plurality of solid-state storage controllers 104a-n and associated solid-state storage 110a-n. In one embodiment, one or more solid state controllers 104a-104n-1, coupled to their associated solid-state storage 110a-110n-1, control data while at least one solid-state storage controller 104n, coupled to its associated solid-state storage 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage 110, data cannot be read from the solid-state storage 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a column of solid-state storage elements 216, 218, 220 is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage 110. In one embodiment, a solid-state storage 110a includes twenty solid-state storage elements 216, 218, 220 per bank 214 with eight banks 214 and a solid-state storage 110n includes 2 solid-state storage elements 216, 218 per bank 214 with one bank 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210a row (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216a-220a, each in a separate bank 214a-n. In another embodiment, 20 storage elements (e.g. SSS 0.0-SSS 20.0) 216 form a virtual bank 214a so that each of the eight virtual banks has 20 storage elements (e.g. SSS0.0-SSS 20.8) 216, 218, 220. Data is sent to the solid-state storage 110 over the storage I/O bus 210 to all storage elements of a particular group of storage elements (SSS 0.0-SSS 0.8) 216a, 218a, 220a. The storage control bus 212a is used to select a particular bank (e.g. Bank-0 214a) so that the data received over the storage I/O bus 210 connected to all banks 214 is written just to the selected bank 214a.

In a preferred embodiment, the storage I/O bus 210 is comprised of one or more independent I/O buses ("IIOBa-m" comprising 210a.a-m, 210n.a-m) wherein the solid-state storage elements within each row share one of the independent I/O buses accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element 216, 218, 220 has a capacity of 4 kB. A bank 214 of 20 solid-state storage elements 216, 218, 220 would then have an 80 kB capacity of pages accessed with the same address going out the channels of the storage I/O bus 210.

This group of pages in a bank 214 of solid-state storage elements 216, 218, 220 of 80 kB may be called a virtual page. Similarly, an erase block of each storage element 216a-m of a bank 214a may be grouped to form a virtual erase block. In a preferred embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a of a particular erase block of a particular element of a particular bank, a physical address is sent on the storage I/O bus 210 and followed by the packet. The physical address contains enough information for the solid-state storage element 216, 218, 220 to direct the packet to the designated location within the page. Since all storage elements in a row of storage elements (e.g. SSS 0.0-SSS 0.N 216a, 218a, 220a) are accessed simultaneously by the appropriate bus within the storage I/O bus 210a.a, to reach the proper page and to avoid writing the data packet to similarly addressed pages in the row of storage elements (SSS 0.0-SSS 0.N 216a, 218a, 220a), the bank 214a that includes the solid-state storage element SSS 0.0 216a with the correct page where the data packet is to be written is simultaneously selected by the storage control bus 212.

Similarly, a read command traveling on the storage I/O bus 212 requires a simultaneous command on the storage control bus 212 to select a single bank 214a and the appropriate page within that bank 214a. In a preferred embodiment, a read command reads an entire page, and because there are multiple solid-state storage elements 216, 218, 220 in parallel in a bank 214, an entire virtual page is read with a read command. However, the read command may be broken into subcommands, as will be explained below with respect to bank interleave. A virtual page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a virtual erase block, each with a particular erase block address to erase a particular erase block. Simultaneously a particular bank (e.g. bank-0 214a) is selected over the storage control bus 212 to prevent erasure of similarly addressed erase blocks in all of the banks (banks 1-N 214b-n). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage 110. For example, packets are streamed to the storage write buffers of a bank 214a of storage elements 216 and when the buffers are full, the packets are programmed to a designated virtual page. Packets then refill the storage write buffers and, when full, the packets are written to the next virtual page. The next virtual page may be in the same bank 214a or another bank (e.g. 214b). This process continues, virtual page after virtual page, typically until a virtual erase block is filled. In another embodiment, the streaming may continue across virtual erase block boundaries with the process continuing, virtual erase block after virtual erase block.

In a read, modify, write operation, data packets associated with the object are located and read in a read operation. Data segments of the modified object that have been modified are not written to the location from which they are read. Instead, the modified data segments are again converted to data packets and then written to the next available location in the virtual page currently being written. The object index entries for the respective data packets are modified to point to the packets that contain the modified data segments. The entry or entries in the object index for data packets associated with the same object that have not been modified will include pointers to original location of the unmodified data packets. Thus, if the original object is maintained, for example to maintain a previous version of the object, the original object will have pointers in the object index to all data packets as originally written. The new object will have pointers in the object index to some of the original data packets and pointers to the modified data packets in the virtual page that is currently being written.

In a copy operation, the object index includes an entry for the original object mapped to a number of packets stored in the solid-state storage 110. When a copy is made, a new object is created and a new entry is created in the object index mapping the new object to the original packets. The new object is also written to the solid-state storage 110 with its location mapped to the new entry in the object index. The new object packets may be used to identify the packets within the original object that are referenced in case changes have been made in the original object that have not been propagated to the copy and the object index is lost or corrupted.

Beneficially, sequentially writing packets facilitates a more even use of the solid-state storage 110 and allows the solid-storage device controller 202 to monitor storage hot spots and level usage of the various virtual pages in the solid-state storage 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage 110 over a storage I/O bus 210. In a typical embodiment where the solid-state storage is arranged in banks 214 and each bank 214 includes multiple storage elements 216, 218, 220 accessed in parallel, the storage I/O bus 210 is an array of busses, one for each row of storage elements 216, 218, 220 spanning the banks 214. As used herein, the term "storage I/O bus" may refer to one storage I/O bus 210 or an array of data independent busses 204. In a preferred embodiment, each storage I/O bus 210 accessing a row of storage elements (e.g. 216a, 218a, 220a) may include a logical-to-physical mapping for storage divisions (e.g. erase blocks) accessed in a row of storage elements 216a, 218a, 220a. This mapping allows a logical address mapped to a physical address of a storage division to be remapped to a different storage division if the first storage division fails, partially fails, is inaccessible, or has some other problem. Remapping is explained further in relation to the remapping module 314 of FIG. 3.

Data may also be communicated to the solid-state storage controller(s) 104 from a requesting device 155 through the system bus 240, bridge 238, local bus 206, buffer(s) 22, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 222 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage 110 such as NAND flash or other storage media. In a preferred embodiment, data and associated out-of-band metadata ("object metadata") arriving with the data is communicated using one or more data channels comprising one or more solid-state storage controllers 104a-104n-1 and associated solid-state storage 110a-110n-1 while at least one channel (solid-state storage controller 104n, solid-state storage 110n) is dedicated to in-band metadata, such as index information and other metadata generated internally to the solid-state storage device 102.

The local bus 206 is typically a bi-directional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 323 (static random access memory "SRAM"), etc. In one embodiment, the local memory is controlled using the master controller 224. In another embodiment, the master controller accesses the local memory via a memory controller 228. In another embodiment, the master controller runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller.

In one embodiment, where the storage device 152/solid-state storage device controller 202 manages multiple data storage devices/solid-state storage 110a-n, the master controller 224 divides the work load among internal controllers, such as the solid-state storage controllers 104a-n. For example, the master controller 224 may divide an object to be written to the data storage devices (e.g. solid-state storage 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 102 or other device connected to the storage device 152/solid-state storage device 102 views the storage device 152/solid-state storage device 102 as a block storage device and sends data to specific physical addresses in the storage device 152/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device 152/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 118 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 118) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246. DMA and RDMA are explained in more detail below.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I²C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
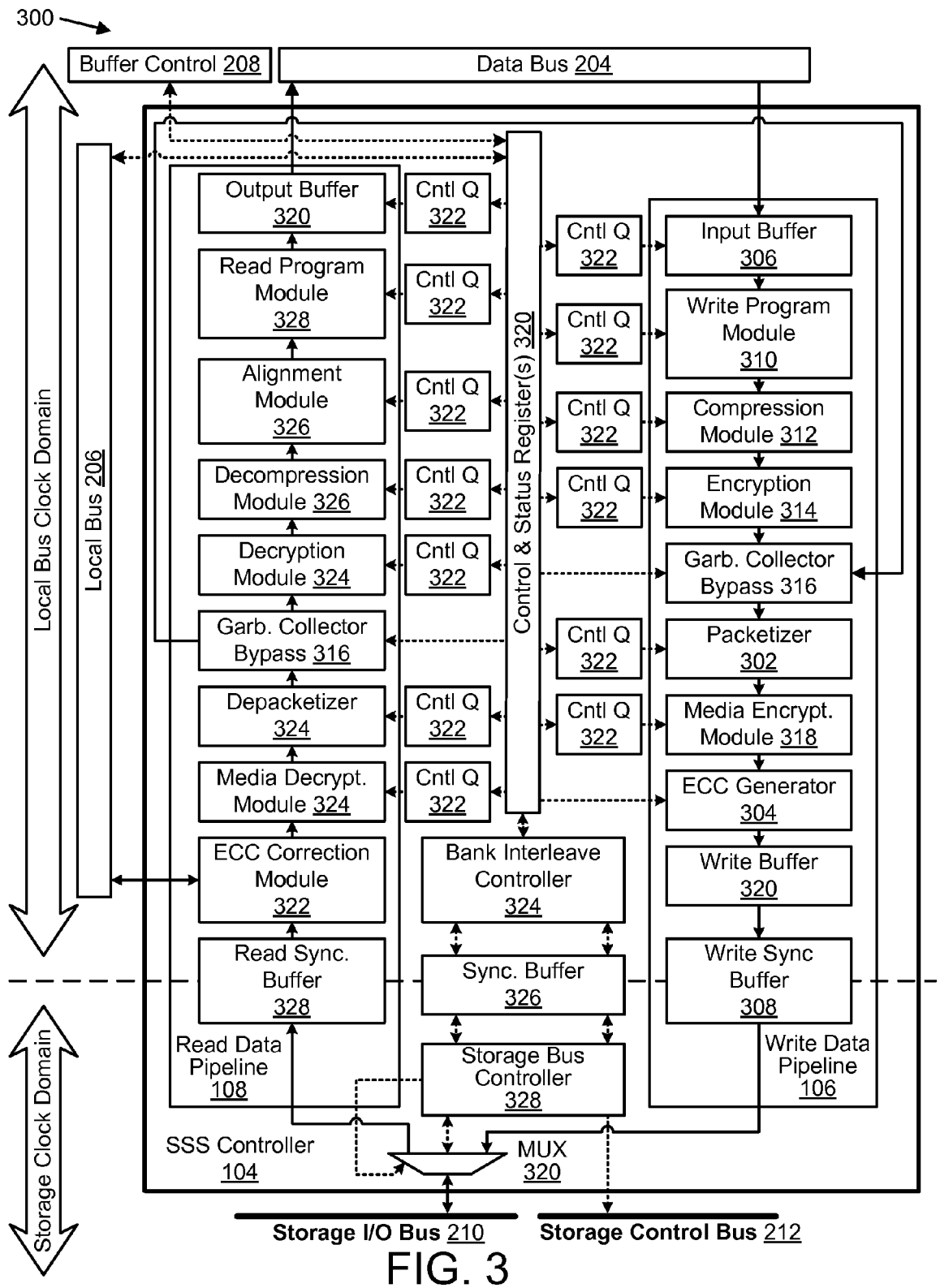
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline includes a packetizer 302 and an error-correcting code ("ECC") generator 304. In other embodiments, the write data pipeline includes an input buffer 306, a write synchronization buffer 308, a write program module 310, a compression module 312, an encryption module 314, a garbage collector bypass 316 (with a portion within the read data pipeline), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage 110. The data or metadata segment is typically part of an object, but may also include an entire object. In another embodiment, the data segment is part of a block of data, but may also include an entire block of data. Typically, an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object or data block.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC generator 304 that generates one or more error-correcting codes ("ECC") for the one or more packets received from the packetizer 302. The ECC generator 304 typically uses an error correcting algorithm to generate ECC which is stored with the packet. The ECC stored with the packet is typically used to detect and correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In the preferred embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In the preferred embodiment, ECC algorithms are not dynamically modified. In a preferred embodiment, the ECC stored with the data packets is robust enough to correct errors in more than two bits.

Beneficially, using a robust ECC algorithm allowing more than single bit correction or even double bit correction allows the life of the solid-state storage 110 to be extended. For example, if flash memory is used as the storage medium in the solid-state storage 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage 110. The write synch buffer 308 is located at a boundary between a local clock domain and a solid-state storage clock domain and provides buffering to account for the clock domain differences. In other embodiments, synchronous solid-state storage 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from an embodiment that integrates the solid-state storage 110 and where the embodiment requires encryption protection. The media encryption module 318 and corresponding media decryption module 332 provide a level of security for data stored in the solid-state storage 110. For example, where data is encrypted with the media encryption module 318, if the solid-state storage 110 is connected to a different solid-state storage controller 104, solid-state storage device 102, or computer 112, the contents of the solid-state storage 110 typically could not be read without use of the same encryption key used during the write of the data to the solid-state storage 110 without significant effort.

In a typical embodiment, the solid-state storage device 102 does not store the encryption key in non-volatile storage and allows no external access to the encryption key. The encryption key is provided to the solid-state storage controller 104 during initialization. The solid-sate storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm. The encryption key may be received from a client 114, a computer 112, key manager, or other device that manages the encryption key to be used by the solid-state storage controller 104. In another embodiment, the solid-state storage 110 may have two or more partitions and the solid-state storage controller 104 behaves as though it were two or more solid-state storage controllers 104, each operating on a single partition within the solid-state storage 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption module 314 differs from the media encryption module 318 in that the encryption keys used by the encryption module 318 to encrypt data may not be common to all data stored within the solid-state storage device 102 but may vary on an object basis and received in conjunction with receiving data segments as described below. For example, an encryption key for a data segment to be encrypted by the encryption module 318 may be received with the data segment or may be received as part of a command to write an object to which the data segment belongs. The solid-sate storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm. In one embodiment, the nonce used by the media encryption module 318 is the same as that used by the encryption module 314.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 318 encrypts a first packet with a first encryption key received in conjunction with the packet and encrypts a second packet with a second encryption key received in conjunction with the second packet. In another embodiment, the encryption module 318 encrypts a first packet with a first encryption key received in conjunction with the packet and passes a second data packet on to the next stage without encryption. Beneficially, the encryption module 318 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In a preferred embodiment, the garbage collector bypass 316 is part of an autonomous garbage collector system that operates within the solid-state storage device 102. This allows the solid-state storage device 102 to manage data so that data is systematically spread throughout the solid-state storage 110 to improve performance, data reliability and to avoid overuse and underuse of any one location or area of the solid-state storage 110 and to lengthen the useful life of the solid-state storage 110.

The garbage collector bypass 316 coordinates insertion of segments into the write data pipeline 106 with other segments being written by clients 116 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 106 to fill the remainder of the virtual page in order to improve the efficiency of storage within the Solid-State Storage 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage 110. This allows a write operation to send an entire page of data to the solid-state storage 110 without interruption. By sizing the write buffer 320 of the write data pipeline 106 and buffers within the read data pipeline 108 to be the same capacity or larger than a storage write buffer within the solid-state storage 110, writing and reading data is more efficient since a single write command may be crafted to send a full virtual page of data to the solid-state storage 110 instead of multiple commands.

While the write buffer 320 is being filled, the solid-state storage 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage 110.

In another embodiment, the write buffer 320 is sized smaller than a virtual page so that less than a page of information could be written to a storage write buffer in the solid-state storage 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage 110 to fill the pages of a virtual page prior to programming the data. In this way a data stall in the write data pipeline 106 would not stall reading from the solid-state storage device 106.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In the preferred embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the object to which the packet belongs. In another preferred embodiment, the solid-state storage controller 104 stores data using some type of RAID and is able to recover the corrupted data. In another embodiment, the ECC correction module 322 sends and interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the object index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device, the alignment module 326 may discard the unwanted data.

In one embodiment, the read data pipeline 108 includes a read synchronization buffer 328 that buffers one or more requested packets read from the solid-state storage 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device. The output buffer 330 accounts for differences between when data segments are received from stages of the read data pipeline 108 and when the data segments are transmitted to other parts of the solid-state storage controller 104 or to the requesting device. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage 110 may have two or more partitions and the solid-state storage controller 104 behaves as though it were two or more solid-state storage controllers 104 each operating on a single partition within the solid-state storage 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. Typically, the decryption module 334 uses a different encryption key to decrypt a data segment than the media decryption module 332 uses to decrypt requested packets. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In the preferred embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4A:
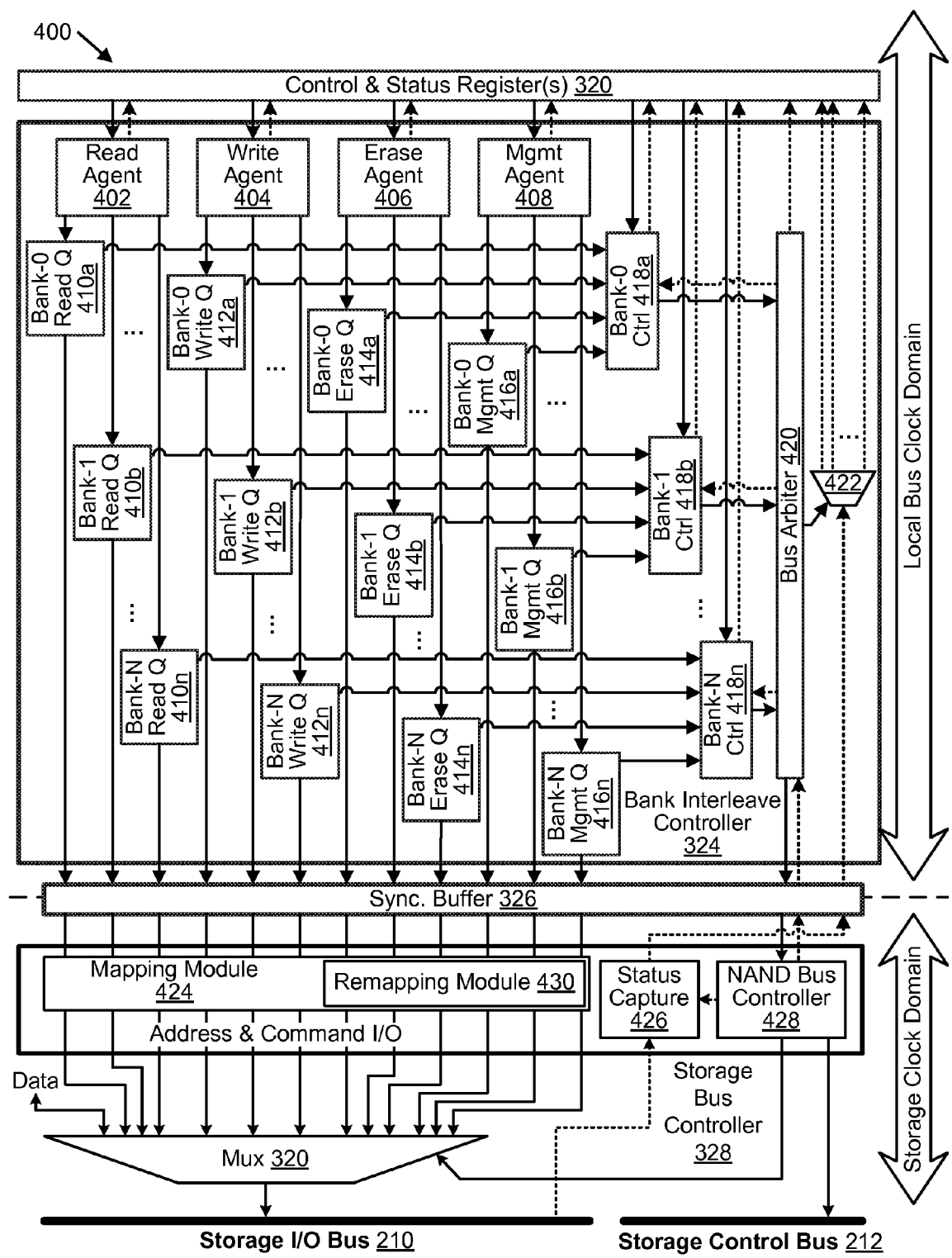
FIG. 4A is a schematic block diagram illustrating one embodiment of a bank interleave controller in the solid-state storage controller in accordance with the present invention.
Figure 4B:
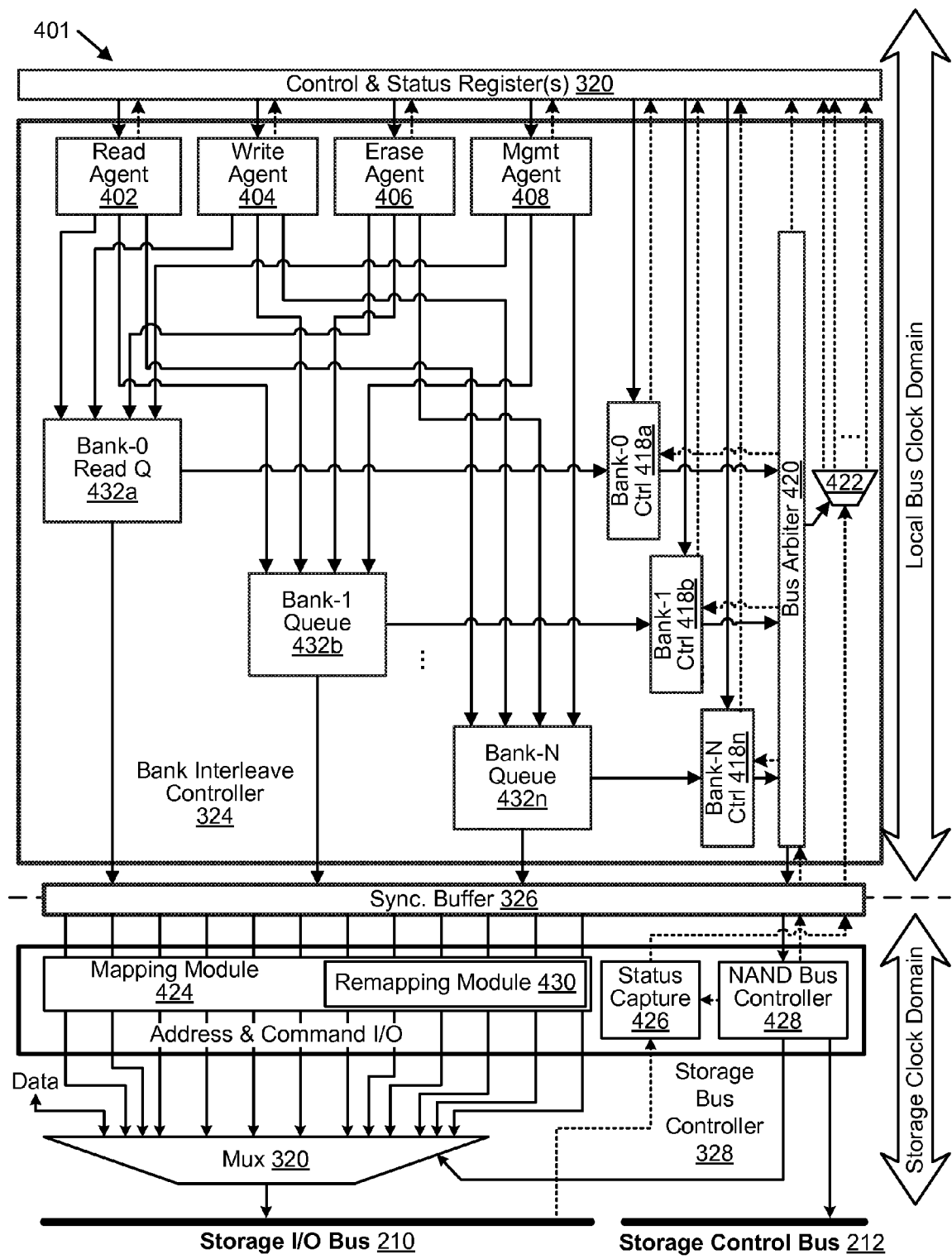
FIG. 4B is a schematic block diagram illustrating an alternate embodiment of a bank interleave controller in the solid-state storage controller in accordance with the present invention.

The solid-state storage controller 104 and or solid-state storage device 102 may also include a bank interleave controller 344, a synchronization buffer 346, a storage bus controller 348, and a multiplexer ("MUX") 350, which are described in relation to FIGS. 4A and 4B.

Bank Interleave

FIG. 4A is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronous buffer 346, which are described below. The bank interleave controller includes a read agent 402, a write agent 404, an erase agent 406, a management agent 408, read queues 410a-n, write queues 412a-n, erase queues 414a-n, and management queues 416a-n for the banks 214 in the solid-state storage 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 344 and coordinates among the banks 214 of the solid-state storage 110 execution of the commands stored in the queues, such that a command of a first type executes on one bank 214a while a command of a second type executes on a second bank 214b. The one or more commands are separated by command type into the queues. Each bank 214 of the solid-state storage 110 has a corresponding set of queues within the bank interleave controller 344 and each set of queues includes a queue for each command type.

The bank interleave controller 344 coordinates among the banks 214 of the solid-state storage 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4A, erase and management queues 414, 416 are included and would be appropriate for flash memory, NRAM, MRAM, DRAM, PRAM, etc.

For other types of solid-state storage 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4A, the bank interleave controller 344 includes, for each bank 214, a read queue 410 for reading data from the solid-state storage 110, a write queue 412 for write commands to the solid-state storage 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage 110 with an asynchronous, bi-directional serial storage I/O bus 210, only one command (control information) or set of data can be transmitted at a time. For example, when write commands or data are being transmitted to the solid-state storage 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage 110. In another embodiment, the solid-state controller 104 includes a bank interleave controller 344 for each row of storage elements 216a-m, 218a-m, 220a-m. For example, one bank interleave controller 344 serves one row of storage elements SSS 0.0-SSS 0.N 216a, 218a, 220a, a second bank interleave controller 344 serves a second row of storage elements SSS 1.0-SSS 1.N 216b, 218b, 220b, etc.

FIG. 4B is a schematic block diagram illustrating an alternate embodiment 401 of a bank interleave controller in the solid-state storage controller in accordance with the present invention. The components 210, 212, 340, 346, 348, 350, 402-430 depicted in the embodiment shown in FIG. 4B are substantially similar to the bank interleave apparatus 400 described in relation to FIG. 4A except that each bank 214 includes a single queue 432a-n and the read commands, write commands, erase commands, management commands, etc. for a bank (e.g. Bank-0 214a) are directed to a single queue 432a for the bank 214a. The queues 432, in one embodiment, are FIFO. In another embodiment, the queues 432 can have commands pulled from the queues 432 in an order other than the order they were stored. In another alternate embodiment (not shown), the read agent 402, write agent 404, erase agent 406, and management agent 408 may be combined into a single agent assigning commands to the appropriate queues 432a-n.

In another alternate embodiment (not shown), commands are stored in a single queue where the commands may be pulled from the queue in an order other than how they are stored so that the bank interleave controller 344 can execute a command on one bank 214a while other commands are executing on the remaining banks 214b-n. One of skill in the art will easily recognize other queue configurations and types to enable execution of a command on one bank 214a while other commands are executing on other banks 214b-n.

Storage-Specific Components

The solid-state storage controller 104 includes a synchronization buffer 346 that buffers commands and status messages sent and received from the solid-state storage 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In the preferred embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage 110 and status messages received from the solid-state storage 110 based on the type of solid-state storage 110. For example, the storage bus controller 348 may have different timing requirements for different types of storage, storage with different performance characteristics, storage from different manufacturers, etc. The storage bus controller 348 also sends control commands to the storage control bus 212.

In the preferred embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage 110 via the storage I/O bus 210 and routes data and status messages from the solid-state storage 110 via the storage I/O bus 210 to the read data pipeline 106 and the control and status registers 340 through the storage bus controller 348, synchronization buffer 346, and bank interleave controller 344.

In the preferred embodiment, the solid-state storage controller 104 includes a MUX 350 for each row of solid-state storage elements (e.g. SSS 0.1 216a, SSS 0.2 218a, SSS 0.N 220a). A MUX 350 combines data from the write data pipeline 106 and commands sent to the solid-state storage 110 via the storage I/O bus 210 and separates data to be processed by the read data pipeline 108 from commands. Packets stored in the write buffer 320 are directed on busses out of the write buffer 320 through a write synchronization buffer 308 for each row of solid-state storage elements (SSS x.0 to SSS x.N 216, 218, 220) to the MUX 350 for each row of solid-state storage elements (SSS x.0 to SSS x.N 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage 110 with an array of twenty storage elements (e.g. SSS 0.0 to SSS M.0 216) per block 214a may have a logical address for a particular erase block mapped to twenty physical addresses of the erase block, one physical address per storage element. Because the storage elements are accessed in parallel, erase blocks at the same position in each storage element in a row of storage elements 216a, 218a, 220a will share a physical address. To select one erase block (e.g. in storage element SSS 0.0 216a) instead of all erase blocks in the row (e.g. in storage elements SSS 0.0, 0.1, . . . 0.N 216a, 218a, 220a), one bank (in this case bank-0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 1.0 216b, . . . , and to storage element M.0 216m, virtual erase block 2 may be mapped to erase block 2 of storage element SSS 0.1 218a, to erase block 2 of storage element SSS 1.1 218b, . . . , and to storage element M.1 218m, etc.

If erase block 1 of a storage element SSS0.0 216a is damaged, experiencing errors due to wear, etc., or cannot be used for some reason, the remapping module could change the logical-to-physical mapping for the logical address that pointed to erase block 1 of virtual erase block 1. If a spare erase block (call it erase block 221) of storage element SSS 0.0 216a is available and currently not mapped, the remapping module could change the mapping of virtual erase block 1 to point to erase block 221 of storage element SSS 0.0 216a, while continuing to point to erase block 1 of storage element SSS 1.0 216b, erase block 1 of storage element SSS 2.0 (not shown) . . . , and to storage element M.0 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage 110 and sends the status messages to the status MUX 422. In another embodiment, when the solid-state storage 110 is flash memory, the storage bus controller 348 includes a NAND bus controller 428. The NAND bus controller 428 directs commands from the read and write data pipelines 106, 108 to the correct location in the solid-state storage 110, coordinates timing of command execution based on characteristics of the flash memory, etc. If the solid-state storage 110 is another solid-state storage type, the NAND bus controller 428 would be replaced by a bus controller specific to the storage type. One of skill in the art will recognize other functions of a NAND bus controller 428.

Flow Charts

Figure 5A:
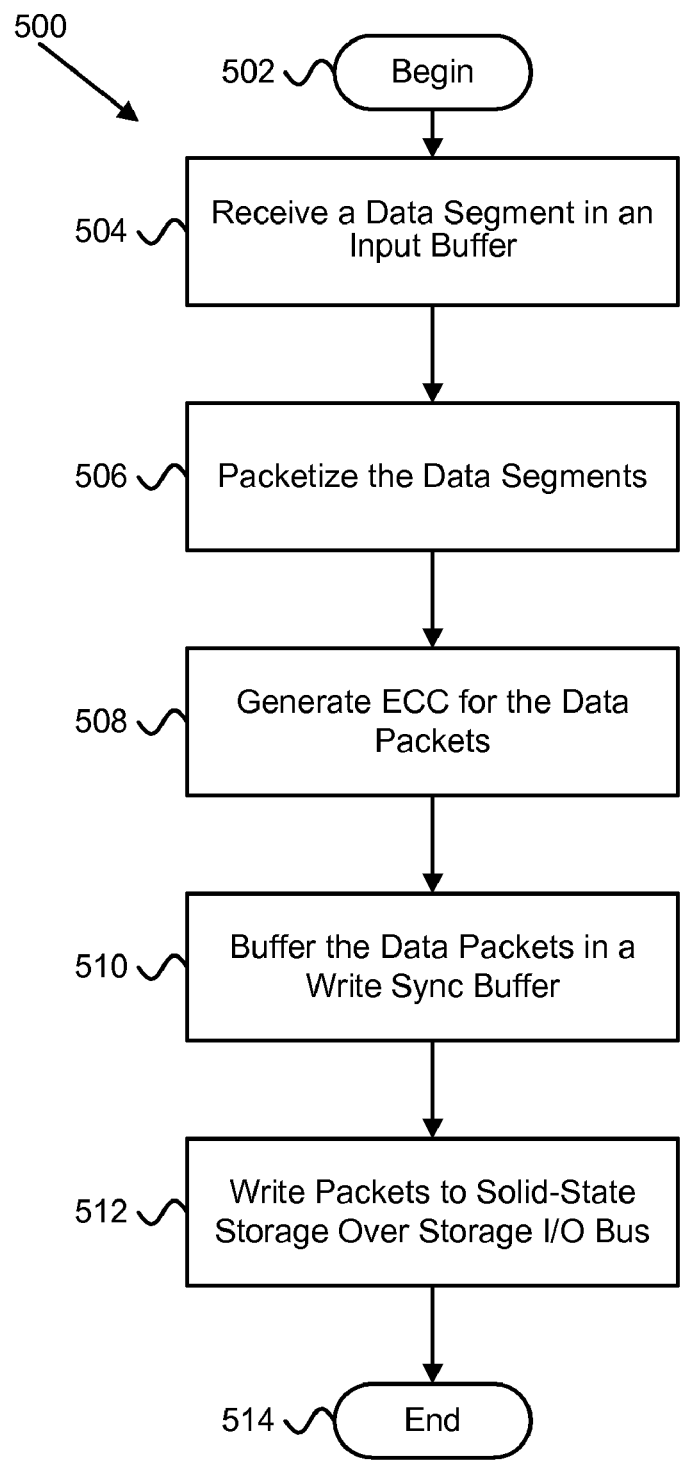
FIG. 5A is a schematic flow chart diagram illustrating one embodiment of a method for managing data in a solid-state storage device using a data pipeline in accordance with the present invention.

FIG. 5A is a schematic flow chart diagram illustrating one embodiment of a method 500 for managing data in a solid-state storage device 102 using a data pipeline in accordance with the present invention. The method 500 begins 502 and the input buffer 306 receives 504 one or more data segments to be written to the solid-state storage 110. The one or more data segments typically include at least a portion of an object but may be an entire object. The packetizer 302 may create one or more object specific packets in conjunction with an object. The packetizer 302 adds a header to each packet which typically includes the length of the packet and a sequence number for the packet within the object. The packetizer 302 receives 504 the one or more data or metadata segments that were stored in the input buffer 306 and packetizes 506 the one or more data or metadata segments by creating one or more packets sized for the solid-state storage 110 where each packet includes one header and data from the one or more segments.

Typically, a first packet includes an object identifier that identifies the object for which the packet was created. A second packet may include a header with information used by the solid-state storage device 102 to associate the second packet to the object identified in the first packet and offset information locating the second packet within the object, and data. The solid-state storage device controller 202 manages the bank 214 and physical area to which the packets are streamed.

The ECC generator 304 receives a packet from the packetizer 302 and generates 508 ECC for the data packets. Typically, there is no fixed relationship between packets and ECC blocks. An ECC block may comprise one or more packets. A packet may comprise one or more ECC blocks. A packet may start and end anywhere within an ECC block. A packet may start anywhere in a first ECC block and end anywhere in a subsequent ECC block.

The write synchronization buffer 308 buffers 510 the packets as distributed within the corresponding ECC blocks prior to writing ECC blocks to the solid-state storage 110 and then the solid-state storage controller 104 writes 512 the data at an appropriate time considering clock domain differences, and the method 500 ends 514. The write synch buffer 308 is located at the boundary between a local clock domain and a solid-state storage 110 clock domain. Note that the method 500 describes receiving one or more data segments and writing one or more data packets for convenience, but typically a stream of data segments is received and a group. Typically a number of ECC blocks comprising a complete virtual page of solid-state storage 110 are written to the solid-state storage 110. Typically the packetizer 302 receives data segments of one size and generates packets of another size. This necessarily requires data or metadata segments or parts of data or metadata segments to be combined to form data packets to capture all of the data of the segments into packets.

Figure 5B:
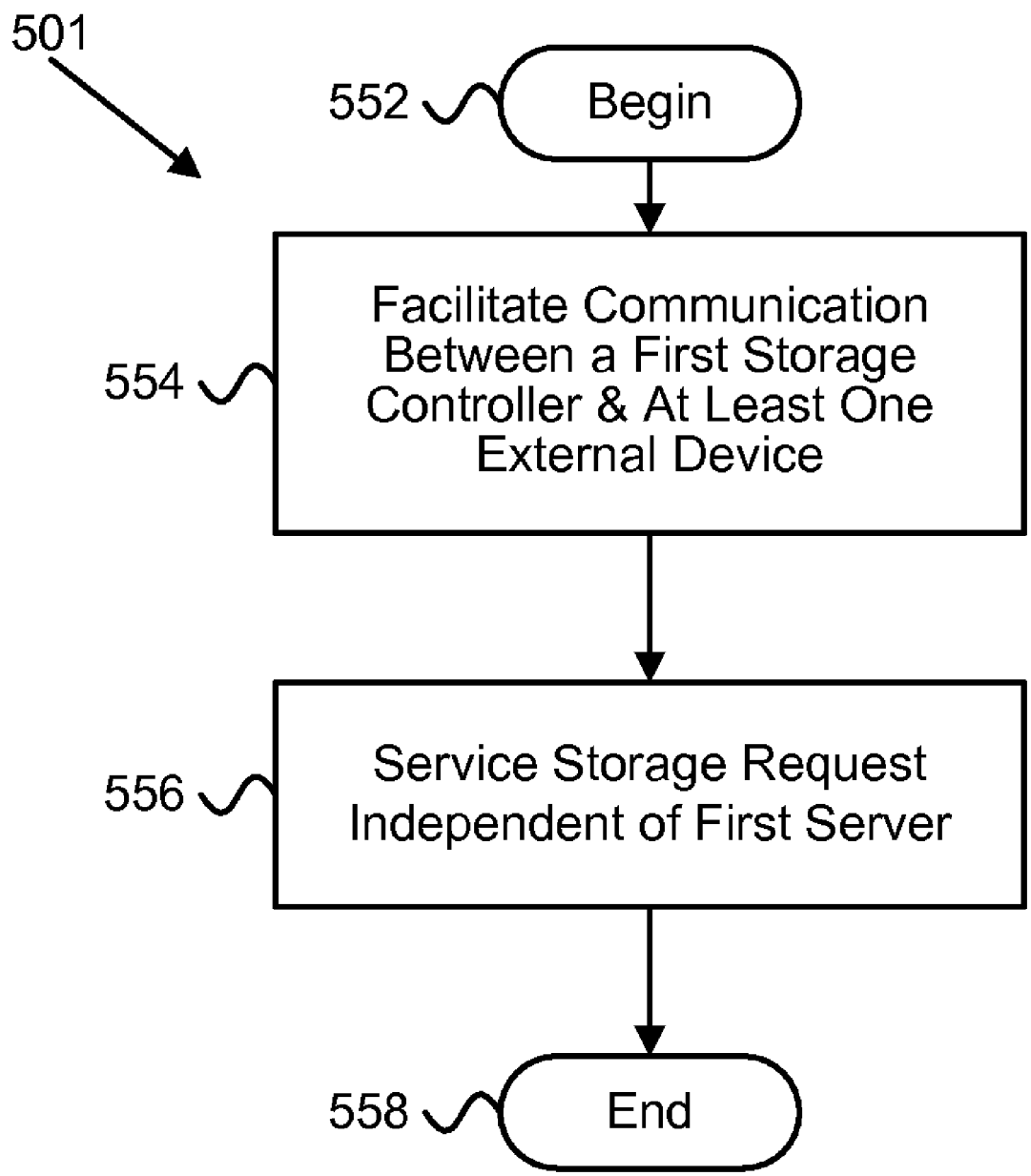
FIG. 5B is a schematic flow chart diagram illustrating one embodiment of a method for in-server SAN in accordance with the present invention.

FIG. 5B is a schematic flow chart diagram illustrating one embodiment of a method for in-server SAN in accordance with the present invention. The method 500 begins 552 and the storage communication module 162 facilitates 554 communication between a first storage controller 152a and at least one device external to the first server 112a. The communication between the first storage controller 152a and the external device is independent from the first server 112a. The first storage controller 112a is within the first server 112a and the first storage controller 152a controls at least one storage device 154a. The first server 112a includes a network interface 156a collocated with the first server 112a and the first storage controller 152a. The in-server SAN module 164 services 556 a storage request and the method 501 ends 558. The in-server SAN module services 556 the storage request using a network protocol and/or a bus protocol. The in-server SAN module 164 services 556 the storage request independent from the first server 112a and the service request is received from a client 114, 114a.

Figure 6:
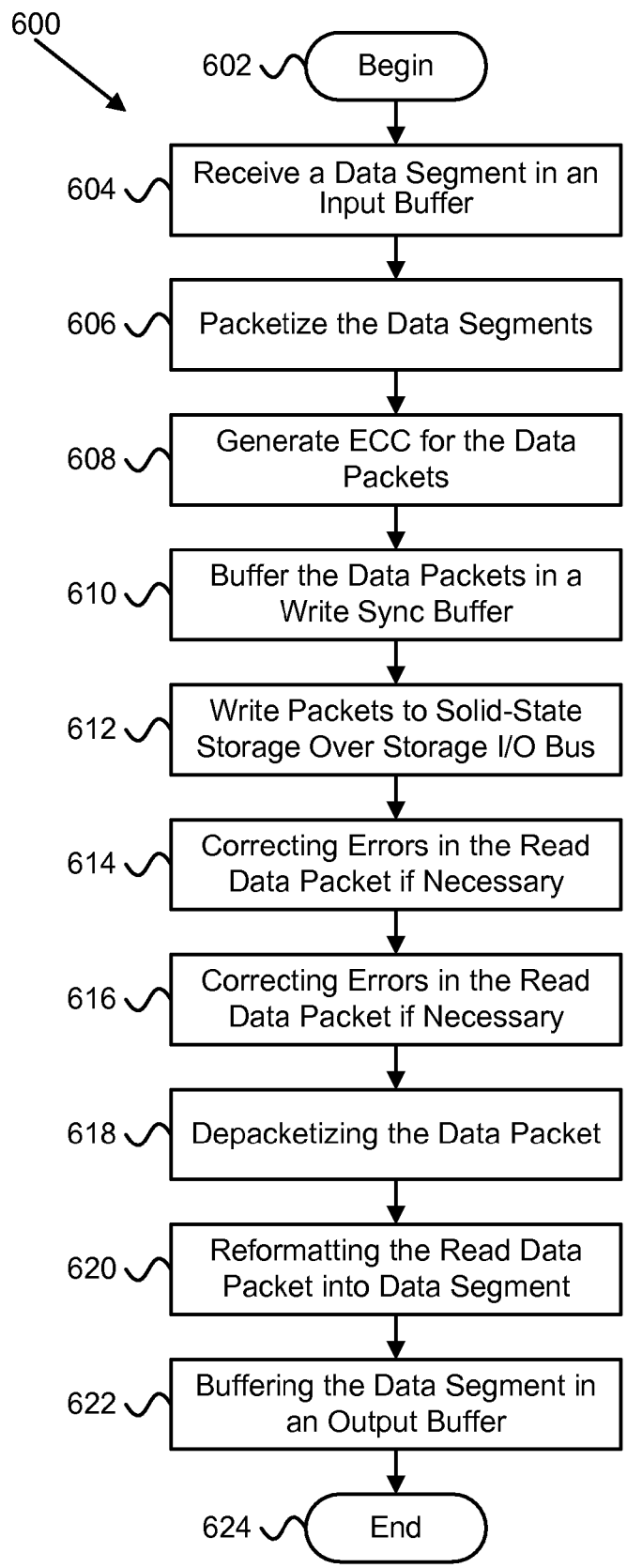
FIG. 6 is a schematic flow chart diagram illustrating another embodiment of a method for managing data in a solid-state storage device using a data pipeline in accordance with the present invention.

FIG. 6 is a schematic flow chart diagram illustrating another embodiment of a method 600 for managing data in a solid-state storage device 102 using a data pipeline in accordance with the present invention. The method 600 begins 602 and the input buffer 306 receives 604 one or more data or metadata segments to be written to the solid-state storage 110. The packetizer 302 adds a header to each packet which typically includes the length of the packet within the object. The packetizer 302 receives 604 the one or more segments that were stored in the input buffer 306 and packetizes 606 the one or more segments by creating one or more packets sized for the solid-state storage 110 where each packet includes a header and data from the one or more segments.

The ECC generator 304 receives a packet from the packetizer 302 and generates 608 one or more ECC blocks for the packets. The write synchronization buffer 308 buffers 610 the packets as distributed within the corresponding ECC blocks prior to writing ECC blocks to the solid-state storage 110 and then the solid-state storage controller 104 writes 612 the data at an appropriate time considering clock domain differences. When data is requested from the solid-state storage 110, ECC blocks comprising one or more data packets are read into the read synchronization buffer 328 and buffered 614. The ECC blocks of the packet are received over the storage I/O bus 210. Since the storage I/O bus 210 is bi-directional, when data is read, write operations, command operations, etc. are halted.

The ECC correction module 322 receives the ECC blocks of the requested packets held in the read synchronization buffer 328 and corrects 616 errors within each ECC block as necessary. If the ECC correction module 322 determines that one or more errors exist in an ECC block and the errors are correctable using the ECC syndrome, the ECC correction module 322 corrects 616 the error in the ECC block. If the ECC correction module 322 determines that a detected error is not correctable using the ECC, the ECC correction module 322 sends an interrupt.

The depacketizer 324 receives 618 the requested packet after the ECC correction module 322 corrects any errors and depacketizes 618 the packets by checking and removing the packet header of each packet. The alignment module 326 receives packets after depacketizing, removes unwanted data, and re-formats 620 the data packets as data or metadata segments of an object in a form compatible with the device requesting the segment or object. The output buffer 330 receives requested packets after depacketizing and buffers 622 the packets prior to transmission to the requesting device, and the method 600 ends 624.

Figure 7:
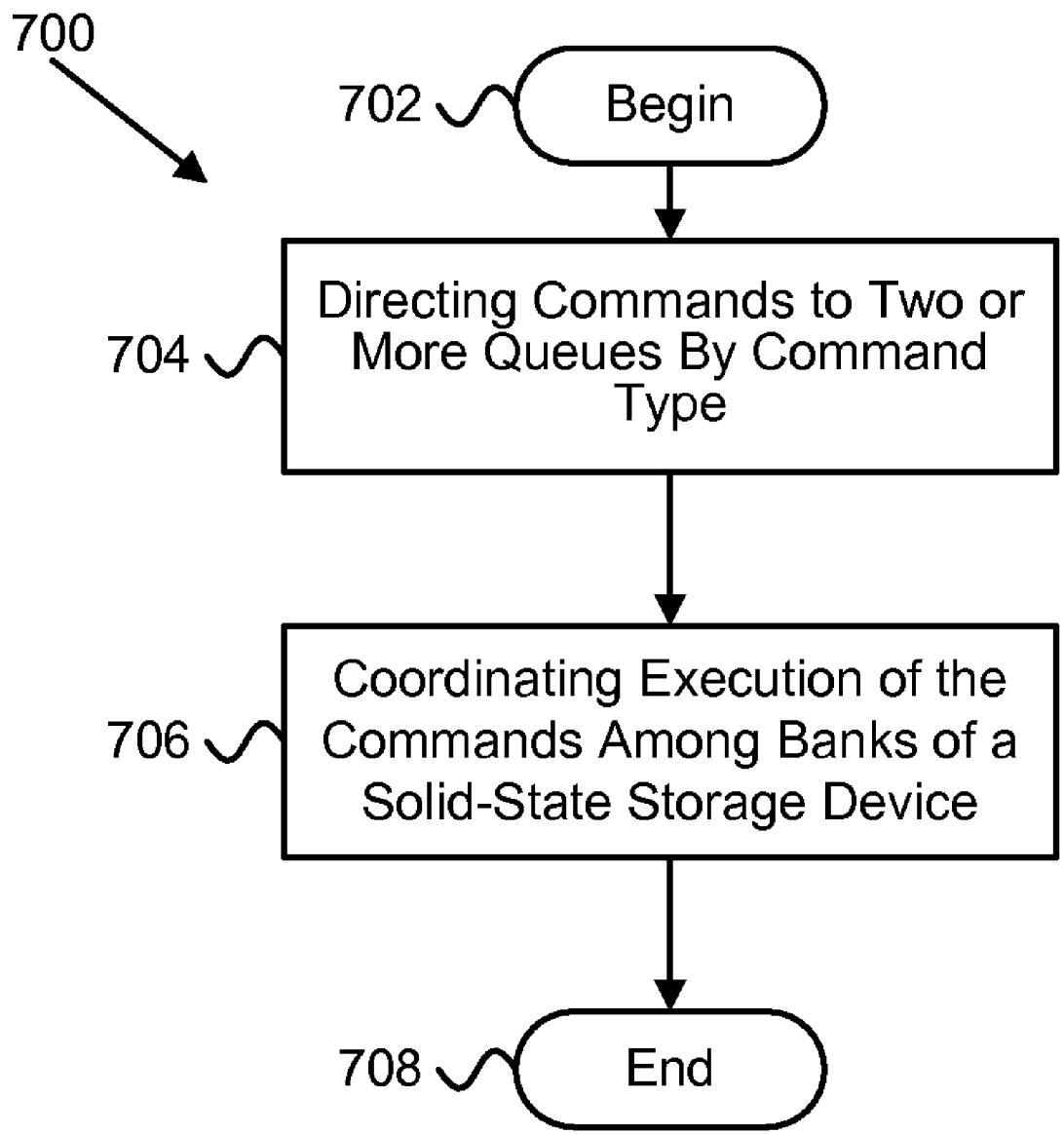
FIG. 7 is a schematic flow chart diagram illustrating an embodiment of a method for managing data in a solid-state storage device using a bank interleave in accordance with the present invention.

FIG. 7 is a schematic flow chart diagram illustrating an embodiment of a method 700 for managing data in a solid-state storage device 102 using a bank interleave in accordance with the present invention. The method 600 begins 602 and the bank interleave controller 344 directs 604 one or more commands to two or more queues 410, 412, 414, 416. Typically the agents 402, 404, 406, 408 direct 604 the commands to the queues 410, 412, 414, 416 by command type. Each set of queues 410, 412, 414, 416 includes a queue for each command type. The bank interleave controller 344 coordinates 606 among the banks 214 execution of the commands stored in the queues 410, 412, 414, 416 so that a command of a first type executes on one bank 214a while a command of a second type executes on a second bank 214b, and the method 600 ends 608.

Storage Space Recovery

Figure 8:
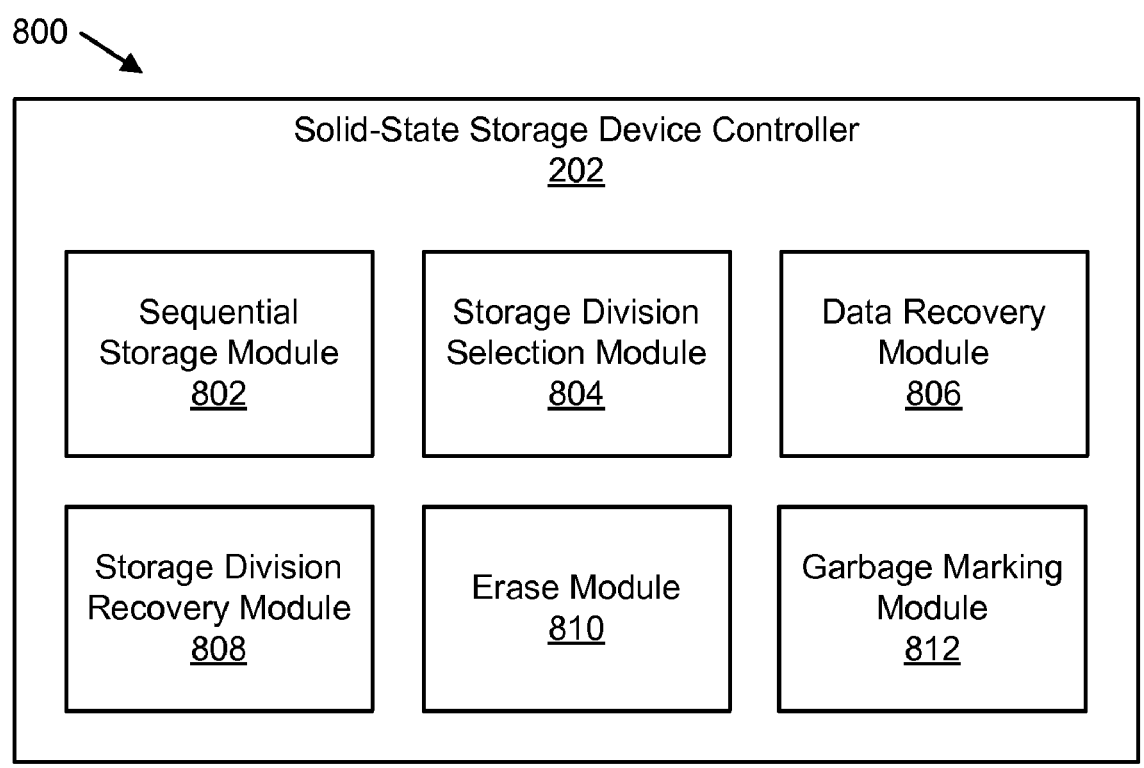
FIG. 8 is a schematic block diagram illustrating one embodiment of an apparatus for garbage collection in a solid-state storage device in accordance with the present invention.

FIG. 8 is a schematic block diagram illustrating one embodiment of an apparatus 800 for garbage collection in a solid-state storage device 102 in accordance with the present invention. The apparatus 800 includes a sequential storage module 802, a storage division selection module 804, a data recovery module 806, and a storage division recovery module 808, which are described below. In other embodiments, the apparatus 800 includes a garbage marking module 810 and an erase module 812.

The apparatus 800 includes a sequential storage module 802 that sequentially writes data packets in a page within a storage division. The packets are sequentially stored whether they are new packets or modified packets. Modified packets are in this embodiment are typically not written back to a location where they were previously stored. In one embodiment, the sequential storage module 802 writes a packet to a first location in a page of a storage division, then to the next location in the page, and to the next, and the next, until the page is filled. The sequential storage module 802 then starts to fill the next page in the storage division. This continues until the storage division is filled.

In a preferred embodiment, the sequential storage module 802 starts writing packets to storage write buffers in the storage elements (e.g. SSS 0.0 to SSS M.0 216) of a bank (bank-0 214a). When the storage write buffers are full, the solid-state storage controller 104 causes the data in the storage write buffers to be programmed into designated pages within the storage elements 216 of the bank 214a. Then another bank (e.g. bank-1 214b) is selected and the sequential storage module 802 starts writing packets to storage write buffers of the storage elements 218 of the bank 214b while the first bank-0 is programming the designated pages. When the storage write buffers of this bank 214b are full, the contents of the storage write buffers are programmed into another designated page in each storage element 218. This process is efficient because while one bank 214a is programming a page, storage write buffers of another bank 214b can be filling.

The storage division includes a portion of a solid-state storage 110 in a solid-state storage device 102. Typically the storage division is an erase block. For flash memory, an erase operation on an erase block writes ones to every bit in the erase block by charging each cell. This is a lengthy process compared to a program operation which starts with a location being all ones, and as data is written, some bits are changed to zero by discharging the cells written with a zero. However, where the solid-state storage 110 is not flash memory or has flash memory where an erase cycle takes a similar amount of time as other operations, such as a read or a program, the storage division may not be required to be erased.

As used herein, a storage division is equivalent in area to an erase block but may or may not be erased. Where erase block is used herein, an erase block may refer to a particular area of a designated size within a storage element (e.g. SSS 0.0 216a) and typically includes a certain quantity of pages. Where "erase block" is used in conjunction with flash memory, it is typically a storage division that is erased prior to being written. Where "erase block" is used with "solid-state storage," it may or may not be erased. As used herein, an erase block may include one erase block or a group of erase blocks with one erase block in each of a row of storage elements (e.g. SSS 0.0 to SSS M.0 216*a-n*), which may also be referred to herein as a virtual erase block. When referring to the logical construct associated with the virtual erase block, the erase blocks may be referred to herein as a logical erase block ("LEB").

Typically, the packets are sequentially stored by order of processing. In one embodiment, where a write data pipeline 106 is used, the sequential storage module 802 stores packets in the order that they come out of the write data pipeline 106. This order may be a result of data segments arriving from a requesting device 155 mixed with packets of valid data that are being read from another storage division as valid data is being recovered from a storage division during a recovery operation as explained below. Re-routing recovered, valid data packets to the write data pipeline 106 may include the garbage collector bypass 316 as described above in relation to the solid-state storage controller 104 of FIG. 3.

The apparatus 800 includes a storage division selection module 804 that selects a storage division for recovery. Selecting a storage division for recovery may be to reuse the storage division by the sequential storage module 802 for writing data, thus adding the recovered storage division to the storage pool, or to recover valid data from the storage division after determining that the storage division is failing, unreliable, should be refreshed, or other reason to take the storage division temporarily or permanently out of the storage pool. In another embodiment, the storage division selection module 804 selects a storage division for recovery by identifying a storage division or erase block with a high amount of invalid data.

In another embodiment, the storage division selection module 804 selects a storage division for recovery by identifying a storage division or erase block with a low amount of wear. For example, identifying a storage division or erase block with a low amount of wear may include identifying a storage division with a low amount of invalid data, a low number of erase cycles, low bit error rate, or low program count (low number of times a page of data in a buffer is written to a page in the storage division; program count may be measured from when the device was manufactured, from when the storage division was last erased, from other arbitrary events, and from combinations of these). The storage division selection module 804 may also use any combination of the above or other parameters to determine a storage division with a low amount of wear. Selecting a storage division for recovery by determining a storage division with a low amount of wear may be desirable to find storage divisions that are under used, may be recovered for wear leveling, etc.

In another embodiment, the storage division selection module 804 selects a storage division for recovery by identifying a storage division or erase block with a high amount of wear. For example, identifying a storage division or erase block with a high amount of wear may include identifying a storage division with a high number of erase cycles, high bit error rate, a storage division with a non-recoverable ECC block, or high program count. The storage division selection module 804 may also use any combination of the above or other parameters to determine a storage division with a high amount of wear. Selecting a storage division for recovery by determining a storage division with a high amount of wear may be desirable to find storage divisions that are over used, may be recovered by refreshing the storage division using an erase cycle, etc. or to retire the storage division from service as being unusable.

The apparatus 800 includes a data recovery module 806 that reads valid data packets from the storage division selected for recovery, queues the valid data packets with other data packets to be written sequentially by the sequential storage module 802, and updates an index with a new physical address of the valid data written by the sequential storage module 802. Typically, the index is the object index mapping data object identifiers of objects to physical addresses of where packets derived from the data object are stored in the solid-state storage 110.

In one embodiment the apparatus 800 includes a storage division recovery module 808 that prepares the storage division for use or reuse and marks the storage division as available to the sequential storage module 802 for sequentially writing data packets after the data recovery module 806 has completed copying valid data from the storage division. In another embodiment, the apparatus 800 includes a storage division recovery module 808 that marks the storage division selected for recovery as unavailable for storing data. Typically this is due to the storage division selection module 804 identifying a storage division or erase block with a high amount of wear such that the storage division or erase block is not in condition to be used for reliable data storage.

In one embodiment, the apparatus 800 is in a solid-state storage device controller 202 of a solid-state storage device 102. In another embodiment, the apparatus 800 controls a solid-state storage device controller 202. In another embodiment, a portion of the apparatus 800 is in a solid-state storage device controller 202. In another embodiment, the object index updated by the data recovery module 806 is also located in the solid-state storage device controller 202

In one embodiment, the storage division is an erase block and the apparatus 800 includes an erase module 810 that erases an erase block selected for recovery after the data recovery module 806 has copied valid data packets from the selected erase block and before the storage division recovery module 808 marks the erase block as available. For flash memory and other solid-state storage with an erase operation taking much longer than read or write operations, erasing a data block prior to making it available for writing new data is desirable for efficient operation. Where the solid-state storage 110 is arranged in banks 214, the erase operation by the erase module 810 may be executed on one bank while other banks are executing reads, writes, or other operations.

In one embodiment, the apparatus 800 includes a garbage marking module 812 that identifies a data packet in a storage division as invalid in response to an operation indicating that the data packet is no longer valid. For example, if a data packet is deleted, the garbage marking module 812 may identify the data packet as invalid. A read-modify-write operation is another way for a data packet to be identified as invalid. In one embodiment, the garbage marking module 812 may identify the data packet as invalid by updating an index. In another embodiment, the garbage marking module 812 may identify the data packet as invalid by storing another data packet that indicates that the invalid data packet has been deleted. This is advantageous because storing, in the solid-state storage 110, information that the data packet has been deleted allows the object index reconstruction module 262 or similar module to reconstruct the object index with an entry indicating that the invalid data packet has been deleted.

In one embodiment, the apparatus 800 may be utilized to fill the remainder of a virtual page of data following a flush command in order to improve overall performance, where the flush command halts data flowing into the write pipeline 106 until the write pipeline 106 empties and all packets have been permanently written into non-volatile solid-state storage 110.

This has the benefit of reducing the amount of garbage collection required, the amount of time used to erase storage divisions, and the amount of time required to program virtual pages. For example, a flush command may be received when only one small packet is prepared for writing into the virtual page of the solid-state storage 100. Programming this nearly empty virtual page might result in a need to immediately recover the wasted space, causing the valid data within the storage division to be unnecessarily garbage collected and the storage division erased, recovered and returned to the pool of available space for writing by the sequential storage module 802.

Marking the data packet as invalid rather than actually erasing an invalid data packet is efficient because, as mentioned above, for flash memory and other similar storage an erase operation takes a significant amount of time. Allowing a garbage collection system, as described in the apparatus 800, to operate autonomously within the solid-state storage 110 provides a way to separate erase operations from reads, writes, and other faster operations so that the solid-state storage device 102 can operate much faster than many other solid-state storage systems or data storage devices.

Figure 9:
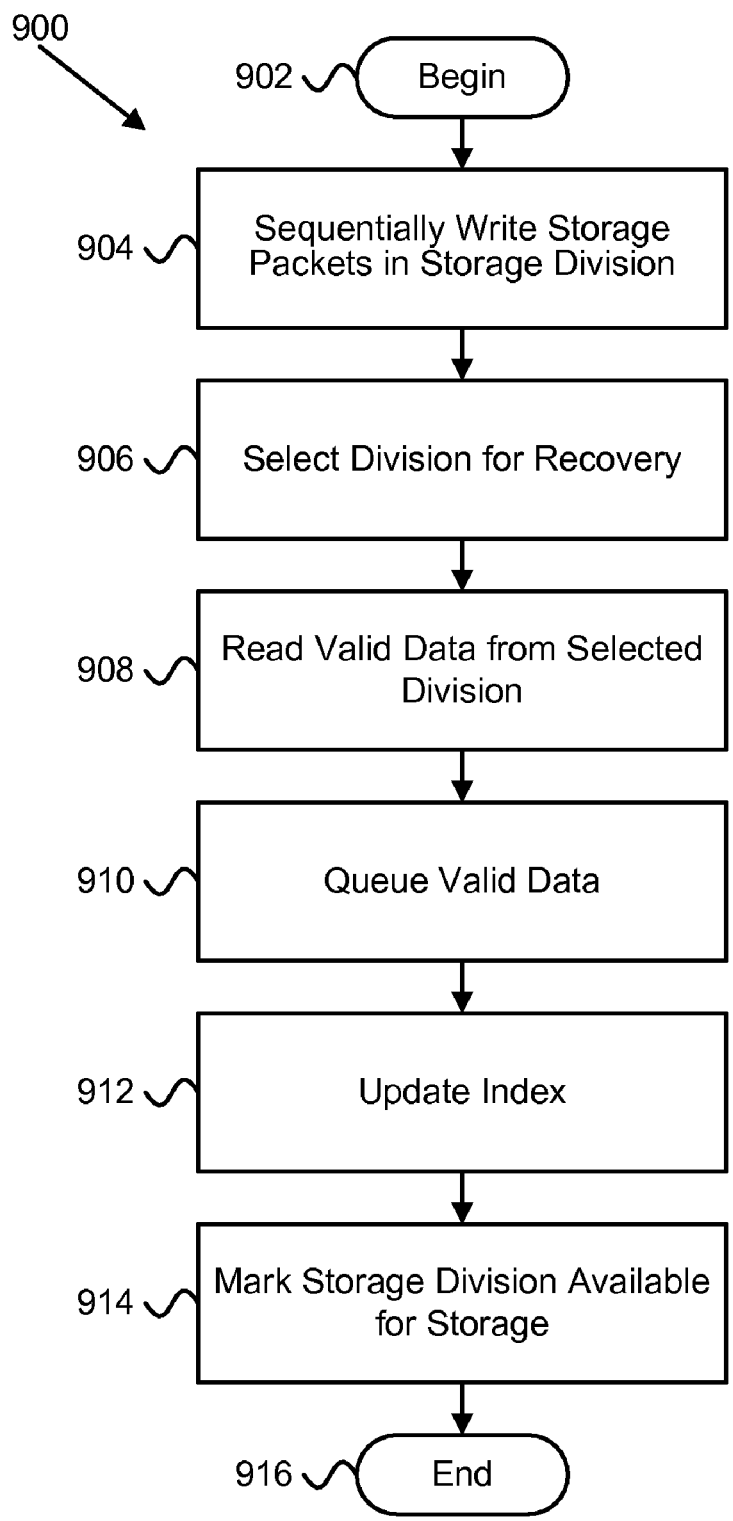
FIG. 9 is a schematic flow chart diagram illustrating one embodiment of a method for garbage collection in a solid state storage device in accordance with the present invention.

FIG. 9 is a schematic flow chart diagram illustrating an embodiment of a method 900 for storage recovery in accordance with the present invention. The method 900 begins 902 and the sequential storage module 802 sequentially writes 904 data packets in a storage division. The storage division is a portion of a solid-state storage 110 in a solid-state storage device 102. Typically a storage division is an erase block. The data packets are derived from an object and the data packets are sequentially stored by order of processing.

The storage division selection module 804 selects 906 a storage division for recovery and the data recovery module 806 reads 908 valid data packets from the storage division selected for recovery. Typically valid data packets are data packets that have not been marked for erasure or deletion or some other invalid data marking and are considered valid or "good" data. The data recovery module 806 queues 910 the valid data packets with other data packets scheduled to be written sequentially by the sequential storage module 802. The data recovery module 806 updates 912 an index with a new physical address of the valid data written by the sequential storage module 802. The index includes a mapping of physical addresses of data packets to object identifiers. The data packets are those stored in stored in the solid-state storage 110 and the object identifiers correspond to the data packets.

After the data recovery module 806 completes copying valid data from the storage division, the storage division recovery module 808 marks 914 the storage division selected for recovery as available to the sequential storage module 802 for sequentially writing data packets and the method 900 ends 916.

Empty Data Segment Directive

Typically, when data is no longer useful it may be erased. In many file systems, an erase command deletes a directory entry in the file system while leaving the data in place in the storage device containing the data. Typically, a data storage device is not involved in this type of erase operation. Another method of erasing data is to write zeros, ones, or some other null data character to the data storage device to actually replace the erased file. However, this is inefficient because valuable bandwidth is used while transmitting the data is being overwritten. In addition, space in the storage device is taken up by the data used to overwrite invalid data.

Some storage devices, like the solid-state storage device 102 described herein, are not random access storage devices so updating previously stored data does not overwrite existing data. Attempting to overwrite data with a string of ones or a string of zeros on such a device takes up valuable space without fulfilling the desired intent of overwriting the existing data. For these non-random access devices, such as solid-state storage devices 102, a client 114 typically does not have an ability to overwrite data to erase it.

When receiving a string of repeated characters or character strings, the received data is highly compressible, but typically compression is done by a file system prior to transmission to a storage device. A typical storage device cannot distinguish between compressed data and uncompressed data. The storage device may also receive a command to read the erased file so the storage device may transmit a stream of zeros, ones, or a null character to the requesting device. Again, bandwidth is required to transmit data representing the erased file.

From the foregoing discussion, it should be apparent that a need exists for an apparatus, system, and method for a storage device to receive a directive that data is to be erased so that the storage device can store a data segment token that represents an empty data segment or data with repeated characters or character strings. The apparatus, system, and method may also erase the existing data so that the resulting used storage space comprises the small data segment token. An apparatus, system, and method are presented that overcome some or all of the shortcomings of the prior art.

Figure 10:
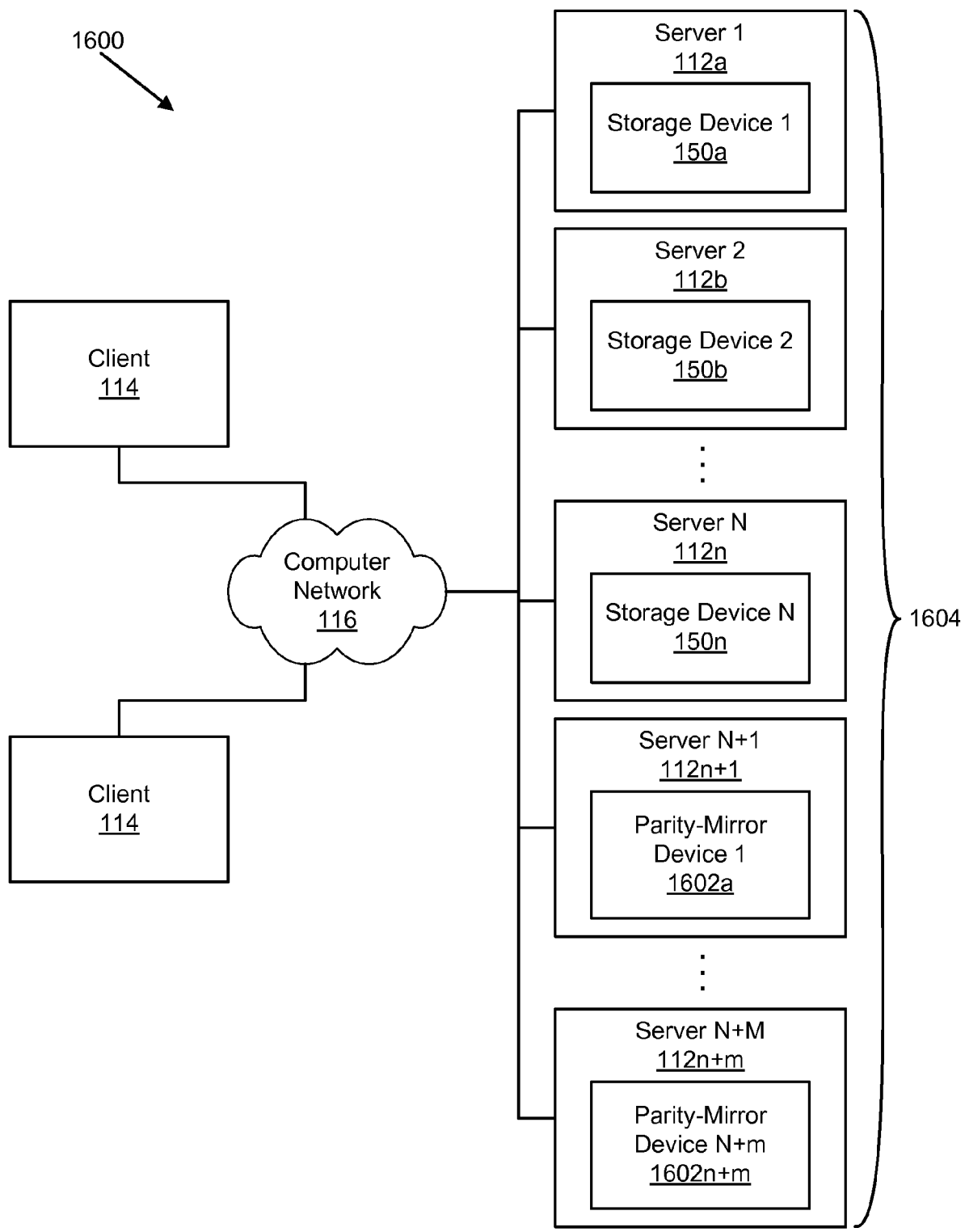
FIG. 10 is a schematic block diagram illustrating one embodiment of a system for progressive RAID, front-end distributed RAID, and shared, front-end distributed RAID in accordance with the present inventions.

FIG. 10 is a schematic block diagram illustrating one embodiment of a system 1000 with an apparatus for generating a token directive in accordance with the present invention. The apparatus includes a token directive generation module 1002, a token directive transmission module 1004, a read receiver module 1006, a read request transmission module 1008, a read token directive receiver module 1010, a requesting client response module 1012, and data segment regeneration module 1014, which are described below. In one embodiment, the apparatus is in a server 112 connected to a storage device 150 with a storage controller 152 and a data storage device 154, which are substantially similar to those described above.

In one embodiment, the apparatus includes a token directive generation module 1002 that generates a storage request with a token directive. The token directive includes a request to store a data segment token on the storage device 150. The token directive is intended to be substituted for a series of repeated, identical characters or a series of repeated, identical character strings that would be sent to the storage device 150 and stored as a data segment if the data segment token was not sent in its place. In one embodiment, the series of repeated, identical characters indicate that the data segment is empty. For example, the series of repeated, identical characters may be zeros or ones and a data segment filled with zeros or ones may be interpreted as empty.

The token directive includes at least a data segment identifier and a data segment length. The data segment identifier is typically an object ID, file name, or other identifier known to a file system, application, server 112, etc. seeking to store the repeated, identical characters or character string on the storage device. The data segment length is typically the storage space required by the series of repeated, identical characters or character strings. The data segment token and the token directive typically do not include data of the data segment, such as the series of repeated, identical characters.

The token directive may, however, include other pertinent information for forming the data segment token, such as at least one instance of the repeated, identical character or character string. The token directive may also include metadata, such as a data segment location, an address from a file system, location on a data storage device corresponding to the data segment, etc. One of skill in the art will recognize other information that may be included with a token directive. In one embodiment, the directive generation module 1002 generates a data segment token along with the token directive.

In one embodiment, the token directive generation module 1002 generates both a token directive and a secure erase command in response to a request to overwrite existing data on the storage device 150. The existing data includes data identified on the storage device with the same data segment identifier as the data segment identifier in the token directive. Typically, a request to overwrite data is sent where it is not sufficient to merely mark data as invalid or garbage, delete a pointer to the data, or other typical delete operation, but where the data is required to be overwritten in such a way that that the data is not recoverable. For example, the request to overwrite the data may be required where data is considered sensitive information and must be destroyed for security reasons.

The secure erase command directs the storage device 150 to overwrite existing data so that the existing data is non-recoverable. The storage device 150 then creates the data segment token as well as overwrites, recovers, erases, etc. the existing data. As a result, the existing data is non-recoverable and the data segment token is stored on the storage device 150, which typically takes much less storage space than the existing data.

In a further embodiment, the apparatus includes an erase confirmation module 1016 that receives a confirmation that the existing data on the storage device has been overwritten with characters so that the existing data is non-recoverable. The confirmation may be forwarded to a requesting device or client 114 and may be used to verify that the existing data has been put in a condition where it is non-recoverable. In other embodiments, the secure erase command may direct the storage device 150 to overwrite the existing data with a specific character or character string or the execute command may be executed multiple times. One of skill in the art will recognize other ways to configure one or more secure erase commands to ensure the existing data is non-recoverable.

Data may be encrypted and then stored on a storage device 150 where encryption is accomplished using an encryption key received by the storage device 150 in conjunction with storing the data. Where the existing data is encrypted with this received encryption key before being stored, in another embodiment the token directive generation module 1002 generates an encryption erase command along with generating a token directive in response to receiving a request to overwrite the existing data. The encryption erase command erases the encryption key used to store the existing data so that the encryption key is non-recoverable.

In one embodiment, erasing the encryption key includes erasing the encryption key from the requesting device. In another embodiment, erasing the encryption key includes erasing the encryption key from a server, key vault, or other location where the encryption key is stored. Erasing the encryption key may include replacing the encryption key with other data or with a series of characters so that the encryption key cannot be recovered in any way. Erasing the encryption key typically makes the existing data on the storage device 150 non-recoverable where an encryption routine was used to encrypt the existing data that is robust enough to thwart attempts to decrypt the existing data. The request to overwrite the existing data could be a secure erase directive where the data is overwritten for security reasons, a request to overwrite data to erase the data, a request that seeks to replace the existing data with the repeated, identical characters or character strings, or the like. In one embodiment, a secure erase directive causes devices to both securely erase the encryption key and securely erase the existing data. In one embodiment, erasure of the encryption key may allow secure erasure of the data on the storage device to be postponed until a garbage collection process erases the data as part of a storage space recovery process. One of skill in the art will recognize other ways to erase an encryption key and other ways to receive a request to overwrite existing data.

In one embodiment, a token directive includes the data segment token and the token directive transmission module 1004 transmits the data segment token with the token directive. In another embodiment, a token directive does not include the data segment token and includes a command for the storage device 150 to generate the data segment token. In this embodiment, the token directive transmission module 1004 transmits the token directive with the command to generate a data segment token, but does not transmit a data segment token.

The apparatus includes a token directive transmission module 1004 that transmits the token directive to the storage device 150. Typically, the token directive transmission module 1004 transmits the token directive as part of a storage request. The storage request may be in the form of an object request, a data request, or other form known to those of skill in the art. Where the token directive generation module 1002 generates a secure erase directive, the token directive transmission module 1004 transmits the secure erase directive to the storage device 150. Where the token directive generation module 1002 generates an erase encryption key command, the erase encryption key command is transmitted, where necessary, to another device to execute the command.

In one embodiment, the token directive transmission module 1004 transmits a token directive without a data segment token. In this embodiment, the token directive includes instructions and information for the storage device 150 to create a data segment token. In another embodiment, the token directive transmission module 1004 transmits a token directive that includes a data segment token. In this embodiment, the storage device 150 is capable of recognizing that the data segment token received with the token directive represents a data segment and takes appropriate action to store the data segment token such that the data segment token represents the data segment rather than merely storing the data segment token as ordinary data.

The apparatus, in a particular embodiment, includes a read receiver module 1006 that receives a storage request to read the data segment from the storage device 150 and a read request transmission module 1008 that transmits the storage request to the storage device 150. Typically, the storage request is received from a requesting client 114, such as an external client 114, a client 114 internal to the server 112, such as an application or file server running on the server 112, etc. One of skill in the art will recognize other devices and software functioning as a requesting client 114 from which the read receiver module 1006 can receive a storage request.

The storage request includes a request to read the data segment corresponding to the data segment token requested to be stored in the token directive transmitted to the storage device 150 by the token directive transmission module 1004. The requesting client 114, in one embodiment, is unaware that the data segment has been stored in the form of a data segment token. In another embodiment, the requesting device is aware that the data segment has been stored as a data segment token but is unaware of the information stored in the data segment token.

The apparatus, in the particular embodiment, also includes a read token directive receiver module 1010 that receives a message corresponding to the requested data segment token from the storage device, where the message includes at least the data segment identifier and the data segment length. The message typically does not include data of the data segment. The message may also include other information stored in the data segment token, such as a data segment location or the repeated, identical character or character string. In the particular embodiment, the apparatus includes a requesting client response module 1012 that transmits a response to the requesting client 113 formulated from the message received from the storage device 150.

In one embodiment, read token directive receiver module 1010 also receives in the message a confirmation that existing data has been overwritten with characters such that the existing data is non-recoverable, where the existing data has been previously stored on the storage device and referenced with the same data segment identifier from the data segment token received in the message. The confirmation may also be received from the storage device 150 independently from any storage request to read the data segment.

In another embodiment, where the requesting client 114 requires the data segment, the apparatus includes a data segment regeneration module 1014 that reconstitutes data of the data segment using information contained in the message. In this case, the response sent to the requesting client includes the reconstituted data segment. In another embodiment, the response sent to the requesting client includes information contained in the message received from the storage device 150. The requesting client 114 may then reconstitute the data segment or use the information in some other way. In another embodiment, the message includes the data segment token. The data segment token may be used by the data segment regeneration module 1014 to reconstitute the data segment before forwarding to the requesting client 114 or the requesting client response module 1012 may simply forward the data segment token.

In one embodiment, the storage request with the token directive also includes a request to reserve storage space on the storage device 150, where the requested reserved storage space is an amount of storage space that is about the same to the data segment length. In another embodiment, the request to reserve storage space is for an amount of storage space different than the data segment length. For example, if the storage device 150 is a solid-state storage device 102, the solid-state storage device 102 may be connected to a hard drive or other long-term, inexpensive storage while the solid-state storage 110 is configured as cache for the long-term storage. The request to reserve storage may cause the solid-state storage device 102 to flush a portion of the cache to the long-term storage in preparation for writing data to the solid-state storage device 102. One of skill in the art will recognize other situations were a request to reserve storage space is desired.

In one embodiment, an apparatus may be provided with a read receiver module 1006, a read request transmission module 1008, a read token directive receiver module 1010, and a requesting client response module 1012, which are substantially similar to those described above. In the embodiment, the modules 1006-1012 may be independent from an apparatus including a token generation module 1002 or a token directive transmission module 1004. In one embodiment, the apparatus includes a data segment regeneration module 1014, which is substantially similar to the data segment regeneration module 1014 described above.

Figure 11:
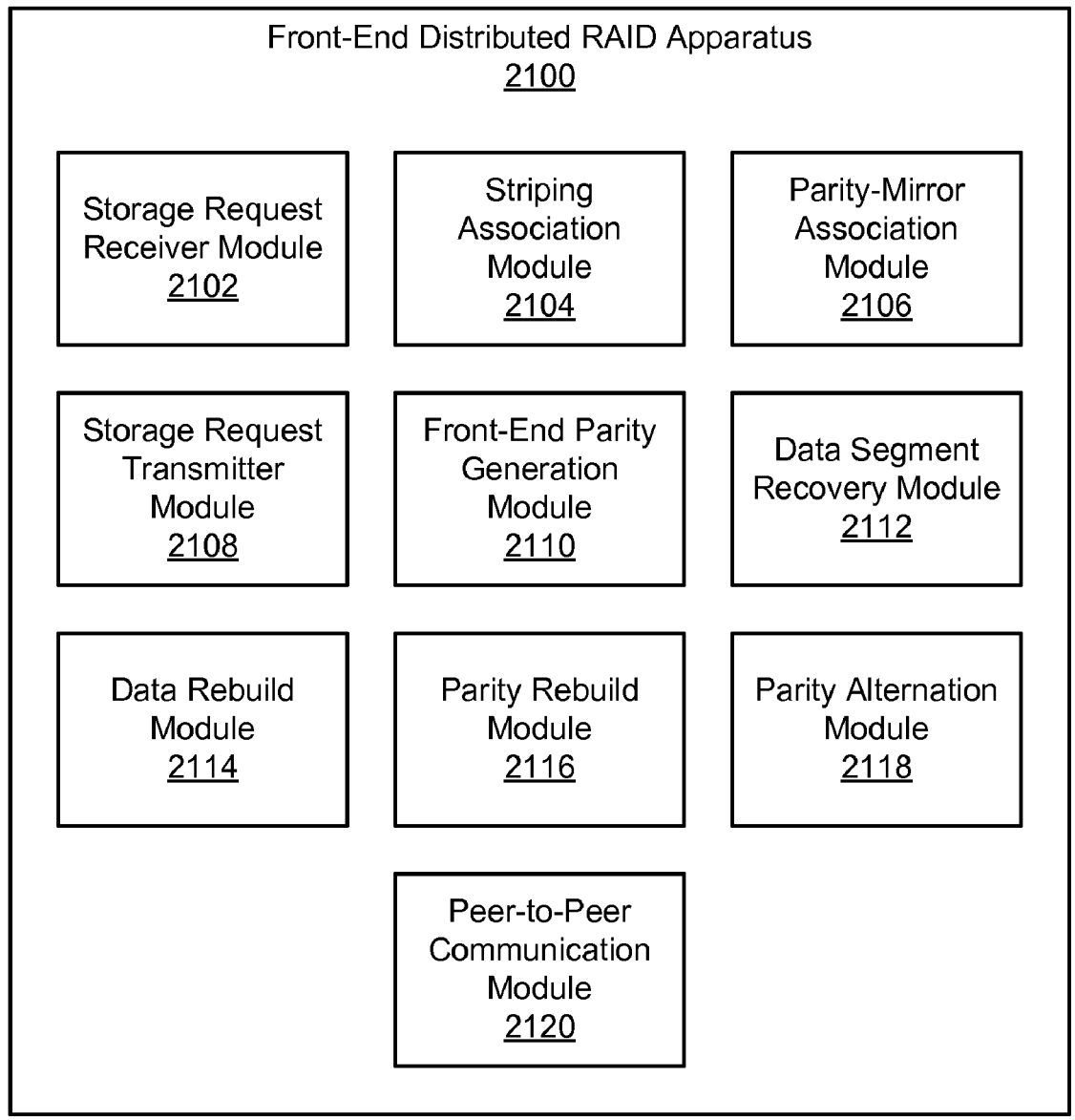
FIG. 11 is a schematic block diagram illustrating one embodiment of an apparatus for front-end distributed RAID in accordance with the present invention.

FIG. 11 is a schematic flow chart diagram illustrating an embodiment of a method 1100 for generating and transmitting a token directive in accordance with the present invention. The method 1100 begins 1102 and the token directive generation module 1002 generates 1104 a storage request with a token directive, where the token directive includes a request to store a data segment token on the storage device 150. The token directive transmission module 1004 transmits 1106 the token directive to the storage device 150 and the method 1100 ends 1108. In one embodiment, the storage request includes a token directive to store the data segment token where the storage request is essentially free from data of the data segment. In another embodiment, storage request includes data from the data segment. In a preferred embodiment, a software application creates a storage request using the token directive so as to avoid the creation of the data segment. In another embodiment, a software application requests the creation of the token directive.

Figure 12:
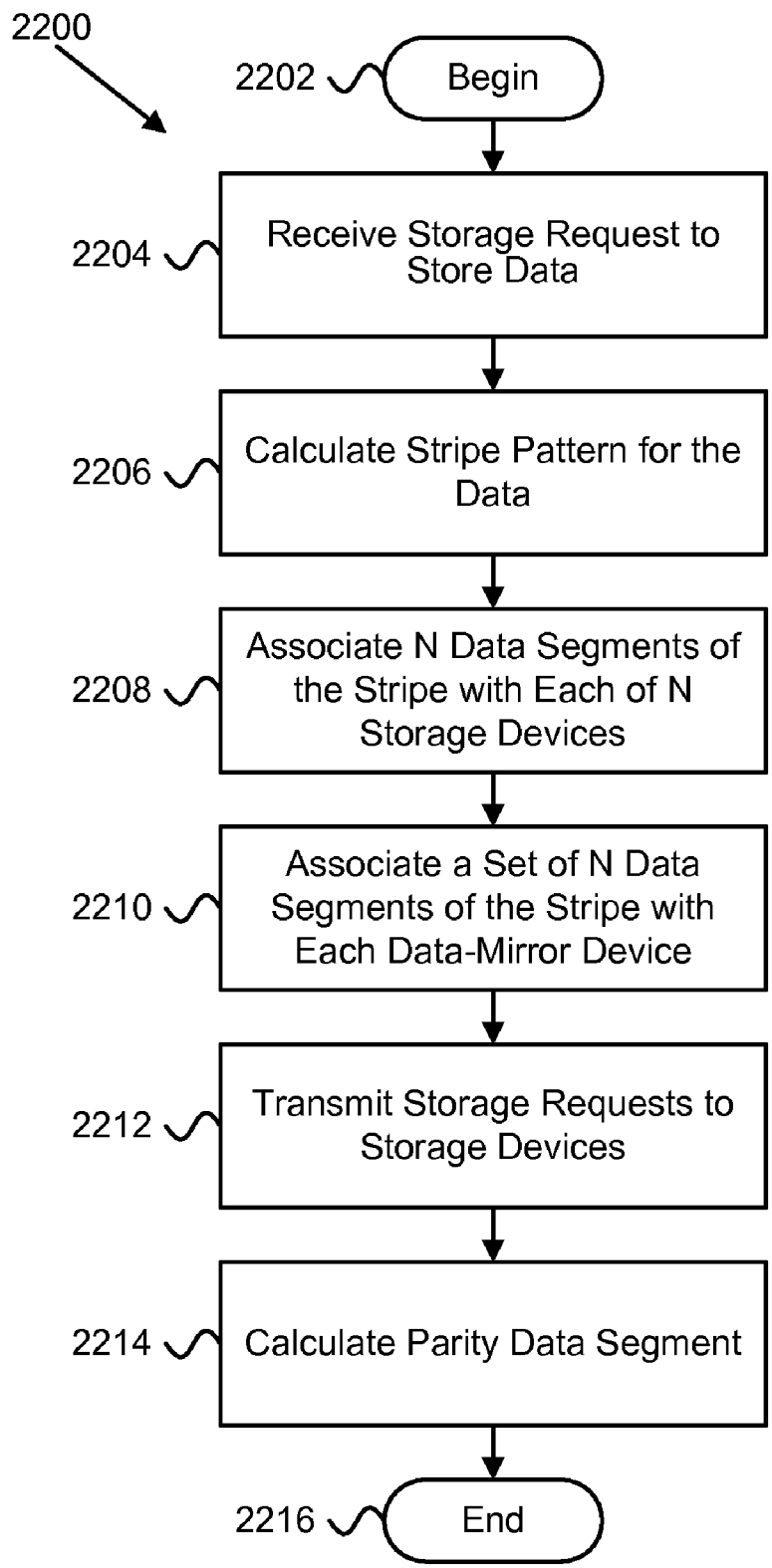
FIG. 12 is a schematic flow chart diagram illustrating an embodiment of a method for front-end distributed RAID in accordance with the present invention.

FIG. 12 is a schematic flow chart diagram illustrating an embodiment of a method 1200 for reading a data segment token in accordance with the present invention. The method 1200 begins 1202 and the read receiver module 1006 receives 1204 a storage request to read a data segment from a storage device 150 from a requesting client 114. The read request transmission module 1008 transmits 1206 the storage request to the storage device 150.

The read token directive receiver module 1008 receives 1208 a message corresponding to the requested data segment token from the storage device 150, where the message includes at least the data segment identifier and the data segment length. The message is substantially free from data of the data segment. The requesting client response module 1012 transmits 1210 a response to the requesting client formulated from the message received from the storage device 150 and the method 1200 ends 1212.

Figure 13:
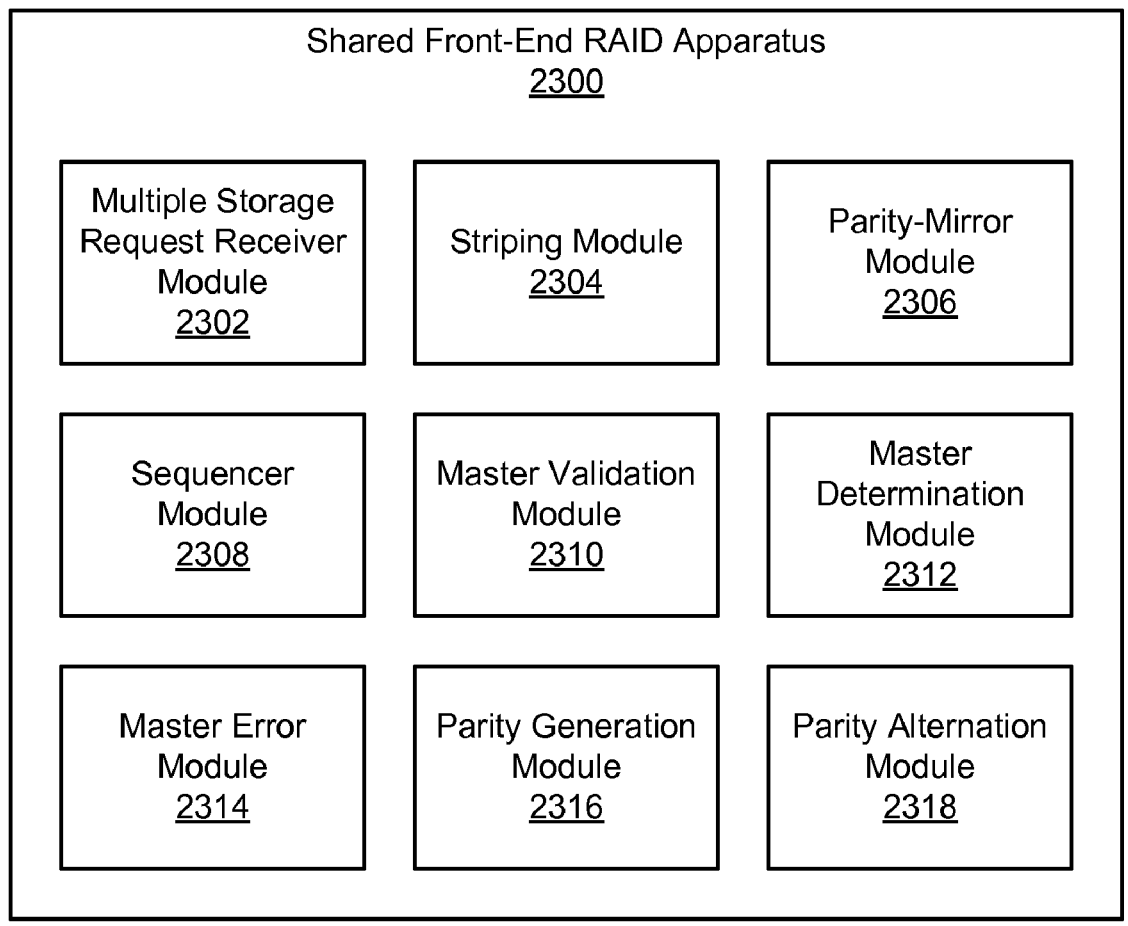
FIG. 13 is a schematic block diagram illustrating one embodiment of an apparatus for shared, front-end distributed RAID in accordance with the present invention.

FIG. 13 is a schematic block diagram illustrating one embodiment of a system 1300 with an apparatus for managing a data segment token in accordance with the present invention. The system 1300 includes an apparatus with a write request receiver module 1302 and a data segment token storage module 1304, and in various embodiments a token directive generation module 1306, a read request receiver module 1308, a read data segment token module 1310, a read request response module 1312 with a transmit data segment token module 1314 and a transmit data segment module 1316, a reconstitute data segment module 1318, a secure erase module 1320 with an erase confirmation module 1322, and a storage space reservation module 1324, which are described below. The system 1300 includes a storage device 150 with a storage controller 152 and a data storage device 154, which are substantially similar to those described above. The system 1300 includes a requesting device 1326, which is described below, in communication with the storage device 150.

In the depicted embodiment, the modules 1302-1324 are included in the storage device 150 or storage controller 152. In another embodiment, at least a portion of one or more of the modules 1302-1324 is located outside the storage device 150. In a further embodiment, the requesting device 1326 includes a portion of the modules 1302-1324 in the form of drivers, software, or other function of one or more of the modules 1302-1324. For example, a token generation module 1306 and a reconstitute data segment module 1318 are shown in the requesting device 1326. One of skill in the art will recognize other ways to distribute and implement the functionality of the modules 1302-1324.

The apparatus includes a write request receiver module 1302 that receives a storage request from the requesting device 1326, where the storage request includes a request to store a data segment in the storage device 150. The data segment includes a series of repeated, identical characters or character strings. Typically, the series of repeated, identical characters signify that the data segment is empty. This is especially true when the series of repeated, identical characters are ones or zeros. The apparatus includes a data segment token storage module 1304 that stores a data segment token in the storage device 150. The data segment token includes at least a data segment identifier and a data segment length. The data segment token is substantially free of the actual data from the data segment.

The data segment token may be stored in many forms. In one embodiment, includes an entry in an index, where the index corresponds to information and data stored on the storage device 150. For example, the index may be an object index as described above in relation to the apparatus 200 depicted in FIG. 2. The index may also be file system index, a block storage index, or other index known to those of skill in the art. In another embodiment, the data segment token includes or is in the form of metadata stored on the storage device 150. In another embodiment, the data segment token is stored as metadata on the storage device and includes an entry in an index. One of skill in the art will recognize other ways to storage a data segment token.

In one embodiment, the storage request includes a token directive to store the data segment token where the storage request is essentially free from data of the data segment. The token directive may include the data segment token or a command to generate a data segment token. Where the token directive does not include the data segment token, the data segment token storage module 1304 generates the data segment token from information in the token directive. If the token directive includes the data segment token, the data segment token storage module 1304 recognizes the data segment token as a data structure representing the data segment identified by the data segment identifier in the token directive and stores the data segment token appropriately.

Typically, where the data segment token storage module 1304 recognizes a data segment token, the data segment token is differentiated in some way from other data stored on the storage device 150. For example, a requesting device 1326 may merely compress data and send a compressed object, file, or data segment so that the storage device 150 does not distinguish the compressed data segment from other data received by way of other storage requests.

Where the data segment token storage module 1304 recognizes that a received data segment token is a data segment token, the data segment token storage module 1304 may store the data segment token in such a way that when read, it may appear as a data segment rather than the data segment token. One of skill in the art will recognize other ways that the data segment token storage module 1304 may store a data segment token after recognizing that a received data segment token is a data segment token rather than a data segment.

In another embodiment, storage request includes data from the data segment. In this embodiment, the apparatus includes a token generation module 1306 that generates a data segment token from the data segment, where the data segment token is created in response to the storage request to store the data segment. In a further embodiment, the token generation module 1306 resides in the requesting device 1326, possibly in the form of a driver.

In one embodiment, the apparatus includes a secure erase module 1320 that overwrites existing data with characters such that the existing data is non-recoverable, where the existing data includes data of a data segment previously stored on the storage device identified with the same data segment identifier as the data segment identified in the storage request. In this embodiment, a data segment token is stored with the data segment identifier and data segment length and existing data identified by the same data segment identifier stored in the data segment token is erased by overwriting the existing data. Typically the existing characters are overwritten by zeros, ones, or some other character string so that the existing data is destroyed and is non-recoverable.

In a further embodiment, the secure erase module also includes an erase confirmation module 1322 that transmits a message indicating that the existing data has been overwritten. Typically the message is sent to the requesting device 1326. The erase confirmation message is transmitted after the secure erase module 1320 has overwritten the existing data. The message may be transmitted in the same transaction as the storage request or in a different transaction.

In another embodiment, the secure erase module 1320 overwrites the existing data during a storage space recovery operation. For example, if the storage device 150 is a solid-state storage device 102, as described above, the storage space recovery operation may be related to the garbage collection describe in relation to the apparatus 800 depicted in FIG. 8. However, a storage space recovery operation involving a request to overwrite the existing data would typically be expedited so that the storage location where the existing data is stored is necessarily recovered prior to any confirmation message is sent by the erase confirmation module 1322. In one embodiment, the existing data is marked or otherwise identified to indicate that a secure erase has been requested. The confirmation message would typically not be sent until the existing data marked for erasure has been overwritten and made non-recoverable. In another embodiment, the secure erase module 1320 merely marks the existing data as invalid for later storage space recovery. In another embodiment, the secure erase updates an index to indicate that the existing data is invalid and prevents access to this data until the data is overwritten during later storage space recovery.

In one embodiment, the secure erase module 1320 overwrites the existing data each time a data segment token is stored. In another embodiment, the storage request specifically includes a request to overwrite the existing data and the secure erase module 1320 overwrites the existing data in response to the request to overwrite the existing data. In another embodiment, the secure erase module 1320 stores metadata information regarding confirmation that the existing data has been erased so that subsequent reads can indicate the erasure.

In other embodiments where a secure erase is not received, the existing data is deleted. In one embodiment, deleting the data includes deleting an index entry, address, etc. In a preferred embodiment, the when a data segment token is stored, the corresponding existing data is marked as invalid or otherwise ready for storage recovery. The data may be later recovered in a storage recovery operation, garbage collection operation, etc.

In a particular embodiment, the apparatus includes a read request receiver module 1308 that receives a storage request to read the data segment, a read data segment token module 1310 that reads the data segment token corresponding to the data segment requested by the storage request, and a read request response module 1312 that transmits a response to the requesting device 1326. The response is generated using the data segment token corresponding to the requested data segment.

The storage request to read the data segment, in one embodiment, is associated with the storage request and serves to confirm that the storage request has been successful. In another embodiment, the request to read the data segment is independent from the storage request and may be initiated by the requesting device 1326 that made the storage request or another separate requesting device 1326.

In one embodiment, where the requesting device is capable of receiving information from the data segment token in place of actual data, the read request response module 1312 includes a transmit data segment token module 1314 that transmits in the response a message to the requesting device 1326. The message includes at least the data segment identifier and the data segment length, but may also include a data segment location, at least one instance of the repeated, identical character or character string, or other pertinent information. Typically, the message does not include the actual data of the data segment, other than what is included in the data segment token.

In another embodiment, where the requesting device 1326 is expecting to receive a data segment, the apparatus includes a reconstitute data segment module 1318 that reconstitutes data of the data segment using the data segment token. The read request response module 1312 also includes a transmit data segment module 1316 that transmits the reconstituted requested data segment to the requesting device 1326. In another embodiment, the reconstitute data segment module 1318 resides at the requesting device 1326, possibly as in the form of a driver, and the transmit data segment token module 1314 transmits the message with the data segment token information to the requesting device 1326. The reconstitute data segment module 1318 at the requesting device 1326 reconstitutes the requested data segment from the message.

In one embodiment, the system 1300 includes a separate apparatus that includes a read request receiver module 1308, a read data segment token module 1310, a read request response module 1312, which are substantially similar to those described above. The apparatus may be independent from the apparatus including the write request receiver module 1302 and the data segment token storage module 1304. In one embodiment, the read request response module 1312 includes a transmit data segment token module 1314 and/or a transmit data segment module 1316, and the apparatus may include a reconstitute data segment module 1318, where the modules 1314, 1316, 1318 are substantially similar to those described above.

Figure 14:
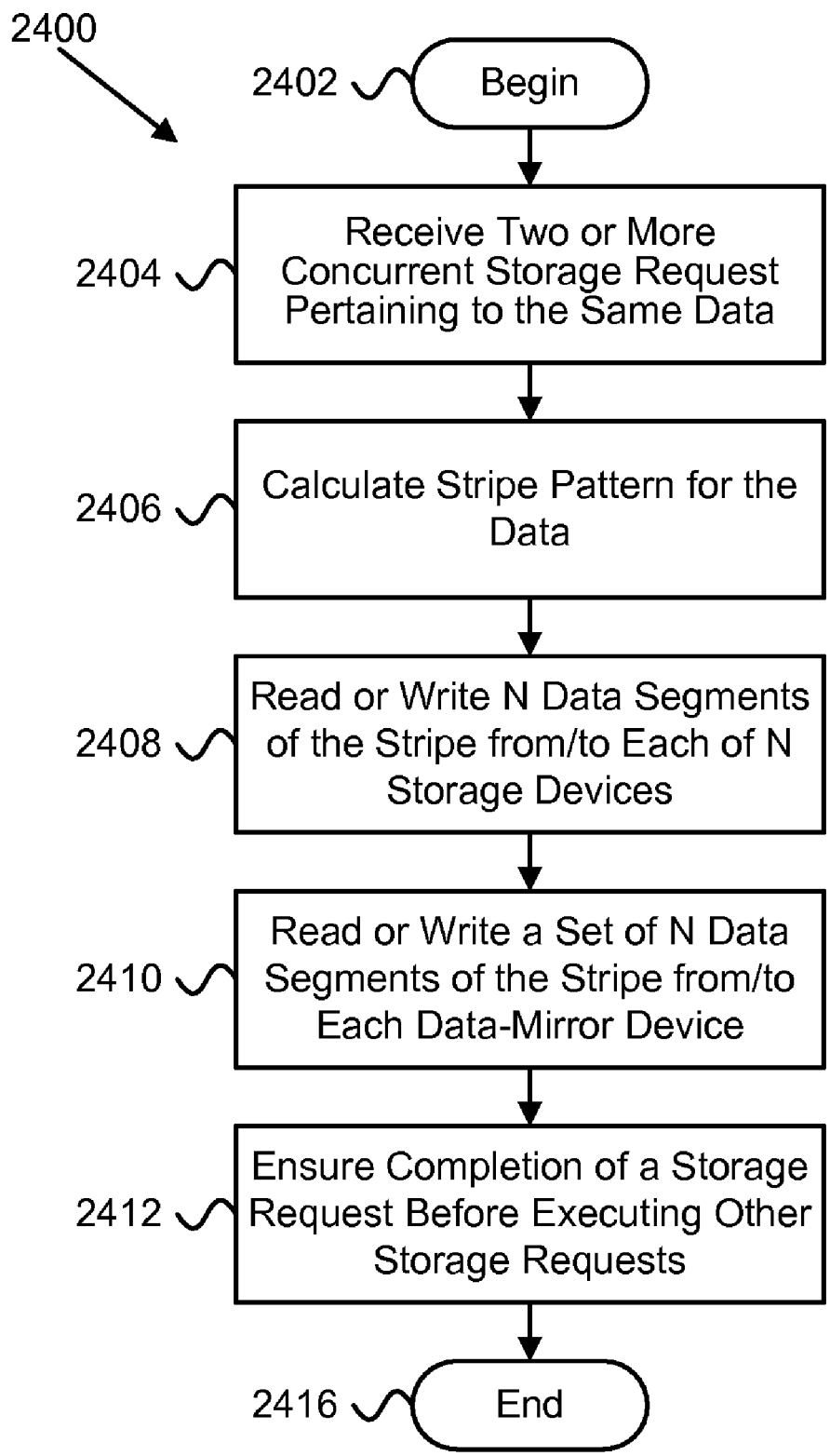
FIG. 14 is a schematic flow chart diagram illustrating an embodiment of a method for shared, front-end distributed RAID in accordance with the present invention.

FIG. 14 is a schematic flow chart diagram illustrating an embodiment of a method 1400 for storing a data segment token in accordance with the present invention. The method 1400 begins 1402 and the write request receiver module 1302 receives 1404 a storage request from the requesting device 1326, where the storage request includes a request to store a data segment in the storage device 150. The data segment includes a series of repeated, identical characters or character strings. The a data segment token storage module 1304 stores 1406 a data segment token in the storage device 150 and the method 1400 ends 1408. The data segment token includes at least a data segment identifier and a data segment length and the data segment token does not include data from the data segment for the most part.

Figure 15:
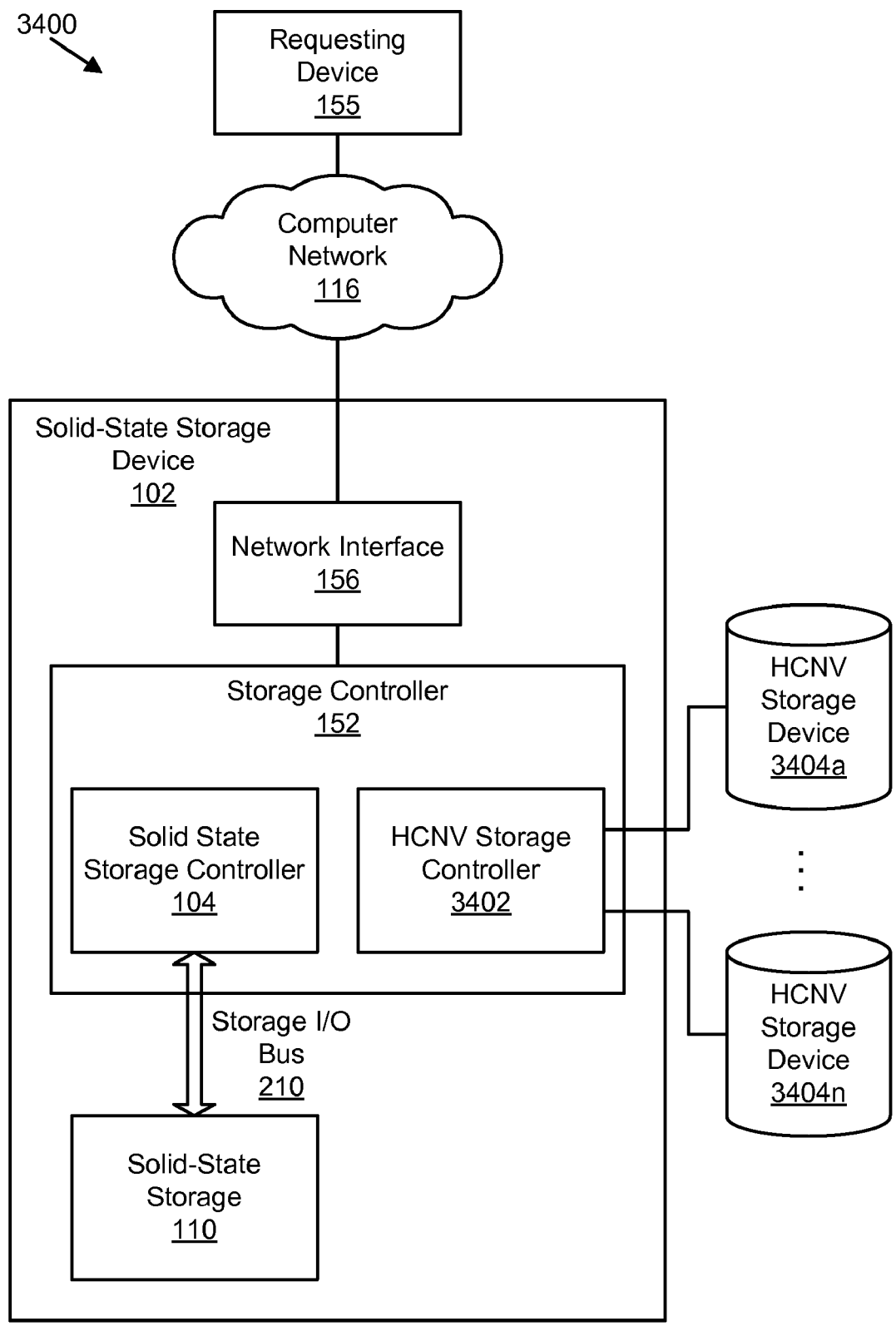
FIG. 15 is a schematic block diagram illustrating one embodiment of a system with solid-state storage as cache for a high-capacity, non-volatile storage device in accordance with the present invention.

FIG. 15 is a schematic flow chart diagram illustrating an embodiment of a method 1500 for reading a data segment token in accordance with the present invention. The method 1500 begins 1502 and the read request receiver module 1308 receives 1504 a storage request to read a data segment from the storage device 150. The data segment is represented on the storage device by a data segment token and the data segment includes a series of repeated, identical characters or character strings. The data segment token includes at least a data segment identifier and a data segment length and the data segment token does not include data from the data segment. The a read data segment token module 1310 reads 1506 the data segment token corresponding to the data segment requested in the storage request, the read request response module 1312 transmits 1508 a response to the requesting device 150 and the method 1500 ends 1510. The response is generated using the data segment token corresponds to the requested data segment.

Progressive RAID

A redundant array of independent drives ("RAID") can be structured in many ways to achieve various goals. As described herein, a drive is a mass storage device for data. A drive, or storage device, may be a solid-state storage 110, a hard disk drive ("HDD"), a tape drive, an optical drive, or any other mass storage device known to those of skill in the art. In one embodiment, a drive comprises a portion of a mass storage device accessed as a virtual volume. In another embodiment, a drive includes two or more data storage devices accessible together as a virtual volume and configured in a storage area network ("SAN"), as a RAID, as just a bunch of disks/drives ("JBOD"), etc. Typically, a drive is accessed as a single unit or virtual volume through a storage controller 152. In a preferred embodiment, the storage controller 152 comprises a solid-state storage controller 104. One of skill in the art will recognize other forms of a drive in the form of a mass storage device that may be configured in a RAID. In the embodiments described herein, a drive and a storage device 150 are used interchangeably.

Traditionally, the various RAID configurations are called RAID levels. One basic RAID configuration is RAID level 0 which creates a mirror copy of a storage device 150. An advantage of RAID 0 is that a complete copy of data on one or more storage devices 150 is also available on a mirror copy of the one or more storage devices 150 so that reading the data on the primary drives or mirrored drives is relatively fast. RAID 0 also provides a backup copy of data in case of a failure in the primary storage devices 150. A disadvantage of RAID 0 is that writes are relatively slow because written data must be written twice.

Another traditional RAID configuration is RAID level 1. In RAID 1, data written to the RAID is divided into N data segments corresponding to N storage devices 150 in a set of storage devices 150. The N data segments form a "stripe." By striping data across multiple storage devices 150, performance is enhanced because the storage devices 150 can work in parallel to store the N data segments faster than a single storage device 150 can save data comprising the N data segments. Reading data is relatively slow, however, because is data may be spread over multiple storage devices 150 and access time of multiple storage devices 150 is typically slower than reading data from one storage device 150 containing all of the desired data. In addition, RAID 1 provides no failure protection.

A popular RAID configuration is RAID level 5 which includes striping of N data segments across N storage devices 150 and storing a parity data segment on an N+1 storage device 150. RAID 5 offers failure tolerance because the RAID can tolerate a single failure of a storage device 150. For example, if a storage device 150 fails, missing a data segment of a stripe can be created using the other available data segments and the parity data segment calculated specifically for the stripe. RAID 5 also typically uses less storage space than RAID 0 because each storage device 150 of the RAIDed set of storage devices 150 is not required to store a complete copy of the data, but only a data segment of a stripe or a parity data segment. RAID 5, like RAID 1, is relatively fast for writing data, but is relatively slow for reading data. Writing data for a typical traditional RAID 5 is slower than for RAID 1, however, because a parity data segment must be calculated for each stripe from the N data segments of the stripe.

Another popular RAID configuration is RAID level 6 which includes dual distributed parity. In RAID 6, two storage devices 150 are assigned as parity-mirror devices (e.g. 1602a, 1602b). Each parity data segment for a stripe is calculated separately so that losing any two storage devices 150 in the storage device set is recoverable using the remaining, available data segments and/or parity data segments. RAID 6 has similar performance advantages and disadvantages as RAID 5.

Nested RAID may also be used to increase fault tolerance where high reliability is required. For example, two storage device sets, each configured as RAID 5, may be mirrored in a RAID 0 configuration. The resulting configuration may be called RAID 50. If RAID 6 is used for each mirrored set, the configuration may be called RAID 60. Nested RAID configurations typically have similar performance issues as the underlying RAID groups.

From the foregoing discussion, it should be apparent that a need exists for an apparatus, system, and method for progressive RAID that offers the benefits of fault tolerance, faster data writing than traditional fault-tolerant RAID levels, such as RAID 0, RAID 5, RAID 6, etc. while also offering faster data reading than traditional striped RAID levels, such as RAID 1, RAID 5, RAID 6, etc. Beneficially, such an apparatus, system, and method would write N data segments to a parity-mirror storage device 1602, offering the advantage of a RAID 0 system, until the parity data segment is required to be calculated, such as before or part of a storage consolidation operation.

FIG. 10 is a schematic block diagram illustrating one embodiment of a system 1600 for progressive RAID in accordance with the present inventions. The system 1600 includes N storage devices 150 and M parity-mirror storage devices 1602 accessible through a computer network 116 by one or more clients 114. The N storage devices 150 and parity-mirror storage devices 1602 may be located in one or more servers 112. The storage devices 150, servers 112, computer network 116, and clients 114 are substantially similar to those described above. The parity-mirror devices 1602 are typically similar or identical to the N storage devices 150 and are typically designated as a parity-mirror storage device 1602 for a stripe.

In one embodiment, the N storage devices 150 and M parity-mirror storage devices 1602 are included in or accessible through one server 112 and may be networked together using a system bus, SAN, or other computer network 116. In another embodiment, the N storage devices 150 and M parity-mirror storage devices 1602 are located in or accessible through multiple servers 112a-n+m. For example, the storage devices 150 and parity-mirror storage devices 1602 may be part of an in-server SAN as described above in relation to the system 103 of FIG. 1C and the method 105 of FIG. 5B.

In one embodiment, a parity-mirror storage device 1602 stores all parity data segments of the stripes stored in the progressive RAID. In another preferred embodiment, a storage device 150 of the storage device set 1604 assigned to the progressive RAID is assigned to be a parity-mirror storage device 1602 for a particular stripe and the assignment is rotated so that the parity data segments are rotated, for each stripe, among the N+M storage devices 150. This embodiment, offers a performance advantage over assigning a single storage device 150 to be a parity-mirror storage device 1602 for each stripe. By rotating the parity-mirror storage device 1602, the overhead associated with calculating and storing parity data segments can be distributed.

In one embodiment, the storage devices 150 are solid-state storage devices 102, each with associated solid-state storage 110 and a solid-state storage controller 104. In another embodiment, each storage device 150 includes a solid-state storage controller 104 and associated solid-state storage 110 acts as cache for other less expensive, lower performance storage, such as tape storage or hard disk drives. In another embodiment, one or more of the servers 112 include one or more clients 114 that send storage requests to the progressive RAID. One of skill in the art will recognize other system configurations with N storage devices 150 and one or more parity-mirror storage devices 1602 that may be configured for progressive RAID.

Figure 17:
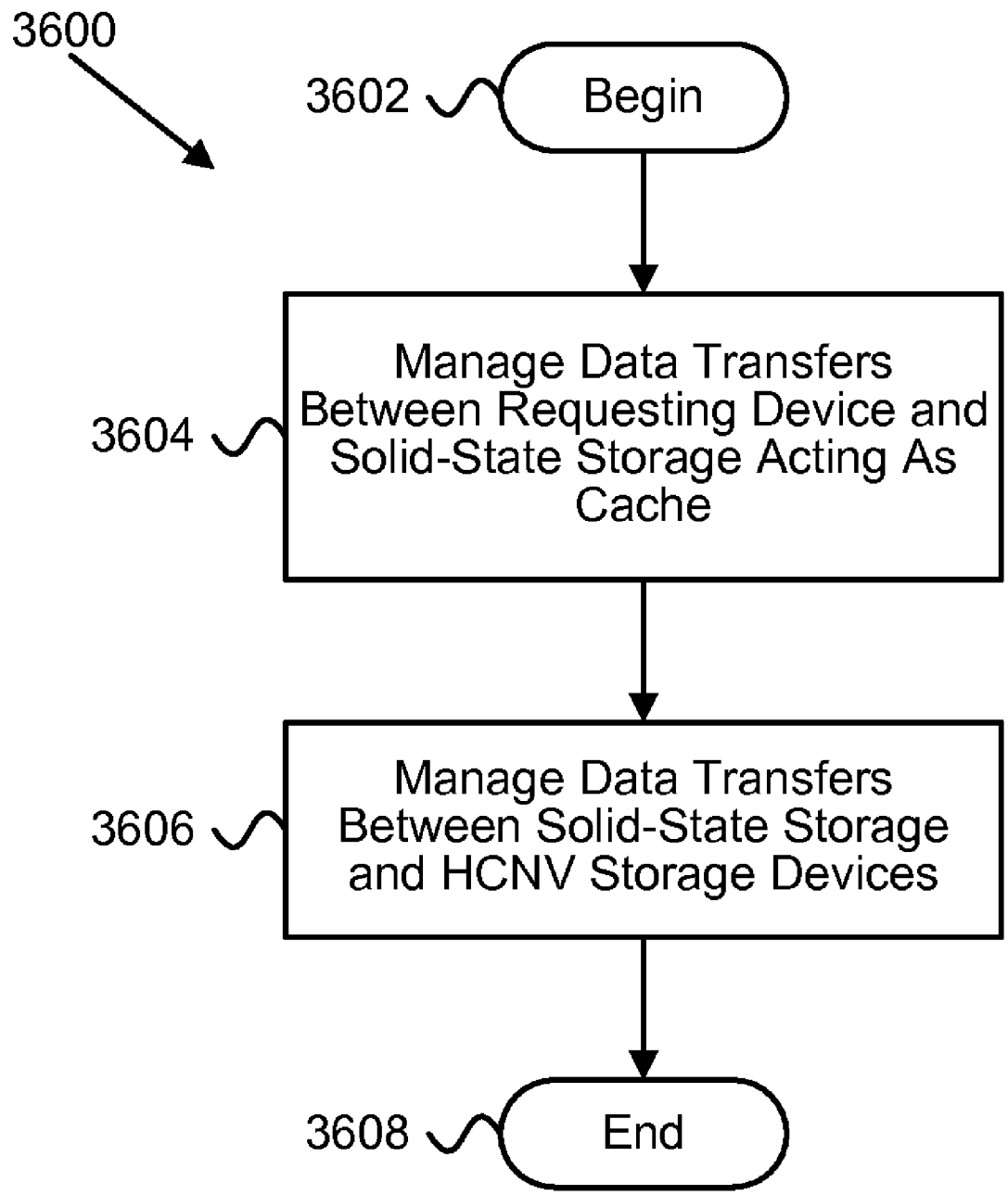
FIG. 17 is a schematic flow chart diagram illustrating one embodiment of a method with solid-state storage as cache for a high-capacity, non-volatile storage device in accordance with the present invention.

FIG. 17 is a schematic block diagram illustrating one embodiment of an apparatus 1700 for progressive RAID in accordance with the present invention. The apparatus 1700 includes, in various embodiments, a storage request receiver module 1702, a striping module 1704, a parity-mirror module 1706, and a parity progression module 1708, a parity alteration module 1710, a mirrored set module 1712, an update module 1714, a mirror restoration module 1716 with a direct client response module 1718, a pre-consolidation module 1720, a post-consolidation module 1722, a data rebuild module 1724, and a parity rebuild module 1726, which are described below. The modules 1702-1726 are depicted in a server 112, but some or all of the functions of the modules 1702-1726 may also be distributed in multiple servers 112, storage controllers 152, storage devices 150, clients 114, etc.

The apparatus 1700 includes a storage request receiver module 1702 that receives a request to store data, where the data is data of a file or of an object. In one embodiment, the storage request is an object request. In another embodiment, the storage request is a block storage request. The storage request in one embodiment, does not include data, but includes commands that can be used by the storage devices 150 and parity-mirror storage devices 1602 to DMA or RDMA data from a client 114 or other source. In another embodiment, the storage request includes data to be stored as a result of the storage request. In another embodiment, the storage request includes one command capable of having the data stored in the storage device set 1604. In another embodiment, the storage request includes multiple commands. One of skill in the art will recognize other storage requests to store data appropriate for progressive RAID.

The data is stored in a location accessible to the apparatus 1700. In one embodiment, the data is available in a random access memory ("RAM"), such as a RAM used by the client 114 or server. In another embodiment, the data is stored in a hard disk drive, tape storage, or other mass storage device. In one embodiment, the data is configured as an object or as a file. In another embodiment, the data is configured as a data block which is part of an object or a file. One of skill in the art will recognize other forms and locations for the data that is the subject of the storage request.

The apparatus 1700 includes a striping module 1704 that calculates a stripe pattern for the data. The stripe pattern includes one or more stripes, where each stripe includes a set of N data segments. Typically the number of data segments in a stripe depends on how many storage devices 150 are assigned to the RAID group. For example, if RAID 5 is used, one storage device 150 is assigned as a parity-mirror storage device 1602a to store parity data for a particular stripe. If four other storage devices 150a, 150b, 150c, 150d are assigned to the RAID group, a stripe will have four data segments in addition to the parity data segment. The striping module 1704 writes N data segments to N of a stripe to N storage devices 150a-n so that each of the N data segments is written to a separate storage device 150a, 150b, . . . 150n within a set 1604 of storage devices 150 assigned to the stripe. One of skill in the art will appreciate various combinations of storage devices 150 that may be assigned to a RAID group for a particular RAID level and how to create a striping pattern and divide data into N data segments per stripe.

The apparatus 1700 includes a parity-mirror module 1706 that writes a set of N data segments of the stripe to one or more parity-mirror storage devices 1602 within the storage device set 1604, where the parity-mirror storage devices 1602 are in addition to the N storage devices 150. The N data segments are then available for future calculation of a parity data segment. Rather than immediately calculating the parity data segment, the parity-mirror module 1706 copies the set of N data segments to the parity-mirror storage devices 1602, which typically requires less time than storing the N data segments. Once the N data segments are stored on the parity-mirror storage device 1602, the N data segments are available to be read or used to restore data if one of the N storage devices 150 becomes unavailable. Reading data also has the advantages of a RAID 0 configuration because all of the N data segments are available together from one storage device (e.g. 1602a). For more than one parity-mirror storage device (e.g. 1602a, 1602b), the parity-mirror module 1706 copies the N data segments to each parity-mirror storage device 1602a, 1602b.

The apparatus 1700 includes a parity progression module 1708 that calculates one or more parity data segments for the stripe in response to a storage consolidation operation. The one or more parity data segments calculated from the N data segments are stored on the parity-mirror storage devices 1602. The parity progression module 1708 stores a parity data segment on each of the one or more parity-mirror storage devices 1602. The storage consolidation operation is conducted to recover at least storage space or data or both on at least one of the one or more parity-mirror storage devices 1602. For example, a storage consolidation operation may be a data garbage collection on a solid-state storage device 102 as described above in relation to the apparatus 800 and method 900 of FIGS. 8 and 9. The storage consolidation operation may also include a defragmentation operation for a hard disk drive, or other similar operation that consolidates data to increase storage space. The storage consolidation operation, as used herein, may also include an operation to recover data, for example, if a storage device 150 is unavailable, to recover from an error, or other reason for reading data from the parity-mirror storage device 1602. In another embodiment, the parity generation module 1708 simply calculates the parity data segment when the parity-mirror storage device 1602 is less busy.

Advantageously, by delaying calculation and storage of the parity data segment of a stripe, the N data segments on the parity-mirror storage device 1602 are available for reading the data segments, recovering data, rebuilding data on a storage device 150 until more storage space is needed on the parity-mirror storage device 1602 or other reason for a storage consolidation operation. The parity progression module 1708 may then run as a background operation, autonomously from the storage request receiver module 1702, the striping module 1704, or the parity-mirror module 1706. One of skill in the art will easily recognize other reasons to delay calculation of a parity data segment as part of a progressive RAID operation.

In one embodiment, some or all of the functions of the modules 1702-1708, receiving an request to store data, calculating a stripe pattern and writing N data segments to the N storage devices, writing a set of N data segments to a parity-mirror storage device, and calculating the parity data segment, occur on a storage device 150 of the storage device set 1604, a client 114, and a third-party RAID management device. The third-party RAID management device may be a server 114 or other computer.

In one embodiment, the apparatus 1700 includes a parity alternation module 1710 that alternates, for each stripe, which of the storage devices 150 within the storage device set 1604 are assigned to be the one or more parity-mirror storage devices 1602 for the stripe. As discussed above in relation to the system 1600 of FIG. 10, by rotating which storage device 150 is used for the parity-mirror storage device for a stripe, the work calculation of the various parity data segments is spread among the storage devices 150 of a storage device set 1604.

In another embodiment, the storage device set 1604 is a first storage device set and the apparatus 1700 includes a mirrored set module 1712 that creates one or more storage device sets in addition to the first storage set 1604 so that each of the one or more additional storage device sets include at least an associated striping module 1704 that writes the N data segments to N storage devices 150 of each of the one or more additional storage sets. In a related embodiment, each of the one or more additional storage device sets includes an associated a parity-mirror module 1706 for storing a set of the N data segments and a parity progression module 1708 for calculating one or more parity data segments. Where the mirrored set module 1712 creates one or more mirrored storage device sets, the RAID may be a nested RAID such as RAID 50. In this embodiment, the RAID level may be progressed from a RAID 10 where data is striped and mirrored, to a RAID 50 or RAID 60, where a parity data segment is calculated and stored for each storage device set 1604.

In one embodiment, the apparatus 1700 includes and update module 1714. The update module 1714 is typically used where the N data segments on a parity-mirror storage device 1602 have not been progressed to a parity data segment. The update module 1714 receives an updated data segment, where the updated data segment corresponds to an existing data segment of the N data segments stored on the N storage devices 150. The update module 1714 copies the updated data segment to the storage device 150 of the stripe where the existing data segment is stored and to the one or more parity-mirror storage devices 1602 of the stripe. The update module 1714 replaces the existing data segment stored on the storage device 150 of the N storage devices 150a-n with the updated data segment and replaces the corresponding existing data segment stored on the one or more parity-mirror storage devices 1602 with the updated data segment.

In one embodiment replacing a data segment includes writing the data segment to a storage device 150 and then marking a corresponding data segment as invalid for subsequent garbage collection. An example of this embodiment is described for solid-state storage 110 and the garbage collection apparatus described above in relation to FIGS. 8 and 9. In another embodiment, replacing a data segment includes overwriting an existing data segment with an updated data segment.

In one embodiment, the set of storage devices 1604 is a first storage device set and the apparatus 1700 includes a mirror restoration module 1716 that recovers a data segment stored on a storage device 150 of the first storage set 1604 where the storage device 150 of the first storage set 1604 is unavailable. The data segment is recovered from a mirror storage device containing a copy of the data segment. The mirror storage device includes one of a set of one or more storage devices 150 that stores a copy of the N data segments.

In a further embodiment, the mirror restoration module 1716 recovers the data segment in response to a read request from a client 114 to read the data segment. In another related embodiment, the mirror restoration module 1716 also includes a direct client response module 1718 that sends the requested data segment to the client 114 from the mirror storage device. In this embodiment, the requested data segment is copied to the client 114 so that the client 114 does not have to wait until the data segment is recovered before transmitting the data segment on to the client 114.

In one embodiment, the apparatus 1700 includes a pre-consolidation restoration module 1720 that recovers a data segment stored on a storage device 150 of the storage set 1604 in response to a request to read the data segment. In the embodiment the storage device 150 is unavailable and the data segment is recovered from the a parity-mirror storage device 1602 prior to the parity progression module 1708 generating the one or more parity data segments on the one or more parity-mirror storage devices 1602.

In another embodiment, the apparatus 1700 includes a post-consolidation restoration module 1724 that recovers a data segment stored on a storage device 150 of the storage set. In the embodiment, the storage device 150 is unavailable and the data segment is recovered using one or more parity data segments stored on one or more of the parity-mirror storage devices 150 after the parity progression module 1708 generates the one or more parity data segments. For example, the post-consolidation restoration module 1724 uses a parity data segment and available data segments on the available N storage devices 150 to recreate the missing data segment.

In one embodiment, the apparatus 1700 includes a data rebuild module 1724 that stores a recovered data segment on a replacement storage device in a rebuild operation, where the recovered data segment matches an unavailable data segment stored on an unavailable storage device 150. The unavailable storage device 150 is one of the N storage devices 150 of the storage device set 1602. Typically, the rebuild operation occurs after a failure of the storage device 150 that stores the unavailable data segment. The rebuild operation is to restore data segments onto the replacement storage device to match data segments stored previously on the unavailable storage device 150.

The data segment may be recovered for the rebuild operation from several sources. For example, the data segment may be recovered from a parity-mirror storage device 1602 prior to progression if the matching data segment resides on the parity-mirror storage device 1602. In another example, the data segment may be recovered from a mirror storage device containing a copy of the unavailable data segment. Typically the data segment is recovered from the mirror storage device if the recovered data segment does not reside on the one or more parity-mirror storage devices 1602, but may be recovered from the mirror storage device even if the matching data segment is available on the mirror storage device.

In another example, a regenerated data segment is regenerated from one or more parity data segments and available data segments of the N data segments if the recovered data segment does not reside on a parity-mirror storage device 1604 or the mirror storage device. Typically the missing data segment is regenerated only if it does not exist on another storage device 150 in some form.

In another embodiment, the apparatus 1700 includes a parity rebuild module 1726 that rebuilds a recovered parity data segment on a replacement storage device in a parity rebuild operation where the recovered parity data segment matches an unavailable parity data segment stored on an unavailable parity-mirror storage device. The unavailable parity-mirror storage device is one of the one or more parity-mirror storage devices 1602. The parity rebuild operation restores parity data segments onto the replacement storage device to match parity data segments stored previously on the unavailable parity-mirror storage device.

To regenerate the recovered parity data segment in the rebuild operation, data used for the rebuild may be from various sources. In one example, the recovered parity data segment is recovered using a parity data segment stored on a parity-mirror storage device 1602 in a second set of storage devices 150 storing a mirror copy of the stripe. Where a mirror copy is available, using the mirrored parity data segment is desirable because the recovered parity data segment does not have to be recalculated. In another example, the recovered parity data segment is regenerated from the N data segments stored on one of the N storage devices 150 if the N data segments are available on the N storage devices. Typically, the N data segments would be available on the N storage devices 150 where a single failure occurs on the parity-mirror storage device 1602 being rebuilt.

In another example, the recovered parity data segment is regenerated from one or more storage devices 150 of the second set of storage devices 150 storing copies of the N data segments if one or more of the N data segments are unavailable from the N storage devices 150 of the first storage device set 1604 and a matching parity data segment is not available on the second set of storage devices 150. In yet another example, the recovered parity data segment is regenerated from the available data segments and non-matching parity data segments regardless of their location within the one or more sets of storage devices 150.

Where the parity-mirror storage device is alternated among the storage devices 150 of the storage device set 1604, typically the data rebuild module 1724 and the parity rebuild module 1726 act in conjunction to rebuild data segments and parity data segments on a rebuilt storage device 150. Where a second parity-mirror storage device 1602b is available, the data rebuild module 1724 and the parity rebuild module 1726 can rebuild two storage devices after a failure of two storage devices 150, 1602 of the storage device set 1604. Where a parity-mirror storage device 1602 is not progressed to create a parity-mirror data segment, recovery of a data segment or a storage device 150 is quicker than if the parity-mirror storage device 1602 is progressed and the parity data segment for a stripe has been calculated and stored and the N data segments on the parity-mirror storage device 1602 used to calculate the parity data segment have been deleted.

FIG. 18 is a schematic block diagram illustrating one embodiment of an apparatus 1800 for updating a data segment using progressive RAID in accordance with the present invention. Typically, the apparatus 1800 pertains to a RAID group where one or more of the parity-mirror storage devices 1602 have been progressed and include a parity daa segment and not the N data segments used to create the parity data segment. The apparatus 1800 includes an update receiver module 1802, an update copy module 1804, a parity update module 1806, which are described below. The modules 1802-1806 of the apparatus 1800 are depicted in a server 112, but may be in a storage device 150, a client 114, or any combination of devices, or may be distributed among several devices.

A stripe, data segments, storage devices 150, a storage device set 1604, parity data segments, and the one or more parity-mirror storage device 1602 are substantially similar to a stripe as describe above in relation to the apparatus 1700 of FIG. 17. The apparatus 1800 includes an update receiver module 1802 that receives an updated data segment where the updated data segment corresponds to an existing data segment of an existing stripe. In another embodiment, the update receiver module 1802 may also receive multiple updates and may handle the updates together or separately.

The apparatus 1800 includes an update copy module 1804 that copies the updated data segment to the storage device 150 where the corresponding existing data segment is stored and to the one or more parity-mirror storage devices 1602 corresponding to the existing stripe. In another embodiment, the update copy module 1804 copies the updated data segment to either the parity-mirror storage device 1602 or to the storage device 150 storing the existing data segment and then verifies that a copy of the updated data segment is forwarded to the other device 1602, 150.

The apparatus 1800 includes a parity update module 1806 that calculates one or more updated parity data segments for the one or more parity-mirror storage devices of the existing stripe in response to a storage consolidation operation. The storage consolidation operation is similar to the storage consolidation operation described above in relation to the apparatus 1700 in FIG. 17. The storage consolidation operation is conducted to recover at least storage space and/or data on one or more parity-mirror storage devices 1602 with the one or more updated parity data segments. By waiting to update the one or more parity data segments, the update can be postponed until it is more convenient or until necessary to consolidate storage space.

In one embodiment, the updated parity data segment is calculated from the existing parity data segment, the updated data segment, and the existing data segment. In one embodiment, the existing data segment is maintained in place prior to reading the existing data segment for generation of the updated parity data segment. An advantage to this embodiment, is the overhead associated from copying the existing data segment to the parity-mirror storage device 1602 or other location where the updated parity data segment is generated can be postponed until necessary. A disadvantage of this embodiment is that if the storage device 150 that maintains the existing data segment fails, the existing data segment must be recovered before the updated parity data segment can be generated.

In another embodiment, the existing data segment is copied to the data-mirror storage device 1602 when the storage device 150 of the N storage devices 150a-n where the existing data segment is stored receives a copy of the updated data segment. The existing data segment is then stored until the storage consolidation operation. In another embodiment, the existing data segment is copied to the data-mirror storage device 1602 in response to a storage consolidation operation on the storage device 150 of the N storage devices 150a-n where the existing data segment is stored if the storage consolidation operation occurs before the storage consolidation operation that triggers calculation of the updated parity data segment. The latter embodiment is advantageous because the existing data segment is not copied until required by a storage consolidation operation on either the storage device 150 where the existing data segment is stored or on the parity-mirror storage device 1602.

In one embodiment, the updated parity data segment is calculated from the existing parity data segment, the updated data segment, and a delta data segment, where the delta data segment is generated as a difference between the updated data segment and the existing data segment. Typically, generating a delta data segment is a partial solution or intermediate step in updating the parity data segment. Generating a delta data segment is advantageous because it may be highly compressible and may be compressed before transmission.

In one embodiment, the delta data segment is stored on the storage device storing the existing data segment prior to reading the delta data segment for generation of the updated parity data segment. In another embodiment, the delta data segment is copied to the data-mirror storage device 1602 when the storage device 150 where the existing data segment is stored receives a copy of the updated data segment. In another embodiment, the delta data segment is copied to the data-mirror storage device 1602 in response to a storage consolidation operation on the storage device 150 where the existing data segment is stored. As with copying the existing data segment, the latter embodiment is advantageous because the delta data file is not moved until the earlier of a storage consolidation operation on the storage device 150 storing the existing data segment or another storage consolidation operation triggering calculation of the updated parity data segment.

In various embodiments, all of a portion of the actions of the modules 1802, 1804, 1806, namely receiving an updated data segment, copying the updated data segment, and calculating the updated parity data segment, occurs on a storage device 150 of the storage device set 1604, a client 114, or a third-party RAID management device. In another embodiment, the storage consolidation operation is conducted autonomously from the operations of the update receiver module 1802 and the update copy module 1804.

FIG. 19 is a schematic flow chart diagram illustrating an embodiment of a method 1900 for managing data using progressive RAIDing in accordance with the present invention. The method 1900 begins 1902 and the storage request receiver module 1702 receives 1904 a request to store data, where the data is data of a file or of an object. The striping module 1704 calculates a stripe pattern for the data and writes 1906 the N data segments to N storage devices 150. The stripe pattern includes one or more stripes. Each stripe includes a set of N data segments where each of the N data segments is written to a separate storage device 150 within a set of storage devices 1604 assigned to the stripe.

The parity-mirror module 1706 writes 1908 a set of N data segments of the stripe to one or more parity-mirror storage devices 1602 within the set of storage devices 1604. The one or more parity-mirror storage devices are in addition to the N storage devices 150a-n. The parity generation module 1708 determines 1910 if there is a pending storage consolidation operation. If the parity generation module 1708 determines 1910 that there is no pending storage consolidation operation, the method 1900 returns and again determines 1910 if there is a pending storage consolidation operation. In other embodiments, the storage request receiver module 1702, the striping module 1704, and the parity-mirror module 1706, continue to receive storage requests, calculate striping patterns, and storing data segments.

If the parity generation module 1708 determines 1910 that there is no pending storage consolidation operation, the parity generation module 1708 calculates 1914 a parity data segment for the stripe. The parity data segment is calculated from the N data segments stored on a parity-mirror storage device 1602. The parity generation module 1708 stores 1912 the parity data segment on the parity-mirror storage device 1602 and the method 1900 ends 1916. The storage consolidation operation is conducted autonomously from receiving 1904 a request to store N data segments, writing 1906 the N data segments to the N storage devices, or writing 1908 the N data segments to one or more parity-mirror storage devices. The storage consolidation operation is conducted to recover at least storage space or data on the parity-mirror storage device 1602.

FIG. 20 is a schematic flow chart diagram illustrating an embodiment of a method 2000 for updating a data segment using progressive RAIDing in accordance with the present invention. The method 2000 begins 2002 and the update receiver module 1802 receives 2004 an updated data segment where the updated data segment corresponds to an existing data segment of an existing stripe. The update copy module 1804 copies 2006 the updated data segment to the storage device 150 where the corresponding existing data segment is stored and to the one or more parity-mirror storage devices 1602 corresponding to the existing stripe.

The parity update module 1806 determines 2008 if a storage consolidation operation is pending. If the parity update module 1806 determines 2008 that there is no pending storage consolidation operation, the parity update module 1806 waits for a storage consolidation operation. In one embodiment, the method 2000 returns and receives 2004 other updated data segments and copies 2006 the updated data segments. If the parity update module 1806 determines 2008 that there is no pending storage consolidation operation, the parity update module 1806 calculates 2010 one or more updated parity data segments for the one or more parity-mirror storage devices of the existing stripe and the method 2000 ends 2012.

Front-End Distributed RAID

Traditional RAID systems are configured with a RAID controller that functions to receive data, calculate striping patterns for the data, divide the data into data segments, calculate a parity stripe, store the data on storage devices, update the data segments, etc. While some RAID controllers allow some functions to be distributed, the storage devices managed by the RAID controller do not communicate with clients 114 directly for storing data striped in a RAID. Instead storage requests and data for RAIDing pass through the storage controller.

Requiring the RAID controller to touch all of the data to be stored in a RAID is inefficient because it creates a dataflow bottleneck. This is especially true during a read-modify-write process where bandwidth and performance of all of the drives in the RAID group is consumed while only a subset is actually updated. In addition, the a region of the storage device designated for data managed by the RAID controller is typically dedicated to the RAID group and cannot be accessed independently. Access to a storage device 150 by a client must typically be accomplished by partitioning the storage device 150. Where partitioning is used, partitions accessible for general storage are not used for RAID and partitions allocated to the RAID group are not accessible for general data storage. Schemes that oversubscribe partitions in order to globally optimize utilization are complex and more difficult to manage. In addition, storage space allocated for one RAID group cannot be accessed by more than one RAID controller unless one is designated as master and other RAID controllers act as slaves unless the master RAID controller is inactive, non-functional, etc.

Typical RAID controllers also generate parity data segments outside of the storage devices 150 of the RAID group. This can be inefficient because parity data segments are typically generated and then are sent to a storage device 150 for storage, which requires computing capacity of the RAID controller. Tracking parity data segment location and updates must also be done at the RAID controller instead of autonomously at a storage device 150.

Where it is necessary to ensure that the data remains available if the separate RAID controller is offline, RAID controllers are typically cross connected to the drives and to each other, and/or mirrored as complete sets, making data availability expensive and difficult to manage, and dramatically reducing the reliability of the storage subsystem.

What is needed is a system, apparatus, and method for front-end distributed RAID that allows RAIDing on a per data segment, per object, per file, or similar basis and that eliminates the need for RAID controllers and RAID controller couplets situated between the client and the storage devices. In such a system, apparatus, and method, a RAID group can be created for one data segment, object, or file and managed within one group of storage devices by one RAID controller while a second RAID group may be created for another data segment, object, or file that encompasses some of the same storage devices of the first RAID group. The RAID control functions may be distributed among clients 114, a third-party RAID management device, or among storage devices 150. The front-end distributed RAID system, apparatus, and method may also send commands to storage devices 150 of a RAID group and may allow the storage devices 150 to directly access and copy data through direct memory access ("DMA"), or remote DMA ("RDMA").

FIG. 10 is a schematic block diagram illustrating one embodiment of a system 1600 that may be accessed for a front-end distributed RAID in accordance with the present inventions. The descriptions above for the components depicted in FIG. 10 related to progressive RAID are also applicable to front-end distributed RAID. With respect to front-end distributed RAID, the storage device set 1604 forms a RAID group and includes storage devices 150 that are autonomous and are capable of independently receiving and servicing storage requests from a client 114 over a network 116 or one or more redundant networks 116.

Among the storage devices 150 within the storage device set 1604, one or more are designated as parity-mirror storage devices 1602 for a stripe. Typically, the one or more parity-mirror storage devices 1602 function substantially similar to the other storage devices 150. In typical configurations where the designated parity-mirror storage devices 1602 alternate among the storage devices 150 of the storage device set 1604, the parity-mirror storage devices 1602 have essentially the same characteristics as the other storage devices 150 because they must also operate as non-parity-mirror storage devices. The similar characteristics are with respect to operation within a RAID group and autonomous operation for independent client 114 communication as described above. In various embodiments, the storage devices 150 of the storage device set 1604 may differ in other aspects not related to functioning within the described RAID environment.

The storage devices 150 of the storage device set 1604 may be stand alone, grouped within one or more servers 112, may each reside in a server 112, may be accessed through one or more servers 112, etc. One or more clients 114 may reside in servers 112 that include one or more storage devices 150, may reside in separate servers 112, may reside in computers, workstations, laptops, etc. that access the storage devices 150 through one or more computer networks 116, or the like.

In one embodiment, the network 116 includes a system bus and one or more of the storage devices 150, 1602 of the storage device set 1604 communicate using the system bus. For example, the system bus may be a PCI-e bus, a Serial Advanced Technology Attachment ("serial ATA") bus, parallel ATA, or the like. In another embodiment, the system bus is an external bus such as small computer system interface ("SCSI"), FireWire, Fiber Channel, USB, PCIe-AS, Infiniband, or the like. One of skill in the art will appreciate other system 1600 configurations with storage devices 150 that are autonomous and are capable of independently receiving and servicing storage requests from a client 114 over one or more networks 116.

FIG. 11 is a schematic block diagram illustrating one embodiment of an apparatus 2100 for front-end distributed RAID in accordance with the present invention. The apparatus 2100, in various embodiments, includes a storage request receiver module 2102, a striping association module 2104, a parity-mirror association module 2106, a storage request transmitter module 2108, a front-end parity generation module 2110, a parity alternation module 2112, a data segment recovery module 2114, a data rebuild module 2116, a parity rebuild module 2118, and a peer-to-peer communication module 2120, which are described below. In various embodiments, the apparatus 2100 may be included in a storage device 150 such as a solid-state storage device 102, a storage device controller 152 such as a solid-state storage controller 104, a server 112, a third-party RAID management device, etc. or may be distributed among more than one component.

The apparatus 2100 includes a storage request receiver module 2102 that receives a storage request to store data in a storage device set 1604. The data may be a portion of a file or an object or may be an entire file or object. A file may include a block of arbitrary information, or resource for storing information, which is available to a computer program. A file may include any data structure accessed by a processor. A file may include a database, a string of text, computer code, etc. An object is typically a data structure for object-oriented programming and may include a structure with or without data. In one embodiment, an object is a subset of a file. In another embodiment, an object is independent of a file. In any case, an object and a file are defined herein to include the entire set of data, data structures, computer code, and other information that may be stored on a storage device.

The storage device set 1604 includes autonomous storage devices 150 forming a RAID group that independently receive storage requests from a client 114 over one or more networks 116. One or more of the autonomous storage devices 150 within the storage device set 1604 are designated as parity-mirror storage devices 1602 for a stripe. Other storage requests from another client 114 may be stored on a second storage device set where the second storage device set may include one or more of the same storage devices 150 (and parity-mirror storage devices 1602) as the first storage device set 1604. The storage devices 150 common to both storage device sets 1604 may have overlapping assigned storage space within the common storage devices 150.

The apparatus 2100 includes a striping association module 2104 that calculates a stripe pattern for the data. The stripe pattern includes one or more stripes. Each stripe includes of a set of N data segments. The N data segments of a stripe may also include one or more empty data segments. The striping association module 2104 associates each of the N data segments with one of N storage devices 150*a-n* in the storage device set 1604 assigned to the stripe. In one embodiment, the striping association module 2104 associates a data segment with a storage device 150 with a storage request to be sent the storage device 150 that directs the storage device 150 to get data corresponding to the data segment from the client 114 sending the storage request.

In another embodiment, the storage request is substantially free of data of the data segments. Substantially free of data means that the storage request generally does not include the data that is the subject of the storage request but may include characters, character strings, etc. that may be part of the data. For example, if the data comprises a series of repeated, identical characters, such as a series of zeros, the storage request may include an indication that the data includes a series of zeros without including all of the zeros contained in the data. One of skill in the art will recognize other ways to send a storage request without sending the bulk of the data while still allowing a small amount or single instance of certain characters or character strings in the storage request. The storage request includes commands that allow the N storage devices 150*a-n* to retrieve the data using a DMA or RDMA operation or the like.

In another embodiment, the striping association module 2104 associates a data segment with a storage device 150 by identifying in a storage request to be sent to the storage device 150 the data of the data segment. Identifying the data of the data segment may include a data segment identifier, a data segment location or address, a data segment length, or other information that will allow the storage device 150 to recognize which data comprises the data segment.

In one embodiment, the striping association module 2104 associates a data segment with a storage device 150 in a storage request so that a client 114 can send data comprising the data segments in a broadcast so that each storage device 150 is able to store associated data segments and discard data corresponding to data segments not assigned to the storage device 150. In another embodiment, the striping association module 2104 associates a data segment with a storage device 150 in a storage request, possibly by addressing each data segment, so that a client 114 can send data comprising the data segments in a multicast so that each storage device 150 is able to store associated data segments and discard data corresponding to data segments not assigned to the storage device 150. One of skill in the art will recognize other ways for the striping module 2104 to associate a data segment with a storage device 150 to broadcast, multicast, unicast, anycast, etc. one or more data segments to the one or more storage devices.

In a related embodiment, the striping association module 2104 associates a data segment with a storage device 150 in a storage request so that a client 114 can broadcast, multicast, unicast, etc. the storage request and each storage device 150 is able to receive a portion of the storage request from the client 114 pertaining to the data segment associated with the storage device 150 and can discard portions the storage request that do not pertain to the one or more data segments not associated with the storage device 150.

In another embodiment, the storage request received by the storage request receiver module 2102 includes the data that is the subject of the storage request and the striping association module 2104 associates a data segment with a storage device 150 by preparing a storage request for the storage device 150 that includes data segment. The striping association module 2104 may operate within a client 114, a third-party RAID management device, a storage device 150, 1602, etc.

The apparatus 2100 includes a parity-mirror association module 2106 that associates a set of the N data segments with one or more parity-mirror storage devices 1602 in the storage device set 1604. The one or more parity-mirror storage devices 1602 are in addition to the N storage devices 150*a-n*. In one embodiment, the parity-mirror association module 2106 associates a set of N data segments to each parity-mirror storage device 1602 so each parity-mirror storage device 1602 can receive and store the N data segments of a stripe for generating a parity data segment. In another embodiment, the parity-mirror association module 2106 associates a data segment of the stripe with each parity-mirror storage device 1602 so that the parity-mirror storage devices 1602*a-m* act as a mirror to the N data segments stored on the N storage devices 150*a-n*.

In various embodiments, the parity-mirror association module 2106 associates the set of N data segments with the one or more parity-mirror storage devices 1602 using a single storage request, multiple storage requests, or other association technique described above in relation to the striping association module 2104, such as storage requests setting the parity-mirror storage device 1602 up for DMA, RDMA, broadcasts, multicasts, or including the N data segments in the storage requests. The parity-mirror association module 2106 may operate within a client 114, a third-party RAID management device, a storage device 150, 1602, etc.

The apparatus 2100 includes a storage request transmitter module 2108 that transmits one or more storage requests to each storage device 150, 1602 in the storage device set 1604, each storage request sufficient to store onto the storage device 150, 1602 the one or more data segments associated with the storage device 150, 1602 receiving the storage request. In one embodiment, each storage request does not include data that is the subject of the storage request. In a further embodiment, each storage request enables the N storage devices 150 and parity-mirror storage devices 1602 of the storage device set 1604 to download data of an associated data segment using DMA or RDMA. In another embodiment, a storage request contains sufficient information to pick out relevant storage requests or relevant data for the associated data segments from a broadcast from the client 114. In another embodiment, a storage request includes the data of an associated data segment.

In one embodiment, each storage request identifies the storage devices 150, 1602 that are part of the storage device set 1604 of a stripe. By including an identification of the storage devices 150, 1604 of the storage device set 1604, in the event of a failure of a storage device 150 acting as master, another storage device 150 may take over as master for managing the RAIDed data. In another embodiment, the identification of the storage device set 1604 enables the autonomous storage devices 150, 1602 to recover data when a storage device is off-line, and rebuild data when a replacement storage device is added within the storage device set 1604 independent of the client. In another embodiment, the identification of the storage devices 150, 1602 of the storage device set 1604 represents a multi-cast group for transmission of data segments or storage requests. The identification may be stored along with metadata for the object or file stored on the storage devices 150, 1602 within the storage device set 1604.

In one embodiment, when the parity-mirror association module 2106 associates a set of N data segments with each of the one or more parity-mirror storage devices 1602, the apparatus 2100 includes a front-end parity generation module 2110 that calculates, independent of a client 114, a parity data segment for the stripe and stores the parity data segment on the parity-mirror storage device 1602. The parity data segment is calculated from the set of N data segments provided to the parity-mirror storage device 1602. Where more than one parity-mirror storage device 1602 is included in the storage device set 1604, the front-end parity generation module 2110 typically generates the various parity data segments so that two or more storage devices 150, 1602 in the storage device set 1604 may fail and the parity data segment information allows for recovery of unavailable data segments or parity data segments.

In another embodiment, the front-end parity generation module 2110 calculates the parity data segment when operating within a storage device 150 of the storage device set 1604 and/or a third party RAID management device. For example, a server 112 separate from the client 114 transmitting the storage request may calculate the parity data segment. In another embodiment, the front-end parity generation module 2110 operates within a parity-mirror storage device to calculate the parity data segment. For example, a storage controller 152 in the parity-mirror storage device 1602 may act as a master storage controller for the RAID group formed by the storage device set 1604.

In another embodiment, the front-end parity generation module 2110 calculates the parity data segment and then transmits the calculated parity data segment to one or more additional parity-mirror storage devices 1604 in a second set of storage devices forming a mirror. This embodiment is advantageous because overhead associated with calculating a parity data segment is expended once rather than for each storage device set 1604 with the additional benefit of reducing the data traffic on the network 116.

The apparatus 2100 may also include, in one embodiment, a data segment recovery module 2112 that recovers a data segment stored on a storage device 150 of the storage device set 1604 if the storage device 150 is unavailable and a request is received to read either the unavailable data segment or data that includes the unavailable data segment. The data segment is recovered using the data segments on available storage devices 150 of the storage device set 1604, a combination of the parity data segments and the data segments on available storage devices 150, 1602 of the storage device set 1604, or from a mirror storage device containing a copy of the data segment. Typically, the mirror storage device is one storage device 150 of a mirror storage device set that stores a copy of the N data segments. The data segment recovery module 2112 may operate and recover the unavailable data segment from a storage device 150, a parity-mirror storage device 1602, a third-party RAID management device, a mirror storage device, etc.

In another embodiment, the apparatus 2100 includes a data rebuild module 2114 that stores a recovered data segment on a replacement storage device 150 in a rebuild operation. For example, if a storage device 150 becomes unavailable due to failure, loss of synchronization, etc. the data rebuild module 2114 may rebuild a storage device 150 to replace the unavailable storage device 150. In one embodiment, the rebuilt storage device 150 is the original storage device 150 that has been made available.

The recovered data segment matches an unavailable data segment stored on the unavailable storage device 150 of the storage device set 1604. The rebuild operation typically restores one or more of data segments and parity data segments onto the replacement storage device 150 to match data segments and parity data segments stored previously on the unavailable storage device 150.

In one embodiment, the recovered data segment is recovered for the rebuild operation using the available data segments on available storage devices 150 of the storage device set 1602. In another embodiment, the recovered data segment is recovered for the rebuild operation using a combination of a parity data segment from one or more of the parity-mirror storage devices 1602 and the available data segments on available storage devices 150 of the storage device set 1604. In another embodiment, the recovered data segment is recovered for the rebuild operation using a matching data segment read from a parity-mirror storage device 1602. In yet another embodiment, the recovered data segment is recovered for the rebuild operation using a matching data segment from a mirror storage device. The data rebuild module 2114 could operate and store a received data segment from a client 114, a third party RAID management device, a storage device 150, 1602, a mirror storage device, etc.

The apparatus 2100 includes, in another embodiment, a parity rebuild module 2116 that rebuilds the recovered parity data segment on a replacement storage device 1602 in a rebuild operation. A rebuild operation is substantially similar to the rebuild operation described in relation to the data rebuild module 2114. The parity rebuild module 2116 operates similar to the data rebuild module 2114 except the parity rebuild module 2116 rebuilds a recovered parity data segment. The recovered parity data segment matches an unavailable parity data segment stored on an unavailable parity-mirror storage device 1602 assigned to the stripe.

The parity data segment is recovered, in various embodiments, by copying the parity data segment stored on a parity-mirror storage device 1602 in a mirrored storage device set, copying the parity data segment from a parity-mirror storage device 1602 in the storage device set 1604 (if identical to the unavailable parity data segment), generating the parity data segment using one or more of the N data segments and parity data segments stored on the available storage devices 150, 1602 of the storage device set 1604 and a mirror storage device containing a copy of a data segment, etc. The data rebuild module 2116 may operates and stores a recovered data segment while residing on a client 114, a third party RAID management device, a storage device 150, a mirror storage device, etc.

Advantageously, the apparatus 2100 is not limited to storing data in the storage devices 150, 1602 to partitions dedicated to the front-end, distributed RAID operation described herein. Instead, an autonomous storage device (e.g. 150a) may independently receive storage requests from a client 114 to store RAIDed or un-RAIDed data in one or more regions of the storage device 150a that is also available for storing data by the striping association module 2104, the parity-mirror association module 2106, and the front-end parity generation module 2110.

In one embodiment, one or more storage requests received by the storage request receiver module 2102 or transmitted by the storage request transmitter module 2108, identify the storage devices 150 that comprise the storage device set 1604 of the stripe. Advantageously, identifying the storage device 150 of the storage device set 1604 in the storage requests facilitates a backup RAID controller to operate if a master controller is non-functional. For example, if the storage devices 150 of the storage device set 1604 are identified in storage requests and the master controller is in a parity-mirror storage device 1602 and is unavailable, another parity-mirror storage device 1602 or another of the N storage devices 150a-n may become the master controller.

In one embodiment, the apparatus 2100 includes a parity alternation module 2118 that alternates, for each stripe, which storage devices 150 in the storage device set 1604 are designated as the parity-mirror storage devices 1602 for the stripe. The benefits of the parity alternation module 2118 are described above. In another embodiment, the storage devices 150 of the storage device set 1604 form a group of peers and the apparatus 2100 includes a peer-to-peer communication module 2120 that transmits and receives storage requests within the storage devices 150, 1602 of the storage device set 1604. The peer-to-peer communication module 2120 may also transmit and receive storage requests with peer devices outside the storage device set 1604.

In a preferred embodiment, the storage request is an object request to store an object by striping data of the object across the storage devices 150, 1602 of the storage device set 1604 using the modules 2102-2120 of the apparatus 2100. In another embodiment, one or more of the autonomous storage devices 150, 1602 of the storage device set 1604 are allocated within a first RAID group for at least a portion of a first object or file and allocated within a second RAID group for at least a portion of a second object or file. For example, one storage device 150a may be a master RAID controller for the storage device set 1604 for one or more stripes and a second storage device 150b may be a master RAID controller for a RAID group that includes some or all of the storage devices 150 of the storage device set. Advantageously, the apparatus 2100 allows flexibility in grouping storage devices 150, 1602 to form RAID groups for various clients 114.

FIG. 12 is a schematic flow chart diagram illustrating an embodiment of a method 2200 for front-end distributed RAID in accordance with the present invention. The method 2200 begins 2202 and the storage request receiver module 2102 receives 2204 a storage request to store data in N storage devices 150a-n of the storage device set 1604. The striping association module 2104 calculates 2206 a stripe pattern for the data and associates 2208 the N data segments each with one of the N storage devices 150a-n.

The parity-mirror association module 2106 associates 2210 a set of N data segments with one or more parity-mirror storage devices 1602. The storage request transmitter module 2108 transmits 2212 one or more storage requests to each storage device 150, 1602 in the storage device set 1604. Each storage request is sufficient to store onto the storage device 150 the one or more data segments associated with the storage device 150 receiving the storage request. The data segments of the data are then transferred to the storage devices 150, 1602 of the storage device set 1604 using DMA, RDMA, broadcast, multicast, etc. as directed by the storage requests. Optionally, the front-end parity generation module 2110 calculates 2214 a parity data segment for the stripe and the method 2200 ends 2216.

Shared, Front-End, Distributed RAID

Traditional RAID utilizes an array of disks or other storage devices with at least a portion of each device dedicated to the RAID and forming a RAID group. A RAID controller manages storage requests to the RAID group. For redundant systems, the RAID controller has a backup RAID controller ready to take over if the master RAID controller fails or is unavailable. Storage requests from multiple clients that seek to access the same data stored in the RAID are typically sequentially executed in order of arrival.

A front-end, distributed RAID system, as described above in relation to the system 1600, apparatus 2100, and method 2200 depicted in FIGS. 10, 11, and 12 respectively, includes autonomous storage devices 150 that may each include a storage controller 152 that can function as a distributed RAID controller and the storage devices 150 can each be configured in multiple, overlapping RAID groups serving multiple clients 114. Occasionally, two clients 114 may seek to access the same data. If one storage request arrives first and executes, then typically there is no inconsistency of the data. If, on the other hand, two or more storage requests for the same data arrive at the same time or nearly the same time, the data may be corrupted.

For example, if data is stored on four storage devices 150 in a RAID group, where one of the storage devices 150 is assigned as a parity-mirror storage device 1602, and a first client 114 sends a storage request to a first storage controller 150a acting as a RAID controller and a second client 114 sends a second storage request to a second storage device 150a acting as a second RAID controller and both storage requests access the same data, the first storage device 150a may commence execution of the storage request on the first storage device 150a then the other storage devices 150b-n of the RAID group. Concurrently, the second RAID controller on the second storage device 150b may commence execution of the second storage request on another storage device (e.g. 150b) and then on the remaining storage devices 150a,c-n of the RAID group. This mismatch in execution may be caused by physical distance between the storage devices 150, execution time discrepancies, etc. The result may be corrupted data.

What is needed is a system, apparatus, and method for shared, front-end, distributed RAID that handles concurrent storage requests seeking access of the same data. Beneficially, the system, apparatus, and method would control access to the data so one storage request is executed before a second storage request is executed.

FIG. 10 is a schematic block diagram illustrating one embodiment that serves as a system 1600 for shared, front-end distributed RAID in accordance with the present inventions, in addition to progressive RAID and front-end distributed RAID. The descriptions above for the components depicted in FIG. 10 related to progressive RAID and front-end distributed RAID are also applicable to shared, front-end distributed RAID. As with front-end distributed RAID, the storage device set 1604 forms a RAID group and includes storage devices 150 that are autonomous and are capable of independently receiving and servicing storage requests from a client 114 over a network 116.

With respect to shared, front-end distributed RAID, the system 1600 includes two or more clients 114 such that the two or more clients 114 each send a storage request relating to the same data. The storage requests are concurrent in that the storage requests arrive such that one storage request is not completed prior to arrival of another of another storage request. Among the storage devices 150 within the storage device set 1604, one or more are designated as parity-mirror storage devices 1602 for a stripe. Typically, the one or more parity-mirror storage devices 1602 function substantially similar to the other storage devices 150.

In typical configurations where the designated parity-mirror storage devices 1602 alternate among the storage devices 150 of the storage device set 1604, the parity-mirror storage devices 1602 have essentially the same characteristics as the other storage devices 150 because they must also operate as non-parity-mirror storage devices. The similar characteristics are with respect to operation within a RAID group and autonomous operation for independent client 114 communication as described above. In various embodiments, the storage devices 150 of the storage device set 1604 may differ in other aspects not related to functioning within the described RAID environment.

The storage devices 150 of the storage device set 1604 may be stand alone, grouped within one or more servers 112, may each reside in a server 112, may be accessed through one or more servers 112, etc. One or more clients 114 may reside in servers 112 that include one or more storage devices 150, may reside in separate servers 112, may reside in computers, workstations, laptops, etc. that access the storage devices 150 through a computer network 116, or the like.

In one embodiment, the network 116 includes a system bus and one or more of the storage devices 150, 1602 of the storage device set 1604 communicate using the system bus. For example, the system bus may be a PCI-e bus, a Serial Advanced Technology Attachment ("serial ATA") bus, parallel ATA, or the like. In another embodiment, the system bus is an external bus such as small computer system interface ("SCSI"), FireWire, Fiber Channel, USB, PCIe-AS, Infiniband, or the like. One of skill in the art will appreciate other system 1600 configurations with storage devices 150 are that autonomous and are capable of independently receiving and servicing storage requests from a client 114 over a network 116.

FIG. 13 is a schematic block diagram illustrating one embodiment of an apparatus 2300 for shared, front-end distributed RAID in accordance with the present invention. The apparatus 2300 includes, in various embodiments, a multiple storage request receiver module 2302, a striping module 2304, a parity-mirror module 2306, a sequencer module 2308, a master validation module 2310, master determination module 2312, a master error module 2314, parity generation module 2316, and a parity alternation module 2318, which are described below.

The apparatus 2300 includes a multiple storage request receiver module 2302 that receives at least two storage requests from at least two clients 114 to store data in the storage devices 150 of the storage device set 1602. The data includes data of a file or of an object. The storage requests of concern to the apparatus each have at least a portion of the data in common and, in addition, are concurrent storage requests by arriving such that one storage request is not completed before to arrival of the storage requests. These concurrent storage requests run the risk of corrupting the common data in a front-end distributed RAID system 1600. In one embodiment, the concurrent storage requests may be from one client 114. In another embodiment, the concurrent storage requests are from two or more clients 114.

The multiple storage requests may update one or more data segments stored on the storage devices 150 of the storage device set 1602 where the previously stored data is striped by the striping module 2304 into data segments stored on the storage devices 150 of the storage device set 1604. In one embodiment, a storage request writes the data for the first time to the RAID group. In this case, the data typically would have existed elsewhere and accessed by one or more clients 114 and then one storage request copies the data to the RAID group while another storage request concurrently accesses the data.

The multiple storage requests may comprise one request to update one or more data segments stored on the storage devices 150 of the storage device set 1602 and one or more read requests targeting at least a portion of the data in common. If the update request is not complete, then the read requests response from the storage devices 150 of the storage device set 1602 may be comprised of a combination of pre-existing and updated data that corrupts the data.

The apparatus 2300 includes a striping module 2304 that calculates, for each of the concurrent storage requests, a stripe pattern for the data and writes N data segments of a stripe to N storage devices 150a-n within the storage device set 1604. The stripe pattern includes one or more stripes and each stripe includes a set of N data segments. Each of the N data segments is written to a separate storage device 150 within the storage device set 1604 and assigned to the stripe. The apparatus 2300 includes a parity-mirror module 2306 that writes, for each of the concurrent storage requests, a set of N data segments of the stripe to the storage devices 150 within the storage device set 1604 designated as parity-mirror storage devices 1602. The parity-mirror storage devices 1602 are in addition to the N storage devices 150a-n.

The striping module 2304 is also used to calculate the identity of one or more storage devices 150a-n from which to read one or more data segments that are part of a file or object.

The apparatus 2300 includes a sequencer module 2308 that ensures completion of a first storage request from a first client 114 before executing a second storage request from a second client 114 where the at least two concurrent storage requests include the first and second storage requests. In other embodiments, the sequencer module 2308 ensures completion of the first storage request before executing two or more other concurrent storage requests. Beneficially, the sequencer module 2308 facilitates an orderly execution of concurrent storage requests to prevent corruption of data. In one embodiment, the sequencer module 2308 coordinates execution of the concurrent storage requests by using a master controller that all storage requests must access for the data, by using a locking system, a two-phase commit, or other means known to those in the art. Some of the methods used by the sequencer module 2308 are discussed below.

In one embodiment, the sequencer module 2308 ensures completion of the first storage request prior to execution of concurrent storage requests by receiving an acknowledgement from each of the storage devices 150 of the storage device set 1602 that received a storage request in conjunction with the first storage request prior to execution of the second storage request. Typically, an acknowledgment acknowledges completion of a storage request. In one embodiment, each of the storage devices 150 affected by the storage request is written to and an acknowledgement received from each of the storage devices 150 prior to the sequencer module 2308 commencing execution of a second storage request.

Completion of a storage request, in one embodiment, may include completion of a portion of a first storage request directed to a single storage device (e.g. 150a) before execution of a portion of a pending second storage request on the same storage device 150a. The sequencer module 2308 may independently verify completion of the portions of the storage request on the storage devices 150. In this embodiment, writing data segments related to a first storage request need not be held up until all data segments of the first storage request are completed. The sequencer module 2308 may coordinate the various executions taking place on the storage devices 150 of the storage device set 1604 to ensure that the data is not corrupted.

In one embodiment, the acknowledgment of completion of a storage request is received after the striping module 2304 and the parity-mirror module 2306 each write the data segments related to the storage request to the storage devices 150 of the storage device set 1604. In another embodiment, the acknowledgment of completion of a storage request is received after the striping module 2304 and the parity-mirror module 2306 each write the data segments related to the storage request to the storage devices 150 of the storage device set 1604 and each of the storage devices 150, 1602 confirms that the data segments have been written.

In one embodiment, the sequencer module 2308 selects a first storage request for execution by selecting a storage request from among the concurrent requests that arrived first. In another embodiment, the sequencer module 2308 selects a first storage request for execution by selecting a storage request with an earliest timestamp. In another embodiment, the sequencer module 2308 selects a first storage request for execution by selecting a storage request using some selection criteria. For example, the sequencer module 2308 may select a storage request that is marked in some way by a requesting client 114 as high priority, may select a storage request from a favored client 114, etc. One of skill in the art will recognize other ways that the sequencer module 2308 may select a first storage request using some selection criteria.

In one embodiment, the storage request receiver module 2302, the striping module 2304, the parity-mirror module 2306, and the sequencer module 2308 are part of a master controller (not shown) that controls and services the concurrent storage requests. All or part of the master controller may reside and operate in a client 114, a third-party RAID management device, a storage device 150 of the storage device set 1604, or a storage controller 152 in a storage device 150. By using a master controller to execute service requests for the data, the sequencer module 2302 may be aware of storage requests directed to the data and may then recognize concurrent storage requests and may then sequence the concurrent storage requests in a manner that the data stored in the storage devices 150 of the storage device set is not corrupted. One of skill in the art will recognize other implementations of a master controller that controls servicing of a storage request directed at the data.

In another embodiment, the master controller is part of a group of two or more master controllers able to service the concurrent storage requests from one or more clients 114 where the storage requests are directed at the data stored on the storage devices 150 of the storage device set 1604. For example, a master controller may service storage requests for a first client 114 and a second master controller may services storage requests for a second client 114. The first and second clients 114 may both have access to data stored on the storage devices 150 of the storage device set 1604, thus enabling concurrent storage requests. One master controller may be part of one storage device 150a while the other master controller may be part of a second storage device 150b. In another embodiment, the first master controller may be part of a first storage device set 1604a and the second master controller may be part of a mirrored storage device set 1604b.

Where the master controller is part of a group of master controllers accessing the storage devices 150 of the storage device set 1604, the apparatus 2300 may include a master validation module 2310 that confirms that a master controller servicing a received storage request is controlling execution of the storage request ahead of execution of one or more concurrent storage requests prior to execution of the received storage request. In this embodiment, the concurrent storage requests are received by other master controllers and the service request has at least a portion of the data in common with the concurrent storage requests received by the other master controllers.

For example, a master controller may receive a storage request and the master validation module 2310 may then poll the other master controllers before execution of the storage request to verify that the master controller is still the master controller for the data of the storage request. Part of the validation may include verification that the master controllers can communicate with each other so that a designated master controller is verified prior to execution of the storage request. This may be useful in situations were one front-end RAID controller is designated as master and another is backup. In another example, a master controller may receive a storage request to read a data segment from a file or object and the master validation module 2310 may then poll the other master controllers to verify that no updates are in progress for the file or object. In another example, a master controller may use the master validation module to acquire control of the data for the storage request.

One way to verify that a master controller is still master for execution of a storage request is to use a three-way polling scheme where two devices/controllers must be available to vote that a controller is master for a storage request to proceed. The scheme uses a device (not shown) that is a third-party to the controllers vying to be master and maintains a record of which controller is assigned to be master. This master verification device may be another controller, may be a client 114 on a server, etc. and is able to communicate with controllers in the group that may act as master controller. A portion of the master validation module 2310 may then reside on the master verification device with a portion of the master validation module 2310 residing in each controller.

In one example, the system 1600 includes a first front-end distributed RAID controller ("first controller"), a second front-end distributed RAID controller ("second controller"), each of which may be master, and a separate master verification device. The first and second controllers and master verification device are all in communication with each other. The master verification module 2310 may designate the first controller as master controller and the second controller as backup for data stored on the storage devices 150 of the storage device set 1604 and the master verification module 2310 may store this master information on the controllers and master verification device. As long as communication is maintained between the first controller, the second controller, and the master verification device, the master verification module 2310 can confirm that the first controller is master.

If the first, master controller receives a storage request and the second, backup controller becomes unavailable or communication is lost with the first controller and master verification device, the master validation module 2310 can verify through communication between the master verification device and the first, master controller that the first controller is still master, and since both the first controller and the master verification device confirm that the first controller is indeed master controller, the master validation module 2310 may allow the storage request to proceed. Storage requests received by the second backup controller would not proceed because, through the master verification module 2310, the second controller recognizes it is not the master.

If on the other hand, the first, master controller is unavailable or cannot communicate with the second, backup controller and the master verification device and the second, backup controller receives a storage request, the master validation module 2310 can recognize that both the second controller and the master verification module cannot communicate with the first controller and the master verification module 2310 can designate the second, backup controller to be master and the storage request can proceed. The change in master designation may then be recorded on the second controller.

If the first controller is operational and has simply lost communication with the second controller and the master verification device, any storage requests for the data received by the first controller will not be executed. If communication is restored, the first controller will still not execute storage requests because both the second controller and the master verification device recognize the second controller as the master. Of course this master designation may be reset. One of skill in the art will recognize a variety of static and dynamic means for assigning and reassigning the master designation to one of the master controllers.

If the master verification device is unavailable and the first storage controller receives a storage request, the portion of the master verification module 2310 operating on the first and second controllers can verify that the first controller is master and the storage request can proceed. If the second controller receives a storage request, the portion of the master verification module 2310 operating on the first and second controllers can verify that the first controller is master and the storage request will not proceed. In other embodiments, more than two controllers are part of a polling scheme. One of skill in the art will recognize other ways that the master verification module 2310 can verify that a controller is master prior to execution of a storage request.

In another embodiment, the apparatus 2300 includes a master determination module 2312. Prior to sending a storage request, the master determination module 2312 sends a master determination request to the group of master controllers. The group of master controllers then identifies which controller is designated as master for a storage request and sends back a response identifying the master controller to the master determination module 2312. The master determination module 2312 receives the identification of the master controller for the storage request and directs the requesting device to send the storage request to the designated master controller. In one embodiment, the master determination module 2312 resides and operates in a client 114. In another embodiment, the master determination module 2312 resides and executes in a third-party RAID management device. In another embodiment, the master determination module 2312 resides in a storage device 150. In another embodiment, the master determination module is distributed between two more storage devices 150.

In a further embodiment, the apparatus 2300 includes a master error module 2314 that returns an error indication. The master error module 2314 returns an error indication, in one embodiment, if a multiple storage request receiver module 2302 that is controlled by a master controller receives a storage request not controlled by the master controller.

In another embodiment, the master error module 2314 returns an error indication if the master determination module 2312 or the master validation module 2310 determines that the master controller is no longer the determined master at the time of the completion of execution of the storage request. This embodiment typically occurs when a master controller begins executing a storage request and loses communication with other master controllers of the group, or, in a polling scheme, loses communication with the other master controllers and the master verification device. In another embodiment, the master error module 2312 returns an error indication if a multiple storage request receiver module 2302 controlled by a master controller receives a storage request that is not controlled by the master controller.

In another embodiment, the master controller controls storage requests to one or more secondary master controllers. The secondary master controllers each control storage requests for data stored on the storage devices 150, 1602 of the storage device set 1604. In another embodiment, the master controller that controls secondary master controller is also a secondary master controller for storage requests directed to data stored on the storage devices 150, 1602, of the storage device set 1604.

In another embodiment, the master controller controls storage requests to one or more secondary master controllers and each secondary master controller controls storage requests for data stored on storage devices 150 of a storage device set unique to the secondary master controller. The apparatus 2300 is flexible so that any of the master controllers can be master to other controllers that act as secondary master controllers. Some secondary master controllers can share a storage device set 1604 and others can controls a different storage device set. In other embodiments, the master controller can be a parity-mirror storage device 1602 or one of the N storage devices 150*a-n*.

In another embodiment, a secondary master controller can become a master controller when the master controller is off line or unable to determine that it is the designated master. One of skill in the art will recognize a variety of static and dynamic means for assigning and reassigning the master designation among one or more secondary master controllers.

In a preferred embodiment, the apparatus 2300 includes a parity generation module 2316 that calculates a parity data segment for the stripe and stores the parity data segment on a parity-mirror storage device 1602. The parity stripe is calculated from the set of N data segments on the parity-mirror storage device 1602. This embodiment is typical of RAID 5, RAID 6, or some other RAID levels, but is typically not included for RAID 0, RAID 1, RAID 10, etc.

In another preferred embodiment, the apparatus 2300 includes a parity alternation module 2318 that alternates, for each stripe, which of the storage devices 150 within the storage device set 1604 are assigned to be the one or more parity-mirror storage devices 1602 for the stripe. Rotating the parity data segments per stripe improves performance. The parity alternation module 2318 may be used in conjunction with the striping module 2304 to calculate the identity of one or more storage devices 150a-n from which to read, write, or update one or more data segments that are part of a file or object.

The functions of the various modules 2302-2318 may reside together in a single master controller or may be distributed among one or more clients 114, third-party RAID management devices, and one or more storage devices 150, 1602. One of skill in the art will recognize various embodiments where the functions described herein are distributed.

FIG. 14 is a schematic flow chart diagram illustrating an embodiment of a method 2400 for shared, front-end distributed RAID in accordance with the present invention. The method 2400 begins 2402 and the multiple storage request receiver module 2302 receives 2404 at least two storage requests from at least two clients 114 to read or store data in one or more storage devices 150 of a storage device set 1604. The data is from a file or of an object and the storage requests each have at least a portion of the data in common and are concurrent by arriving such that one storage request is not completed prior to arrival of another of the at least two storage requests. The striping module 2304 calculates 2406 a stripe pattern for the data, where the stripe pattern includes one or more stripes and each stripe includes a set of N data segments. The striping module 2304 also reads or writes 2408 the N data segments of a stripe to N storage devices 150a-n within the storage device set 1604 where each of the N data segments is written to or read from a separate storage device 150.

Where the storage request is a write operation, the parity-mirror module 2306 writes 2410 a set of N data segments of the stripe to one or more parity-mirror storage devices 1602 within the storage device set 1604 where the parity-mirror storage devices 1602 are in addition to the N storage devices 150a-n. The parity-mirror module 2306 may also read 2410 data segments stored in the parity-mirror devices 1602 or a parity data segment. The sequencer module 2308 ensures 2412 completion of a first storage request from a first client 114 prior to executing a second storage request from a second client 114 and the method 2400 ends 2416. The first and second storage requests are concurrent storage requests.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Solid-State Storage as Cache for High Capacity, Non-Volatile Storage

In general, cache is advantageous because data that is accessed often or that is loaded as part of an application or operating system may be stored in cache with subsequent access much quicker than when the data must be accessed through a high-capacity, non-volatile ("HCNV") storage device, such as a hard disk drive ("HDD"), an optical drive, tape storage, etc. Cache is typically included in a computer.

Some storage devices and systems include cache in HCNV storage devices. Some HCNV storage devices contain non-volatile solid state cache; these provide benefit in reducing access times, but can only deliver performance consistent with the usually limited capability of the HCNV storage device interface. Some non-volatile solid-state cache storage devices exist that are typically placed on a motherboard; these devices cannot be used in multi-client environments as no cache coherence is provided. Some controllers of HCNV devices also include cache. Where redundant HCNV cache controllers are shared between multiple clients, sophisticated cache coherency algorithms are required to ensure that data is not corrupted.

Typically, caches are implemented in DRAM, making cache capacity a premium, and requiring relatively high power per performance. If power supporting the volatile cache is lost, data stored in the cache is lost. Typically, some battery backup is used to avoid data loss in case of power failure, with sufficient capability to flush the cache to non-volatile memory prior to failure of the batter backup. In addition, battery backup systems consume power, require redundancy, negatively impact reliability and consume space. Batteries must also be serviced on a regular basis and battery backup can be relatively expensive.

From the foregoing discussion, it should be apparent that a need exists for an apparatus, system, and method that manage data using solid-state storage as cache. Beneficially, such an apparatus, system, and method would provide a non-volatile cache that consumes little power, provides significantly larger capacity and does not require a battery backup to maintain data stored in the cache.

FIG. 15 is a schematic block diagram illustrating one embodiment of a system 3400 with solid-state storage 110 as cache for a high-capacity, non-volatile storage device in accordance with the present invention. The system 3400 includes a solid-state storage device 102 with a storage controller 152 that includes a solid-state storage controller 104 and an HCLV controller 3402, solid-state storage 110, and a network interface 156. The system 3400 includes a requesting device 155 connected to the solid-state storage device 102 through a computer network 116, and one or more HCNV storage devices 3404a-n. One of skill in the art will recognize that the system 3400 depicted in FIG. 15 is merely one embodiment and that many other configurations are possible that allow solid-state storage 110 to be cache for a storage device.

The system 3400 includes a solid-state storage device 102 with network interface 156 and a storage controller 152. In another embodiment, the network interface 156 is outside of the solid-state storage device 102. For example, the network interface 156 may be in a server 112 that may or may not include the solid-state storage device 102.

In the depicted embodiment, the solid-state storage device 102 includes a storage controller 152 that includes a solid-state storage controller 104 and a high-capacity, non-volatile ("HCNV") storage controller 3402. In another embodiment, the solid-state storage device 102 includes a solid-state storage controller 104 and an HCNV storage controller 3402 that are not in a storage controller 152. In other embodiments, the solid-state storage device 102 includes a solid-state storage controller 104 that includes an HCNV storage controller 3402, or vice-versa.

In the depicted embodiment, the system 3400 includes a solid-state storage device 102 with an integrated solid-state storage 110 and with external HCNV storage devices 3404a-n. In another embodiment, the storage controllers 152, 104, 3402 may be separate from the solid-state storage 110. In another embodiment, the controllers 152, 104, 3402 and solid-state storage 110 are included in an HCNV storage device 3404. The HCNV storage device 3404 may also include a network interface 156. One of skill in the art will recognize that many other configurations are possible. The solid-state storage device 102, the solid-state storage controller 104, the solid-state storage 110, storage I/O bus 210, network interface 156, computer network 116, and requesting device 155 are substantially similar to other embodiments of the devices and bus described above.

In one embodiment, the requesting device 155 is connected to the solid-state storage device 102, storage controller 152, solid-state storage controller 104, etc. through a system bus. Data transfers between the requesting device 155 and the solid-state storage 110 may occur over the system bus.

The HCNV storage devices 3404 are typically high-capacity storage devices that provide non-volatile storage and are typically slower for writing and reading data than solid-state storage 110. The HCNV storage devices 3404 may also be cheaper per unit storage capacity than solid-state storage 110. The HCNV storage devices 3404 may be hard disk drive ("HDD"), an optical drive, a tape storage, and the like. Providing solid-state storage 110 as cache for the HCNV storage devices 3404 typically increases speed of data access and storage. One of skill in the art will recognize other benefits of solid-state storage 110 as cache for an HCNV storage device 3404.

In one embodiment, the HCNV storage devices 3404 are connected to the storage controller 152 through a storage area network ("SAN"). In one embodiment, a separate SAN controller connects the HCNV storage devices 3404 to the storage controller 152. In another embodiment, the HCNV storage controller 3402 or the storage controller 152 acts as a SAN controller. One of skill in the art will recognize other ways that the HCNV storage devices 3404 may be connected in a SAN.

Figure 16:
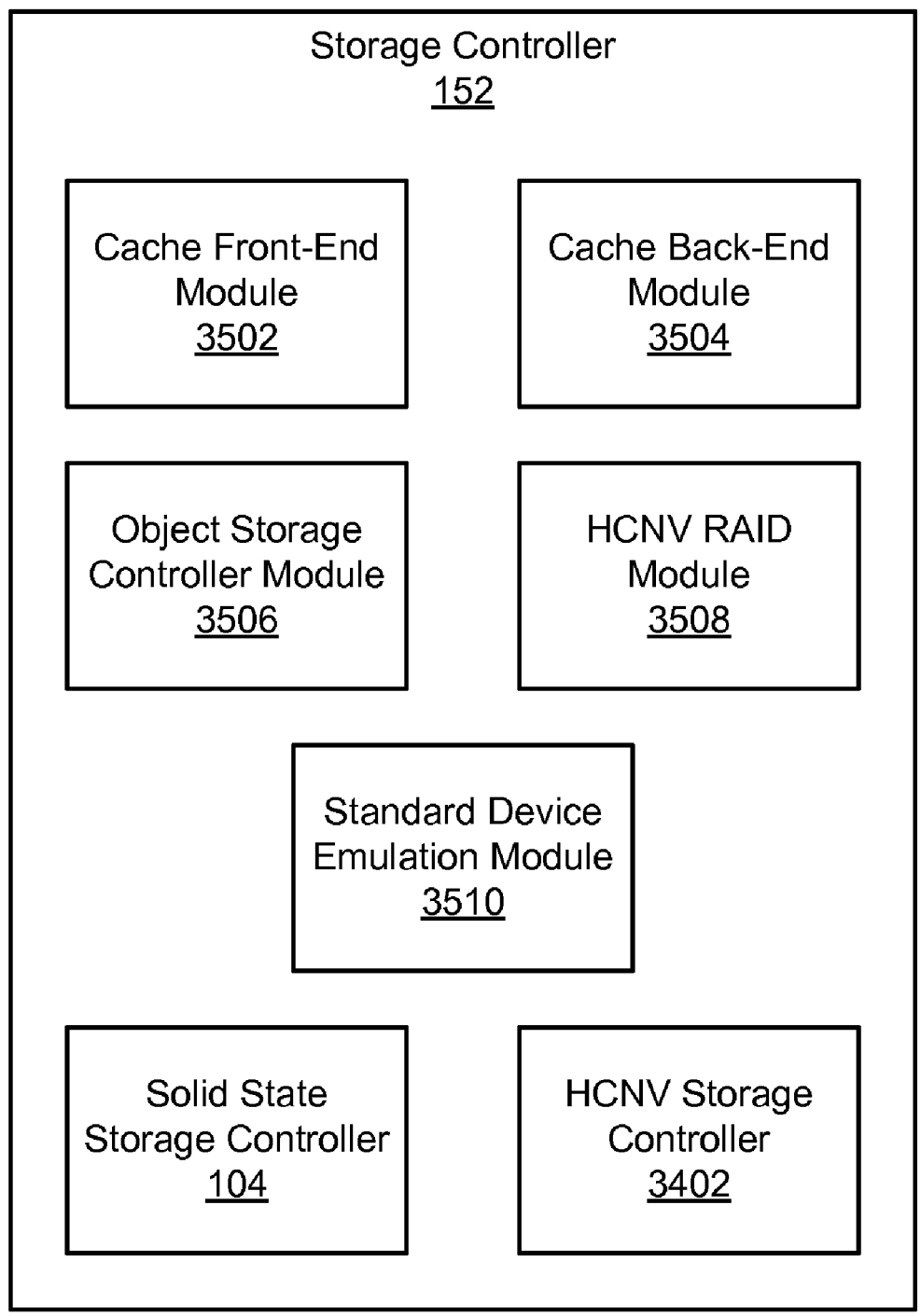
FIG. 16 is a schematic block diagram illustrating one embodiment of an apparatus with solid-state storage as cache for a high-capacity, non-volatile storage device in accordance with the present invention.

FIG. 16 is a schematic block diagram illustrating one embodiment of an apparatus 3500 with solid-state storage as cache for a high-capacity, non-volatile storage device in accordance with the present invention. The apparatus 3500 includes a cache front-end module 3502, a cache back-end module 3504, an object storage controller 3506, an HCNV module 3508, and a standard device emulation module 3510, which are described below. The modules 3502-3510 of the apparatus 3500 are depicted in a storage controller 152 with a solid-state storage controller 104 and an HCNV storage controller 3402, but some or all of each module 3502-3510 may be included in the solid-state storage controller 104, the HCNV storage controller 3402, a server 112, an HCNV storage device 3404, or other location.

The apparatus 3500 includes a cache front-end module 3502 that manages data transfers associated with a storage request, where the data transfers are between the requesting device 155 and solid-state storage 110 functioning as cache for one or more HCNV storage devices 3404a-n. The apparatus 3500 also includes a cache back-end module 3504 that manages data transfers between the solid-state storage 110 and the HCNV storage devices 3404a-n. The data transfers may include data, metadata, and/or metadata indexes. The solid-state storage 110, as described above, is an array of non-volatile, solid-state data storage elements 216, 218, 220, which are typically arranged in banks 214. In various embodiments, the solid-state storage 110 may be flash memory, nano random access memory ("nano RAM" or "NRAM"), magneto-resistive RAM ("MRAM"), dynamic RAM ("DRAM"), phase change RAM ("PRAM"), or the like.

Typically the cache front-end module 3502, the cache back-end module 3504, and the solid-state storage controller 104 operate autonomously from the requesting device 155. For example, the requesting device 155 may view the storage controller 152 with the solid-state storage controller 104 and HCNV storage controller 3402, along with the associated storage 110, 3404a-n. as a single storage device. In another example, the requesting device 155 may view the HCNV storage devices 3404a-n and the solid-state storage 110 may be transparent.

In one embodiment, the solid-state storage controller 104 includes an object storage controller module 3506 that services object requests from one or more requesting devices 155 and manages objects of the object requests within the solid-state storage 110. In the embodiment, the solid-state controller 104, along with the object storage controller module 3506, manage object requests as described above, and in particular as described in relation to the apparatus 200 depicted in FIG. 2A.

In one embodiment, the apparatus 3500 includes an HCNV RAID module 3508 that stores data cached in the solid-state storage 110 in two or more HCNV storage devices 3404a-n in redundant array of independent drives ("RAID") consistent with a RAID level. In the embodiment, the data appears to a requesting device 155 as a whole such that the RAIDing is hidden from the requesting device 155. For example, the cache front-end module 3502 may cache data from the requesting device 155 in the solid-state storage 110 and the cache back-end module 3504 may cooperate with the HCNV RAID module 3508 to stripe the data and store data segments and parity data segments in the HCNV storage devices 3404a-n consistent with a RAID level. One of skill in the art will recognize other ways that data from a requesting device 155 may be RAIDed in the HCNV storage devices 3404a-n.

In another embodiment, the solid-state storage 110 and the HCNV storage devices comprise a hybrid storage device within a hybrid storage device set that is configured as a RAID group. For example, the hybrid storage device set may be a front-end, distributed RAID storage device set 1604 and the hybrid storage device may be a storage device 150, 1602 in the storage device set as described above in relation to the system 1600, apparatus 2100, and method 2200 depicted in FIGS. 10, 11, and 12 respectively. In the embodiment, a data segment cached in the solid-state storage 110 and later stored on an HCNV device 3404 is one of N data segments of a stripe or a parity data segment of the stripe. As in front-end RAID, the hybrid storage device receives storage requests from one or more clients 114 independent of data segments of a RAID stripe.

In a further embodiment, the hybrid storage device is a storage device 150, 1602 of a shared, front-end distributed RAID group 1604 that receives two or more simultaneous storage requests from two or more clients 114, as described above in relation to shared front-end RAID as described in relation to the system 1600, apparatus 2300, and method 2400 depicted in FIGS. 10, 13, and 14, respectively. Beneficially, this embodiment ensures that the shared, redundant cache maintains coherence without additional, complex coherence algorithms and protocols.

In another embodiment, the solid-state storage 110 and the HCNV storage devices 3404a-n comprise a hybrid storage device and the apparatus 3500 includes a standard device emulation module 3510 that provides access to the hybrid storage device by emulating a standard device attached to one or more requesting devices 155 prior to loading the requesting devices 155 with code specific to the operation of the hybrid storage device. In the embodiment, the standard device is supported by an industry standard BIOS. This bootstrap operation allows the hybrid device to be recognized and accessed by the requesting devices 155 with limited functionality until drivers specific to the solid-state storage controller 104, HCNV storage controller 3404, and possibly the other modules 3502-3510 of the apparatus 3500 can be loaded on the requesting devices 155.

In one embodiment, the solid-state storage device 110 may be partitioned into two or more regions where one or more of the partitions are used as solid-state storage independent of the solid-state storage functioning as cache for the HCNV storage devices 3404. For example, some partitions of the solid-state storage 110 may be accessed by clients 114 for general data storage while one or more partitions are dedicated as cache for the HCNV storage devices 3404.

In one embodiment, more than one client 114 (or requesting device 155) is able to send cache control messages to the cache front-end module 3502 and the cache back-end module 3504 to manage a state of one or more of files or objects stored within the solid-state storage device 110 and the one or more HCNV storage devices 3404. Beneficially, the ability for clients 114/requesting devices 155 to manage cache on a per file, per object, or per data segment basis provides a great deal of flexibility for sharing a solid-state storage device 110.

Numerous cache control messages are allowable and possible. For example, a cache control message may include a control message that causes the cache back-end module 3504 to pin a portion of an object or file in the solid-state storage 110. Another cache control message may include a control message that causes the cache back-end module 3504 to unpin a portion of an object or file in the solid-state storage 110. Another cache control message may include a control message that causes the cache back-end module 3404 to flush a portion of an object or file from the solid-state storage 110 to the one or more HCVN storage devices 3404. Another cache control message may include a control message that causes the cache back-end module 3404 to preload a portion of an object or file to the solid-state storage 110 from the one or more HCVN storage devices 3404. Another cache control message may include a control message that causes the cache back-end module 3504 to offload one or more portions of one or more objects or files from the solid-state storage to the HCVN storage devices 3404 in order to free up a determined amount of storage space in the solid-state storage 110. One of skill in the art will recognize other possible cache control messages.

In one embodiment, the cache control messages are communicated through metadata ("cache control metadata") for the object or file. The cache control metadata, in one embodiment, is persistent. In another embodiment, the cache control metadata is established through attributes set at a time of creation of the file or object. In the embodiment, the attributes may be inherited through relationship to a particular object class, defaults characteristic of specific file types, etc. In another embodiment, the cache control metadata is obtained from a file or object management system. One of skill in the art will recognize other ways that cache control messages may be communicated through metadata.

In one embodiment, the system 3400 includes a volatile cache storage element. For example, in addition to the solid-state storage 110, the system 3400 may also include random access memory ("RAM") of some type that is volatile. In this embodiment, the cache front-end module 3502 and the cache back-end module 3504 store some data in the volatile cache storage element and manage data stored in the solid-state storage 110 and volatile cache storage element and the back-end storage module 3504 also manages data transfers between the volatile cache storage element, the solid state storage, and the HCVN storage devices. For example, data that is not critical or may easily be recovered from another source may be stored in the volatile cache while other data may be stored in the solid-state storage 110 functioning as cache.

In a further embodiment, metadata and/or index metadata for objects and files stored in the HCVN storage devices 3404 is maintained within the solid-state storage device 110 and in the volatile cache storage element. As described above in relation to the apparatus 200 depicted in FIG. 2A, certain metadata may be stored in volatile cache storage element and may be used to rebuild an index if the data in the volatile cache storage element is lost. In one embodiment, metadata and index metadata is stored in the solid-state storage 110 where no volatile cache storage element is included. One of skill in the art will recognize other benefits and ways to use volatile cache storage elements along with solid-state storage 110 functioning as cache.

FIG. 17 is a schematic flow chart diagram illustrating one embodiment of a method 3600 with solid-state storage as cache for a high-capacity, non-volatile storage device in accordance with the present invention. The method 3600 begins 3602 and the cache front-end module 3502 manages 3604 data transfers associated with a storage request, where the data transfers are between a requesting device 155 and solid-state storage 110 functioning as cache for one or more HCNV storage devices 3404a-n. The cache back-end module 3504 manages 3606 data transfers between the solid-state storage 110 and the one or more HCNV storage devices 110 and the method 3600 ends 3608. The method 3600 operates substantially similar as described above in relation to the apparatus 3500 of FIG. 10.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for managing the storage of data on one or more high capacity, non-volatile ("HCNV") storage devices, the apparatus comprising:
    a cache front-end module that manages data transfers associated with a storage request, the data transfers between a requesting device and a solid-state storage device functioning as a cache for one or more HCNV storage devices, the solid-state storage device comprising an array of non-volatile, solid-state storage elements;
    a cache back-end module that manages data transfers between the solid-state storage device and the one or more HCNV storage devices; and
    a sequential storage module that temporally orders data sent to the cache within a storage division of the solid-state storage device, the sequential storage module ordering the data sequentially by order of processing, the sequential storage module further managing a temporal order of storage divisions by way of a sequential order for storage divisions.

2. The apparatus of claim 1, further comprising an error correcting code (ECC) generator configured to: generate an ECC block comprising at least a portion of data associated with the data transfer and an ECC capable of correcting an error in the ECC block; and storing a first portion of the ECC block on a first solid-state storage element and a second portion of the ECC block on a second solid-state storage element.

3. The apparatus of claim 2, wherein storing the first portion of the ECC block and storing the second portion of the ECC block comprises storing the first portion of the ECC block on a page of the first solid-state storage element and the second portion of the ECC block on a page of the second solid-state storage element.

4. The apparatus of claim 3, wherein a length of the ECC is predetermined to correct a particular number of bit errors in the ECC block and the length of the error-correcting code is predetermined independent of a block size of data received from the requesting device.

5. The apparatus of claim 3, wherein a length of the ECC is predetermined to correct a particular number of bit errors in the ECC block and the length of the error-correcting code is predetermined independent of a physical page size of the solid state storage elements.

6. The apparatus of claim 2, further comprising a packetizer configured to packetize data into one or more packets, wherein the ECC block comprises at least a portion of at least one of the packets, the ECC block having no fixed relationship between a size of the packets and a size of the ECC block.

7. The apparatus of claim 6, wherein the apparatus is configured to:
select a storage division of the solid-state storage device for recovery by identifying that the storage division contains a high amount of invalid data; and queue valid data packets within the storage division with other data packets to be written sequentially to the solid-state storage device.

8. The apparatus of claim 1, comprising an object storage controller module that services object requests from one or more requesting devices and manages objects of the object requests within the solid-state storage device.

9. The apparatus of claim 1, further comprising an HCNV RAID module that stores data cached in the solid-state storage device in two or more HCNV storage devices in redundant array of independent drives ("RAID") consistent with a RAID level.

10. The apparatus of claim 1, wherein the solid-state storage device and the one or more HCNV storage device comprise a hybrid storage device within a hybrid storage devices set that is configured as a RAID group, wherein a data segment cached in the solid-state storage device and later stored on an HCNV device comprises one of N data segments of a stripe or a parity data segment of the stripe, wherein the hybrid storage device receives storage requests from one or more clients independent of data segments of a RAID stripe.

11. The apparatus of claim 1, wherein a write data pipeline accesses solid-state storage elements in the array of non-volatile solid-state storage elements in parallel via a bus.

12. The apparatus of claim 1, wherein the solid-state storage device and the one or more HCNV storage devices comprise a hybrid storage device and further comprising a standard device emulation module that provides access to the hybrid storage device by emulating a standard device attached to one or more requesting devices prior to loading the one or more requesting devices with code specific to the operation of the hybrid storage device, the standard device being supported by an industry standard BIOS.

13. The apparatus of claim 1, wherein the solid-state storage device may be partitioned into two or more partitions, wherein one or more partitions may be used as solid-state storage independent of the solid-state storage device functioning as cache for the HCNV storage devices.

14. The apparatus of claim 1, wherein one or more clients send cache control message to the cache front end module and the cache back end module, the cache control messages comprising one or more of:
a control message that causes the cache back-end module to pin a portion of an object or file in the solid-state storage device;
a control message that causes the cache back-end module to unpin a portion of an object or file in the solid-state storage device;
a control message that causes the cache back-end module to flush a portion of an object or file from the solid-state storage device to the one or more HCNV storage devices;
a control message that causes the cache back-end module to preload a portion of an object or file to the solid-state storage device from the one or more HCNV storage devices; and
a control message that causes the cache back-end module to offload one or more portions of one or more objects or files from the solid-state storage device to the one or more HCNV storage devices in order to free up a determined amount of storage space in the solid-state storage device.

15. The apparatus of claim 7, wherein the cache control messages are communicated through metadata ("cache control metadata") for the data transfer.

16. The apparatus of claim 15, wherein the cache control metadata is persistent.

17. The apparatus of claim 1, further comprising a volatile cache storage element and wherein the cache front-end module and the cache back-end module further comprise storing data in the volatile cache storage element and manage data stored in the solid-state storage device and volatile cache storage element and wherein the back-end storage module further manages data transfers between the volatile cache storage element, the solid state storage, and the HCVN storage devices.

18. The apparatus of claim 1, wherein one or more of metadata and index metadata for objects and files stored in the HCNV storage devices is maintained within the solid-state storage device.

19. A system for managing the storage of data on one or more high capacity, non-volatile ("HCNV") storage devices, the system comprising:
a solid-state storage device comprising an array of non-volatile, solid-state storage elements;
one or more HCNV storage devices; and
a storage controller comprising
a solid-state storage controller;
an HCNV storage device controller;
a cache front-end module that manages data transfers associated with a storage request, the data transfers between a requesting device and the solid-state storage device functioning as cache for the one or more HCNV storage devices;
a cache back-end module that manages data transfers between the solid-state storage device and the one or more HCNV storage devices; and
a sequential storage module that temporally orders data sent to the cache within a storage division of the solid-state storage device, the sequential storage module ordering the data sequentially by order of processing, the sequential storage module further managing a temporal order of storage divisions by way of a sequential order for storage divisions.

20. The system of claim 19, further comprising a network interface connected to the storage controller, the network interface facilitating data transfers between the requesting device and the solid-state storage controller through a computer network.

21. The system of claim 19, further comprising a server, wherein the server includes the solid-state storage device, the one or more HCNV storage devices, and the storage controller.

22. The system of claim 19, wherein the one or more HCNV storage devices are connected to the storage controller through a storage area network ("SAN").

23. A computer program product comprising a computer readable medium having computer usable program code executable to perform operations for managing the storage of data on one or more high capacity, non-volatile ("HCNV") storage devices, the operations of the computer program product comprising:
  managing data transfers associated with a storage request, the data transfers between a requesting device and solid-state storage device functioning as cache for one or more HCNV storage devices, the solid-state storage device comprising an array of non-volatile, solid-state storage elements;
  managing data transfers between the solid-state storage device and the one or more HCNV storage devices; and
  temporally ordering data sent to the cache within a storage division of the solid-state storage device, wherein temporal ordering is sequential by order of processing;
  managing a temporal order of storage divisions by way of a sequential order for storage divisions.

24. A method for managing the storage of data on one or more high capacity, non-volatile ("HCNV") storage devices, the method comprising:
  managing data transfers associated with a storage request, the data transfers between a requesting device and a solid-state storage device functioning as cache for one or more HCNV storage devices, the solid-state storage device comprising an array of non-volatile, solid-state storage elements;
  managing data transfers between the solid-state storage device and the one or more HCNV storage devices; and
  temporally ordering data sent to the cache within a storage division of the solid-state storage device, wherein temporal ordering is sequential sequentially by order of processing;
  managing a temporal order of storage divisions by way of a sequential order for storage divisions.

25. The method of claim 24, further comprising: generating an ECC block comprising at least a portion of data associated with the data transfer and an ECC capable of correcting an error in the ECC block; and storing a first portion of the ECC block on a first solid-state storage element and a second portion of the ECC block on a second solid-state storage element.

26. The method of claim 25, wherein storing the first portion of the ECC block and storing the second portion of the ECC block comprises storing the first portion of the ECC block on a page of the first solid-state storage element and the second portion of the ECC block on a page of the second solid-state storage element.

27. The method of claim 26, wherein a length of the ECC is predetermined to correct a particular number of bit errors in the ECC block and the length of the error-correcting code is predetermined independent of a block size of data received from the requesting device.

28. The method of claim 26, wherein a length of the ECC is predetermined to correct a particular number of bit errors in the ECC block and the length of the error-correcting code is predetermined independent of a physical page size of the solid state storage elements.

29. The method of claim 25, further comprising packetizing data into one or more packets, wherein the ECC block comprises at least a portion of at least one of the packets, the ECC block having no fixed relationship between a size of the packets and a size of the ECC block.

30. The method of claim 29, further comprising: selecting a storage division of the solid-state storage device for recovery by identifying that the storage division contains a high amount of invalid data; and queuing valid data packets within the storage division with other data packets to be written sequentially to the solid-state storage device.

* * * * *